United States Patent [19]
Hurlbut et al.

[11] Patent Number: 5,828,676
[45] Date of Patent: Oct. 27, 1998

[54] METHOD AND APPARATUS FOR ROBUST COMMUNICATION BASED UPON ANGULAR MODULATION

[75] Inventors: Amy O. Hurlbut, San Francisco; Philip H. Sutterlin, San Jose; Walter J. Downey, Los Gatos, all of Calif.

[73] Assignee: Echelon Corporation, Palo Alto, Calif.

[21] Appl. No.: 661,136

[22] Filed: Jun. 10, 1996

Related U.S. Application Data

[63] Continuation of Ser. No. 224,820, Apr. 8, 1994, abandoned.

[51] Int. Cl.$^6$ .......................... H03M 13/00; H04L 7/00; H04L 7/04; H04L 27/22
[52] U.S. Cl. ................... 371/37.01; 371/37.02; 371/37.06; 371/42; 375/329; 375/330; 375/365; 375/371
[58] Field of Search ................ 371/37.1, 37.01, 371/37.02, 42; 375/329, 330, 365, 371

[56] References Cited

U.S. PATENT DOCUMENTS

| | | | |
|---|---|---|---|
| 4,283,682 | 8/1981 | Sifford et al. | 329/50 |
| 4,311,964 | 1/1982 | Boykin | 329/104 |
| 4,555,667 | 11/1985 | Cressey et al. | 329/50 |
| 4,575,864 | 3/1986 | Rice, Jr. et al. | 375/116 |
| 4,606,051 | 8/1986 | Crabtree et al. | 375/86 |
| 4,771,438 | 9/1988 | Nash | 375/15 |
| 4,797,183 | 1/1989 | Cowart | 375/1 |
| 5,010,554 | 4/1991 | Bechtel et al. | 371/37.1 |
| 5,097,220 | 3/1992 | Shimakata et al. | 329/306 |
| 5,117,427 | 5/1992 | Miyake et al. | 371/37.4 |
| 5,136,616 | 8/1992 | Dent | 375/94 |
| 5,146,471 | 9/1992 | Cowart | 375/1 |
| 5,157,694 | 10/1992 | Iwasaki et al. | 375/81 |
| 5,195,098 | 3/1993 | Johnson et al. | 371/37.2 |
| 5,206,864 | 4/1993 | McConnell | 371/37.4 |
| 5,245,611 | 9/1993 | Ling et al. | 370/100.1 |
| 5,289,476 | 2/1994 | Johnson et al. | 371/37.1 |
| 5,307,377 | 4/1994 | Chouly et al. | 375/39 |
| 5,315,618 | 5/1994 | Yoshida | 375/94 |
| 5,351,274 | 9/1994 | Chennakeshu et al. | 375/100 |
| 5,373,536 | 12/1994 | Dehnar, Jr. et al. | 375/106 |
| 5,416,804 | 5/1995 | Khaled et al. | 375/341 |
| 5,422,917 | 6/1995 | Scott | 375/371 |
| 5,426,652 | 6/1995 | Heiman | 371/30 |
| 5,432,822 | 7/1995 | Kaewell, Jr. | 375/340 |

OTHER PUBLICATIONS

*IEEE Transactions on Communications*, Jan. 1976, pp. 106–112. "A Class of Soft Decision Error Detectors for the Gaussian Channel".

*Primary Examiner*—Stephen M. Baker
*Attorney, Agent, or Firm*—Blakely, Sokoloff, Taylor & Zafman

[57] ABSTRACT

A robust encoding and decoding system of the present invention for communicating binary information using angular modulation system is disclosed. Binary information to be transmitted is data words consisting of 8 data bits, a parity bit, and two additional coding bits at the end of the data word. A transmitter transmits the data words using a binary phase-shift keying (BPSK) modulated signal. The receiver compares the phase of incoming BPSK modulated signal against a local reference signal and records the phase characteristics of the BPSK signal. The receiver also records the amplitude of the recovered data signal. The receiver demodulates and decodes the BPSK signal using a rotating frame of reference that tracks the current phase of the recovered data signal. The receiver tests the parity bit of each word to detect errors. If an error is detected, the receiver attempts to correct the error using the record phase and amplitude information.

89 Claims, 42 Drawing Sheets

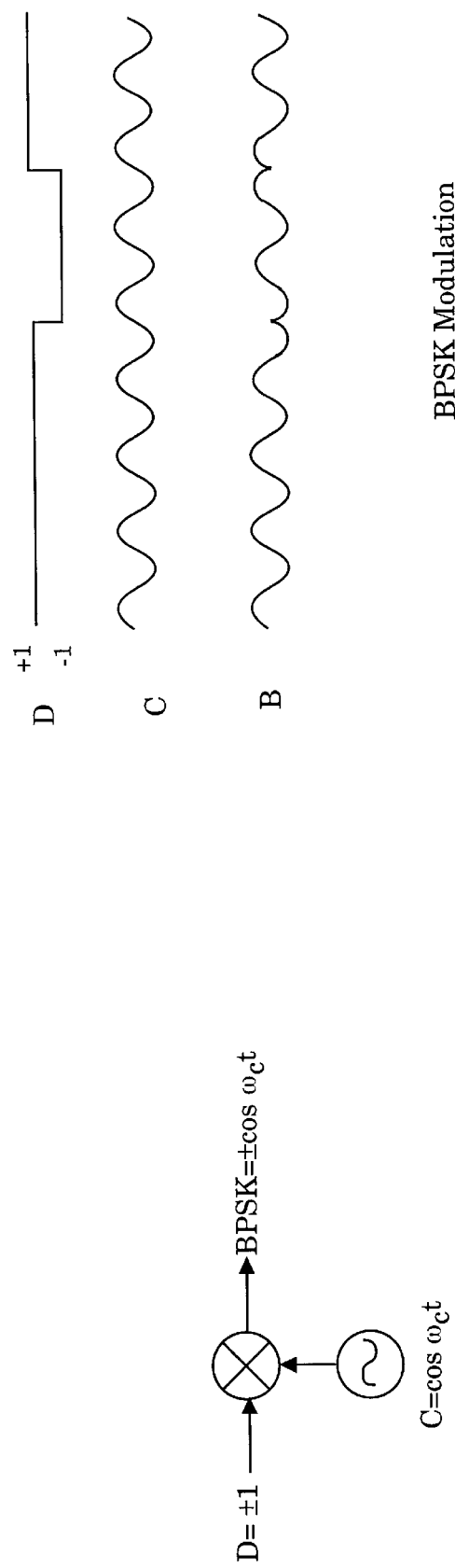

If I and Q have the same sign, then SAMESIGN=1

If |I| > |Q|, then IGTQ = 1

| Data Bit | *1 | *2 | *3 | *4 | *5 |
|---|---|---|---|---|---|
| Data Bit Sector | Aligned | INC | INC | INC | Aligned |
| Tracking Mechanism State | Aligned | Ready to Inc | Fast Inc | Fast Inc | Aligned |
| IQ Pointer (n) Sector | 13 | 13 | 14 | 15 | 15 |

| Data Bit | *1 | *2 | *3 | *4 | *5 | *6 |
|---|---|---|---|---|---|---|
| IQ Pointer Sector | 13 | 13 | 11 (Jump) | 10 (Track) | 9 (Track) | 9 |

For data bit *1, I = +30 and Q = +20, so IQMAG = |(I + Q)| = 50
For data bit *2, I = −70 and Q = +80, so IQMAG = |(I + Q)| = 10

| | | | Phase Hit | | | →|
|---|---|---|---|---|---|---|
| Data Bit * | *1 | *2 | *3 | *4 | *5 | *6 |
| Actual Data | 1 | 1 | 0 | 1 | 1 | 1 |
| Decoded Data | 1 | 1 | 0 | 1 | 1 | 1 |
| IQ Pointer Adjustment | None | None | None | Jump | Jump | Track |

| Data Bit * | *1 | *2 | *3 | *4 | *5 | *6 |
|---|---|---|---|---|---|---|
| Actual Data | 1 | 1 | 0 | 1 | 1 | 1 |
| Decoded Data | 1 | 1 | 0 | 1 | 1 | 1 |
| IQ Pointer Adjustment | None | None | None | Jump | Track | Track |

| Data Bit * | *1 | *2 | *3 | *4 | *5 | *6 |
|---|---|---|---|---|---|---|
| Actual Data | 1 | 1 | 0 | 1 | 1 | 1 |
| Decoded Data (prior to error correction) | 1 | 1 | 1 | 0 | 0 | 0 |
| IQ Pointer Adjustment | None | None | None | Jump | Track | Track |

| Data Bit * | *1 | *2 | *3 | *4 | *5 | *6 |
|---|---|---|---|---|---|---|
| Actual Data | 1 | 1 | 0 | 1 | 1 | 1 |
| Decoded Data (prior to error correction) | 1 | 1 | 1 | 0 | 0 | 0 |
| IQ Pointer Adjustment | None | None | None | Jump | Track | Track |

| Data Bit | *1 | *2 | *3 | *4 | *5 | *6 |
|---|---|---|---|---|---|---|
| Actual Data | 1 | 1 | 0 | 1 | 1 | 1 |
| Decoded Data (prior to error correction) | 1 | 1 | 0 | 0 | 0 | 0 |
| IQ Pointer Adjust | None | None | None | None | Track | Track |

| PHASE HIT That can cause a data inversion | PHASE HIT as Measured Assuming: Prior Data Bit Coincides with IQ Pointer | | ASSIGNED PHASE WEIGHT | DATA POLARITY |
|---|---|---|---|---|
| +4, +4 <br> -4, -4 | 4, 4 | 4, 4 <br> 4, 4 | 7 | + + <br> - - |
| +4, +5 <br> -4, -5 | 4, ±3 | 4, 3N <br> 4, 3P | 7 | + + <br> - - |
| +4, +6 <br> -4, -6 | 4, ±2 | 4, 2N <br> 4, 2P | 6 | (+ -) <br> - - |
| +4, +7 <br> -4, -7 | 4, ±1 | 4, 1N <br> 4, 1P | 5 | (+ -) <br> - - |
| +5, +4 | -3, 4 | | 7 | - - |
| -5, -4 | +3, 4 | | 7 | - - |
| +5, +5 | -3, -3 | | 7 | - - |
| -5, -5 | +3, +3 | | 7 | - - |
| +5, +6 | -3, -2 | | 6 | - - |
| -5, -6 | +3, +2 | | 6 | - - |
| +5, +7 | -3, -1 | | 4 | - - |
| -5, -7 | +3, +1 | | 4 | - - |
| +6, +5 | -2, -3 | | 6 | - - |
| -6, -5 | +2, +3 | | 6 | - - |
| +6, +6 | -2, -2 | | 6 | - - |
| -6, -6 | +2, +2 | | 6 | - - |
| +6, +7 | -2, -1 | | 3 | - - |
| -6, -7 | +2, +1 | | 3 | - - |
| +7, +6 | -1, -2 | | 2 | - - |
| -7, -6 | +1, +2 | | 2 | - - |
| +7, +7 | -1, -1 | | 1 | - - |
| -7, -7 | +1, +1 | | 1 | - - |
| | All others | | 0 | |

*Fig. 26*

| PHASE HIT That can cause a data inversion | AS MEASURED Assuming: Previous IQptr on INC side; prior data bit on INC side | ASSIGNED PHASE WEIGHT | DATA POLARITY |
|---|---|---|---|
| +4, +4 | +3, +3 | 7 | + + |
| -4, -4 | +3, +3 | 7 | - - |
| +4, +5 | +3, +4 | 7 | + + |
| -4, -5 | +3, +2 | 6 | - - |
| +4, +6 | +3, -3 | 0 | + + |
| -4, -6 | +3, +1 | 4 | - - |
| +4, +7 | +3, -2 | 0 | + - |
| -4, -7 | +3, 0 | 0 | - - |
| +5, +4 | +3, 4 | 7 | - - |
| -5, -4 | +2, +3 | 6 | - - |
| +5, +5 | -3, -3 | 7 | - - |
| -5, -5 | +2, +2 | 6 | - - |
| +5, +6 | -3, -2 | 6 | - - |
| -5, -6 | +2, +1 | 3 | - - |
| +5, +7 | -3, -1 | 4 | - - |
| -5, -7 | +2, 0 | 0 | - - |
| +6, +5 | -2, -3 | 6 | - - |
| -6, -5 | +1, +2 | 2 | - - |
| +6, +6 | -2, -2 | 6 | - - |
| -6, -6 | +1, +1 | 1 | - - |
| +6, +7 | -2, -1 | 3 | - - |
| -6, -7 | +1, 0 | 0 | - - |
| +7, +6 | -1, -2 | 2 | - - |
| -7, -6 | 0, +1 | 0 | - - |
| +7, +7 | -1, -1 | 1 | - - |
| -7, -7 | 0, 0 | 0 | - - |

*Fig. 28*

| Data Bit | *1 | *2 | *3 | *4 | *5 |
|---|---|---|---|---|---|
| Actual Data | 1 | 1 | 0 | 1 | 1 |
| Decoded Data (prior to error correction) | 1 | 1 | 1 | 0 | 0 |
| IQ Pointer Adjustment | None | None | Track | None | None |

| Data Word | | 1 | 1 | 1 | 0 | 0 | 1 | 0 | 0 | 1 | 1 |
|---|---|---|---|---|---|---|---|---|---|---|---|
| Differentially Encoded | 0 | 1 | 0 | 1 | 1 | 1 | 0 | 0 | 0 | 0 | 1 | 0 |

*Fig. 35a*

| Data Word | | 1 | 1 | 1 | 1 | 1 | 1 | 1 | 1 | 1 | 1 | |
|---|---|---|---|---|---|---|---|---|---|---|---|---|
| Differentially encoded for transmission | 0 | 1 | 0 | 1 | 0 | 1 | 0 | 1 | 0 | 1 | 0 | 1 | |
| Received (with error) | 0 | 1 | 0 | 1 | (1) | 1 | 0 | 1 | 0 | 1 | 0 | 1 | Single Symbol Error |
| Data Word as decoded (prior to error correction) | | 1 | 1 | 1 | 0 | 0 | 1 | 1 | 1 | 1 | 1 | 1 | Double Bit Error |

*Fig. 35b*

| Data Word | | 1 | 1 | 1 | 1 | 1 | 1 | 1 | 1 | 1 | 1 | |
|---|---|---|---|---|---|---|---|---|---|---|---|---|
| Differentially encoded for transmission | 0 | 1 | 0 | 1 | 0 | 1 | 0 | 1 | 0 | 1 | 0 | 1 | |
| Received (with inversion) | 0 | 1 | 0 | 1 | (1 | 0 | 1 | 0 | 1 | 0 | 1 | 0) | Symbol Inversion |
| Data Word as decoded (prior to error correction) | | 1 | 1 | 1 | 0 | 1 | 1 | 1 | 1 | 1 | 1 | 1 | Single Bit Error |

*Fig. 35c*

| Bit Weight | 8 data bits | | | | | | | | 3-bit data integrity code | | | (Data Sum) + (Code Sum) | Special checksum |
|---|---|---|---|---|---|---|---|---|---|---|---|---|---|
| | 1 | 3 | 1 | 3 | 1 | 3 | 1 | 3 | 1 | 3 | 1 | | |
| Example 1 | 1 | 0 | 1 | 1 | 1 | 0 | 0 | 0 | 1 | 0 | 0 | 6 + 1 | 7 |
| Example 2 | 1 | 1 | 1 | 1 | 0 | 0 | 1 | 1 | 1 | 0 | 0 | 12 + 1 | 13 |
| Example 3 | 1 | 1 | 0 | 0 | 1 | 1 | 0 | 0 | 1 | 1 | 1 | 8 + 5 | 13 |

*Fig. 36a*

| 8-Bit Data Partial Sum | 3-Bit Code Partial Sum | 3-Bit Data Integrity Code | Total Checksum |
|---|---|---|---|
| 0 | 1 | 100 | 1 |
| ①  | 0 | 000 | 1 |
| 2 | 5 | 111 | 7 |
| 3 | 4 | 110 | 7 |
| 4 | 3 | 010 | 7 |
| 5 | 2 | 101 | 7 |
| 6 | 1 | 100 | 7 |
| ⑦ | 0 | 000 | 7 |
| 8 | 5 | 111 | 13 |
| 9 | 4 | 110 | 13 |
| 10 | 3 | 010 | 13 |
| 11 | 2 | 101 | 13 |
| 12 | 1 | 100 | 13 |
| ⑬ | 0 | 000 | 13 |
| 14 | 5 | 111 | 19 |
| 15 | 4 | 110 | 19 |
| 16 | 3 | 010 | 19 |

*Fig. 36b*

| Received Checksum | Even received checksum: Single bit error (symbol inversion) | Odd received checksum: Double bit error (single symbol error) | Type of error |
|---|---|---|---|
| 0 | ← | | Single bit (symbol inversion) |
| ① | | | No error |
| 2 | ← | | Single bit (symbol inversion) |
| 3 | | ← | Double bit (single symbol) |
| 4 | ← | | Single bit (symbol inversion) |
| 5 | | ← | Double bit (single symbol) |
| 6 | ← | | Single bit (symbol inversion) |
| ⑦ | | | No error |
| 8 | ← | | Single bit (symbol inversion) |
| 9 | | ← | Double bit (single symbol) |
| 10 | ← | | Single bit (symbol inversion) |
| 11 | | ← | Double bit (single symbol) |
| 12 | ← | | Single bit (symbol inversion) |
| ⑬ | | | No error |
| 14 | ← | | Single bit (symbol inversion) |
| 15 | | ← | Double bit (single symbol) |
| 16 | ← | | Single bit (symbol inversion) |
| 17 | | ← | Double bit (single symbol) |
| 18 | ← | | Single bit (symbol inversion) |
| ⑲ | | | No error |
| 20 | ← | | Single bit (symbol inversion) |
| 21 | | ← | Double bit (single symbol) |

*Fig. 37*

| Bit Weight | Data | | | | | | | | 3-Bit Code | | | |
|---|---|---|---|---|---|---|---|---|---|---|---|---|
| | 1 | 3 | 1 | 3 | 1 | 3 | 1 | 3 | 1 | 3 | 1 | |
| Data Word | 1 | 1 | 1 | 1 | 1 | 1 | 1 | 1 | 0 | 1 | 0 | Full checksum=19 |
| Differentially encoded for transmission | 0 | 1 | 0 | 1 | 0 | 1 | 0 | 1 | 0 | 0 | 1 | 1 |
| Received (with error) | 0 | 1 | 0 | 1 | (1) | 1 | 0 | 1 | 0 | 0 | 1 | 1 | Single symbol error |
| Data Word as decoded (prior to error correction) | | 1 | 1 | 1 | 0 | 0 | 1 | 1 | 1 | 0 | 1 | 0 | Double bit error checksum=15 |

↑ weak bit

*Fig. 38a*

| Bit Weight | Data | | | | | | | | 3-Bit Code | | | |
|---|---|---|---|---|---|---|---|---|---|---|---|---|
| | 1 | 3 | 1 | 3 | 1 | 3 | 1 | 3 | 1 | 3 | 1 | |
| Data Word | 1 | 1 | 1 | 1 | 1 | 1 | 1 | 1 | 0 | 1 | 0 | Full checksum=19 |
| Differentially encoded for transmission | 0 | 1 | 0 | 1 | 0 | 1 | 0 | 1 | 0 | 0 | 1 | 1 |
| Received (with error) | 0 | 1 | 0 | 1 | 1 | 0 | 1 | 0 | 1 | 1 | 0 | 0 | Symbol inversion |
| Data Word as decoded (prior to error correction) | | 1 | 1 | 1 | 0 | 1 | 1 | 1 | 1 | 0 | 1 | 0 | Single bit error checksum=16 |

↑ phase hit

*Fig. 38b*

METHOD AND APPARATUS FOR ROBUST COMMUNICATION BASED UPON ANGULAR MODULATION

This is a continuation of application Ser. No. 08/224,820, filed Apr. 8, 1994, now abandoned.

FIELD OF THE INVENTION

The present invention relates to digital communication systems. Specifically, the present invention relates to methods and apparatus for encoding and decoding digital information using an angular modulation system such that communication can be performed reliably through an impaired channel.

BACKGROUND OF THE INVENTION

When a message is transmitted through a noisy communication channel, noise from the channel impairs message recovery and, in some instances, introduces data errors. Error correction codes and methods are well known in prior art; however error correction codes generally require substantial coding overhead in order to both detect and correct data errors. High coding overhead is undesirable in that it reduces the available message bandwidth. Thus, a method for detecting and correcting data recovery errors with low coding overhead would be very useful. To minimize implementation cost it would also be desirable if the error correction function could be implemented using the outputs from one or more of the existing recovery stages in a receiver.

Angular modulation refers to a technique of encoding information onto an analog carrier signal by adjusting the phase of the signal. Certain communication channels may cause time-varying phase shifts of the data signal. For example, if an angularly modulated signal is transmitted through a power distribution line, electrical devices coupled to the power distribution line can periodically shift the phase of the signal. Since an angularly modulated signal encodes the information to be transmitted by changing the phase of the carrier signal, a sudden phase shift introduced by the communication channel can cause all the encoded information to be lost.

For example, Binary phase-shift keying (BPSK) is a well known angular modulation technique used to encode digital information onto an analog signal. Binary phase-shift keying encodes digital data by generating a sinusoidal carrier signal having two different phases that are 180° apart. A first carrier phase represents a binary "0" and the second carrier phase that is 180° from the first carrier phase represents a binary "1". If a BPSK data signal is transmitted through a communication channel that suddenly shifts the phase of the BPSK data signal by a large amount, the data recovered by the BPSK receiver can be inverted.

Thus, it would be desirable to implement a receiver that can correctly decode an angularly modulated signal that may be phase shifted by a communication channel. The receiver must be able to track phase shifts but not overreact to noise impulses or other noise. The receiver should decode the binary information in a manner such that large phase shifts that cause the data to be inverted can be detected and corrected.

SUMMARY AND OBJECTS OF THE INVENTION

It is therefore an object of the present invention to track the phase of an angularly modulated signal in a receiver using a rotating reference frame such that small phase changes in the angularly modulated signal are accommodated.

It is another object of the present invention to encode binary data to be transmitted on an angularly modulated signal in a manner such that errors in the data caused by noise can be detected and corrected with minimal overhead.

It is a further object of the present invention to encode binary data to be transmitted on an angularly modulated signal in a manner such that inversions caused by large changes in the phase response of the communication channel can be detected and corrected.

These and other objects are accomplished by the robust encoding and decoding system of the present invention for digital communications using angular modulation. In the present embodiment, the binary data to be transmitted is organized into data packets. Each data packet comprises a preamble, a number of data words, and a pair of End-of-Packet words. A receiver locks onto the data packet during the preamble of the packet. The data words of the packet carry the data to be transmitted. Each data word consists of 8 data bits, a parity bit, and two additional coding bits at the end of the data word. Each end-of-packet word comprises a unique pattern that indicates the end of a data packet.

A receiver constructed according to the preferred embodiment of the preferred embodiment measures the phase of incoming data signal as it is received. To decode the incoming signal, the preferred embodiment maintains a rotating frame of reference that tracks the current phase of the data signal.

Furthermore, a receiver constructed according to the teachings of the preferred embodiment monitors and records characteristics of the incoming data signal as each data bit is received. Specifically, the receiver measures the amplitude of the recovered data signal for each bit and the phase characteristics for each pair of consecutive bits. The amplitude of the recovered data signal corresponds to the quality of the incoming data signal. The phase characteristics of the signal are used to record the likelihood that the phase modulated signal was corrupted at a particular time by a phase shift in the communication channel.

After receiving a data word, the receiver uses the parity bit in each word to detect single bit errors. If a single bit error is detected in a word, the receiver corrects the single bit error in that word by inverting the bit that was recovered with the poorest quality data signal. In the preferred embodiment, the data bit with the smallest recovered data signal amplitude is designated as a "weak" bit which is inverted (i.e. corrected) when a parity error is detected.

If the communication channel suddenly shifts the phase of the data signal, the data may be corrupted. In the present embodiment, based upon a Binary Phase-Shift Keying (BPSK) modulated signal, a large phase shift may cause an inversion of the data bits in the data word. In the preferred embodiment, the receiver detects inverted data using two additional coding bits at the end of each data word. The receiver corrects for the data inversion by inverting each data bit starting with the bit location where a phase change most likely to cause an inversion was detected. The preferred embodiment is capable of correcting data words which contain both an inversion and a single bit error, using these two corrections methods in concert.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

FIGS. 1a and 1b illustrates how a Binary Phase-Shift Keying (BPSK) signal is modulated by a transmitter.

FIG. 21a illustrates an example of a (−3, −5) phase hit on an IQ diagram.

FIG. 21b lists how the preferred embodiment decodes the data (prior to error correction) and adjusts the IQ pointer during the (−3, −5) phase hit of FIG. 21a.

FIG. 22a illustrates an example of a (+4, +4) phase hit on an IQ diagram that causes no data inversion.

FIG. 22b lists how the preferred embodiment decodes the data (prior to error correction) and adjusts the IQ pointer during the (+4, +4) phase hit of FIG. 22a.

FIG. 23a illustrates an example of a (+4, +4) phase hit on an IQ diagram that causes a data inversion.

FIG. 23b lists how the preferred embodiment decodes the data (prior to error correction) and adjusts the IQ pointer during the (+4, +4) phase hit of FIG. 23a.

FIG. 24a illustrates an example of a (−4, −4) phase hit on an IQ diagram that causes a data inversion.

FIG. 24b lists how the preferred embodiment decodes the data (prior to error correction) and adjusts the IQ pointer during the (−4, −4) phase hit of FIG. 24a.

FIG. 25a illustrates an example of a (+4, +6) phase hit that causes a data inversion starting with the second data bit after the phase hit.

FIG. 25b lists how the preferred embodiment decodes the data (prior to error correction) and adjusts the IQ pointer during the (+4, +6) phase hit of FIG. 25a.

FIG. 26 lists how a phase weight is assigned for the different possible phase hits.

FIG. 28 lists how a phase weight is assigned for the different possible phase hits when the last different IQ pointer location is on the INC side and the prior data bit is on the INC side.

FIG. 29a illustrates an example of a (−4, −7) phase hit that causes a data inversion that is not detected.

FIG. 29b lists how the preferred embodiment decodes the data (prior to error correction) and adjusts the IQ pointer during the (−4, −7) phase hit of FIG. 29a.

FIG. 35a illustrates an example of differential encoding.

FIG. 35b illustrates an example of a single symbol error in a differentially encoded word.

FIG. 35c illustrates an example of a data inversion in a differentially encoded word.

FIG. 36a illustrates examples of a 3-bit data integrity code added to a data word.

FIG. 36b illustrates a table of the 3-bit data integrity code values that can be added to a data word.

FIG. 37 illustrates a table that lists how a single symbol error or a symbol inversion can affect a data word transmitted with the 3-bit data integrity code.

FIG. 38a illustrates an example of a single symbol error in a differentially encoded word with the 3-bit data integrity code.

FIG. 38b illustrates an example of an inversion in differentially encoded word with the 3-bit data integrity code.

DETAILED DESCRIPTION

Methods and apparatus for encoding and decoding digital information transmitted on an angularly modulated signal are disclosed. In the following description, for purposes of explanation, specific nomenclature is set forth to provide a thorough understanding of the present invention. However, it will be apparent to one skilled in the art that these specific details are not required to practice the present invention. For example, the present invention is disclosed with reference to Binary Phase-Shift Keying modulation. However, the teachings of the present invention are applicable to any angular modulation technique. In other instances, well known circuits and devices are shown in block-diagram form to avoid obscuring the present invention unnecessarily.

Angular Modulation

Angular modulation is a technique of encoding information onto an analog carrier signal by modulating the phase angle of the carrier signal. Binary phase-shift keying (BPSK) is a well known example of angular modulation. FIGS. 1a and 1b illustrate how a BPSK transmitter modulates binary information onto an analog carrier signal using binary phase-shift keying modulation.

Referring to FIG. 1a, a transmitter multiplies a +1 or −1 binary data signal D and a sinusoid carrier signal C to create a binary phase-shift keying signal B that has two different phases that are 180° apart. A first phase represents a binary "0" and the second phase 180° apart from the first phase represents a binary "1". FIG. 1b illustrates a waveform diagram of data signal D, carrier C, and the binary phase-shift keying signal B.

Figures 1C, 1D:
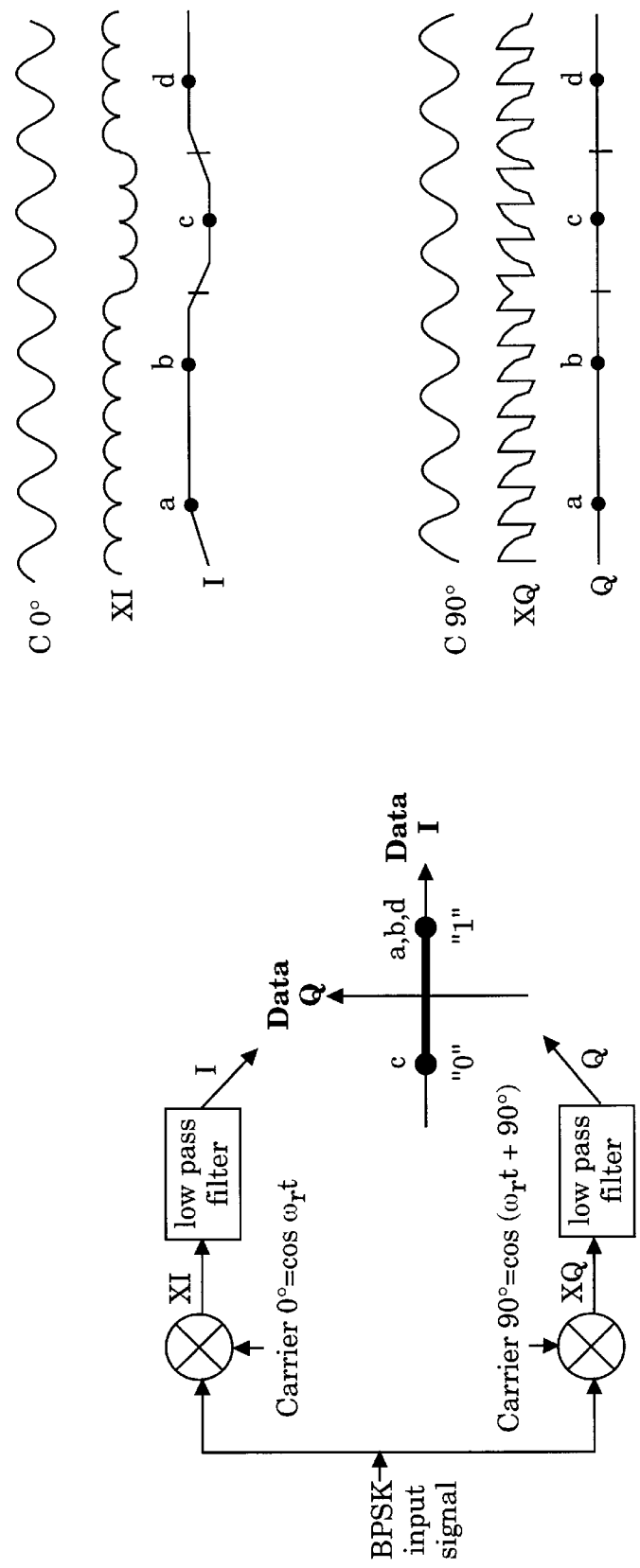
FIGS. 1c and 1d illustrate how a Binary Phase-Shift Keying (BPSK) signal is demodulated by a BPSK receiver.

FIG. 1c illustrates how a corresponding BPSK receiver unit demodulates the received BPSK signal B. Referring to FIG. 1c, the incoming BPSK data signal B is multiplied by an In-phase oscillator signal C0 and a quadrature oscillator signal C90 to generate an XI signal and an XQ signal, respectively. Both the in-phase oscillator signal C0 and the quadrature oscillator signal C90 have the same nominal frequency as the carrier signal from the transmitter. However, the in-phase oscillator signal and the quadrature oscillator signal are 90° apart in phase. Each of the two multiplied signals (XI and XQ) is passed through a low pass filter to create an In-phase data signal I and a quadrature data signal Q, respectively. FIG. 1d illustrates a waveform diagram of in-phase oscillator signal C0, the Quadrature oscillator signal C90, the multiplied IX signal, the multiplied IQ signal, the in-phase data signal I, and the quadrature data signal Q.

When the in-phase data signal I and quadrature data signal Q are plotted on a graph (an IQ diagram), the I and Q data signals create a data line that passes through the origin of the graph as illustrated in FIG. 1c. The two endpoints of the data line represent the binary "0" and "1" data. The data line on the IQ diagram is rotated about the origin depending on how the received carrier phase compares with the phases of the local oscillators within the receiver. In the example of FIGS. 1c and 1d, the phase of the BPSK data signal exactly matches the phase of the In-phase oscillator signal C0.

Figure 2A:
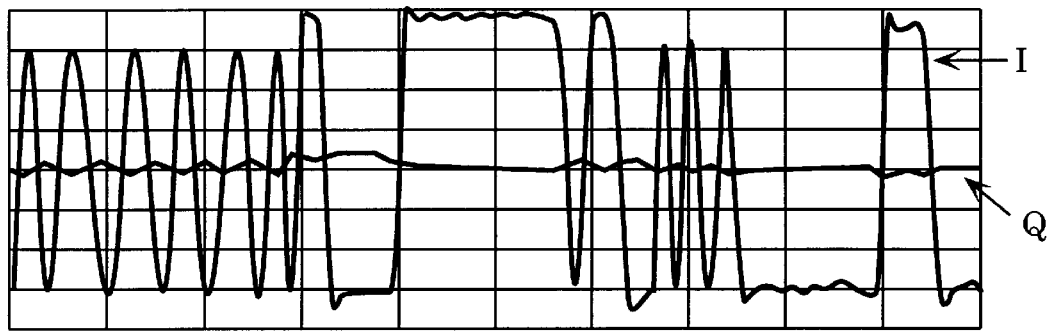
FIG. 2a illustrates the In-phase (I) and Quadrature-phase (Q) data signals from a received BPSK data signal with a phase that matches the phase of the I-channel local oscillator.
Figure 2B:
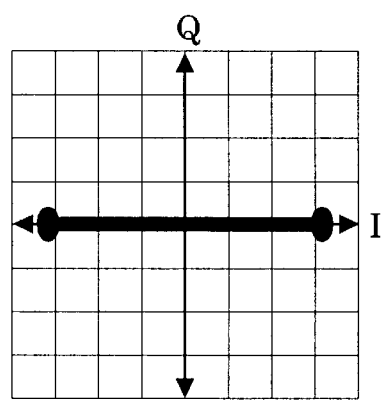
FIG. 2b illustrates the I and Q data signals of FIG. 2a plotted onto an IQ diagram.
Figure 2C:
FIG. 2c illustrates the I and Q data signals from a received BPSK data signal with a phase between the phase of the I-channel and the Q-channel local oscillators.
Figure 2D:
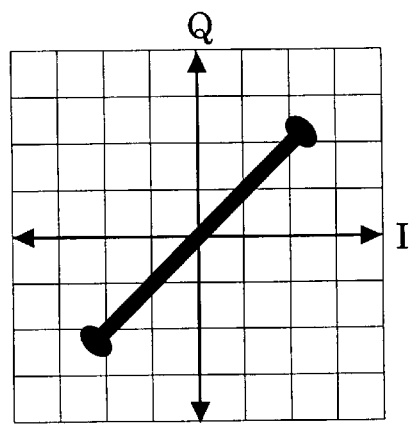
FIG. 2d illustrates the I and Q data signals of FIG. 2c plotted onto an IQ diagram.
Figure 2E:
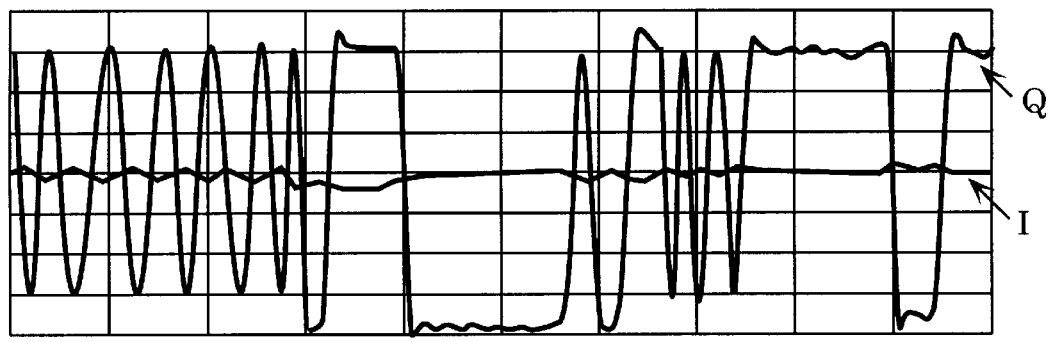
FIG. 2e illustrates the I and Q data signals from a received BPSK data signal with a phase that matches the phase of the Q-channel local oscillator.
Figure 2F:
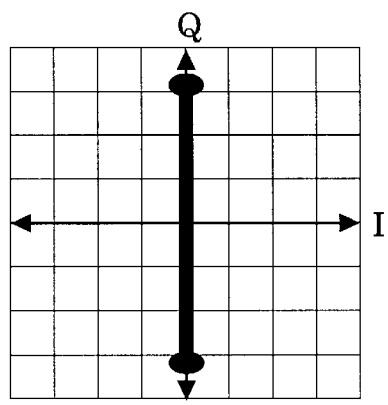
FIG. 2f illustrates the I and Q data signals of FIG. 2e plotted onto an IQ diagram.
Figure 2G:
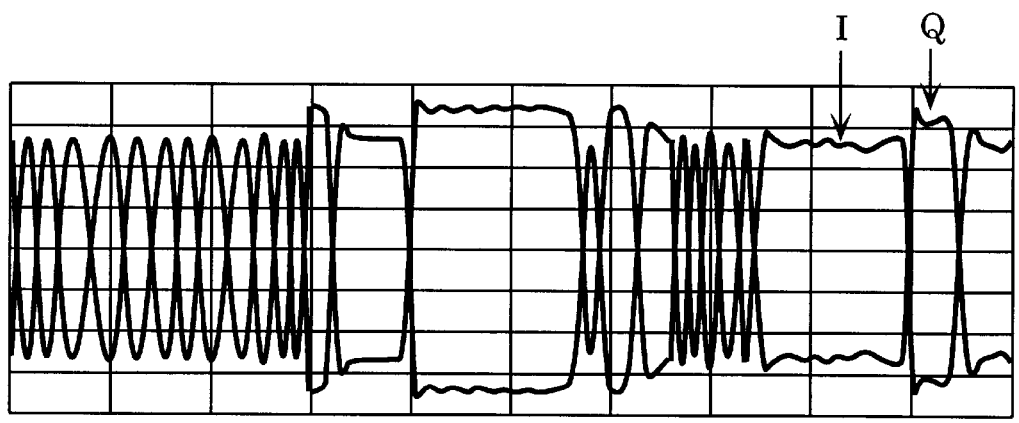
FIG. 2g illustrates the I and Q data signals from a received BPSK data signal with a phase that does not align with either the I-channel or the Q-channel local oscillator.
Figure 2H:
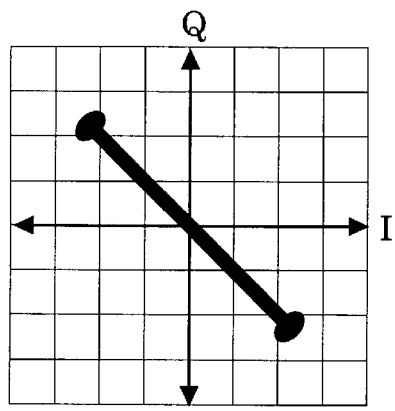
FIG. 2h illustrates the I and Q data signals of FIG. 2g plotted onto an IQ diagram.

FIGS. 2a–2h illustrate how the incoming I and Q data signals appear on an IQ diagram when a received BPSK data signal is multiplied by a receiver's in-phase and quadrature oscillators which have various relative phases to the transmitted carrier. FIG. 2a illustrates the I and Q data signals in a case where the phase of the received BPSK data signal matches the phase of the I oscillator. FIG. 2b illustrates the I and Q data signals from FIG. 2a plotted onto an IQ diagram. As illustrated in FIG. 2b, the binary data creates a data line that is aligned with the I axis. FIG. 2c illustrates the I and Q data signals in a case where the phase of the received BPSK data signal is centered between the phase of the I and Q oscillators. FIG. 2d illustrates the I and Q data signals from FIG. 2c plotted onto an IQ diagram. As illustrated in FIG. 2d, the binary data line appears at a 45° angle since the data appears equally on both the I data signal and the Q data signal. FIGS. 2e and 2f illustrate the I and Q data signals and an IQ diagram plot for a received BPSK data signal that matches the phase of the Q oscillator. FIGS. 2g and 2h illustrate the I and Q data signals and an IQ diagram plot for a received BPSK data signal that does not align with either the I or Q oscillator. It should be apparent that the data line on the IQ diagram can appear at any angle on the IQ diagram.

Angular Modulation On An Impaired Channel

The preferred embodiment of the present invention teaches techniques for transmitting and receiving an angularly modulated signal through an impaired communication channel. The techniques of the preferred embodiment are tailored for reliably transmitting and receiving an angularly modulated signal through a communication medium that may suddenly change the phase of the angularly modulated signal. Specifically, the preferred embodiment was designed to encode and decode a Binary Phase-Shift Keying (BPSK) modulated signal transmitted through power distribution lines. However, the disclosed techniques can easily be applied to other angular modulation techniques and to other communication channels.

Figure 3:
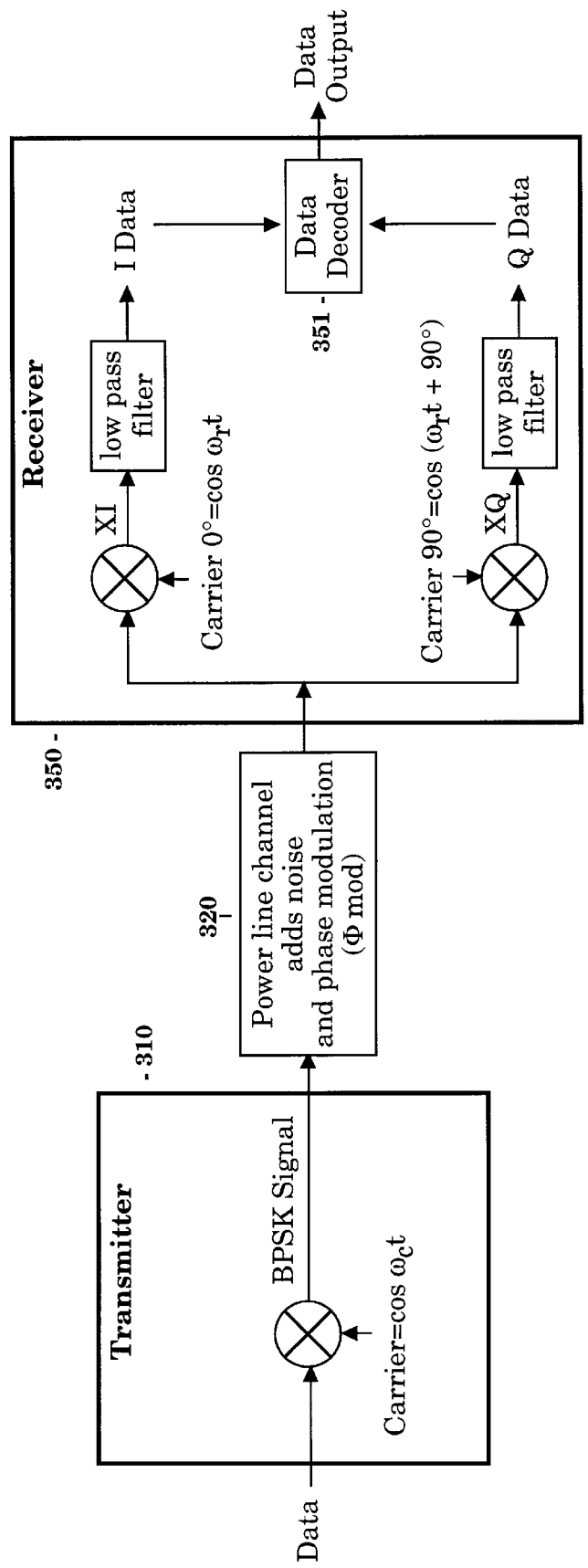
FIG. 3 illustrates a BPSK transmitter that transmits a BPSK encoded signal through a power distribution line to a BPSK receiver.

FIG. 3 illustrates how a Binary Phase-Shift Keying (BPSK) signal is transmitted and received on a power distribution line. On the left side of FIG. 3 is a BPSK transmitter 310 that encodes the binary data onto a BPSK data signal. The BPSK transmitter 310 transmits the BPSK data signal through a power distribution line 320 to a receiver 350.

While the BPSK data signal propagates through the power distribution line 320, noise and phase modulation alter the transmitted BPSK data signal. For example, electrical devices such as light dimmers and electric motors add noise to the BPSK data signal. Other electrical devices, such as television sets and power supplies, cause sudden phase shifts of the BPSK data signal on the power distribution line.

At the BPSK receiver 350, the received BPSK data signal is multiplied by two oscillator signals that are 90° apart in phase and the two resulting signals are then passed through low-pass filters to generate the I and Q data signals as previously described. The I and Q data signals are sampled and decoded by the data decoder 351 to recover the data.

Figure 4:
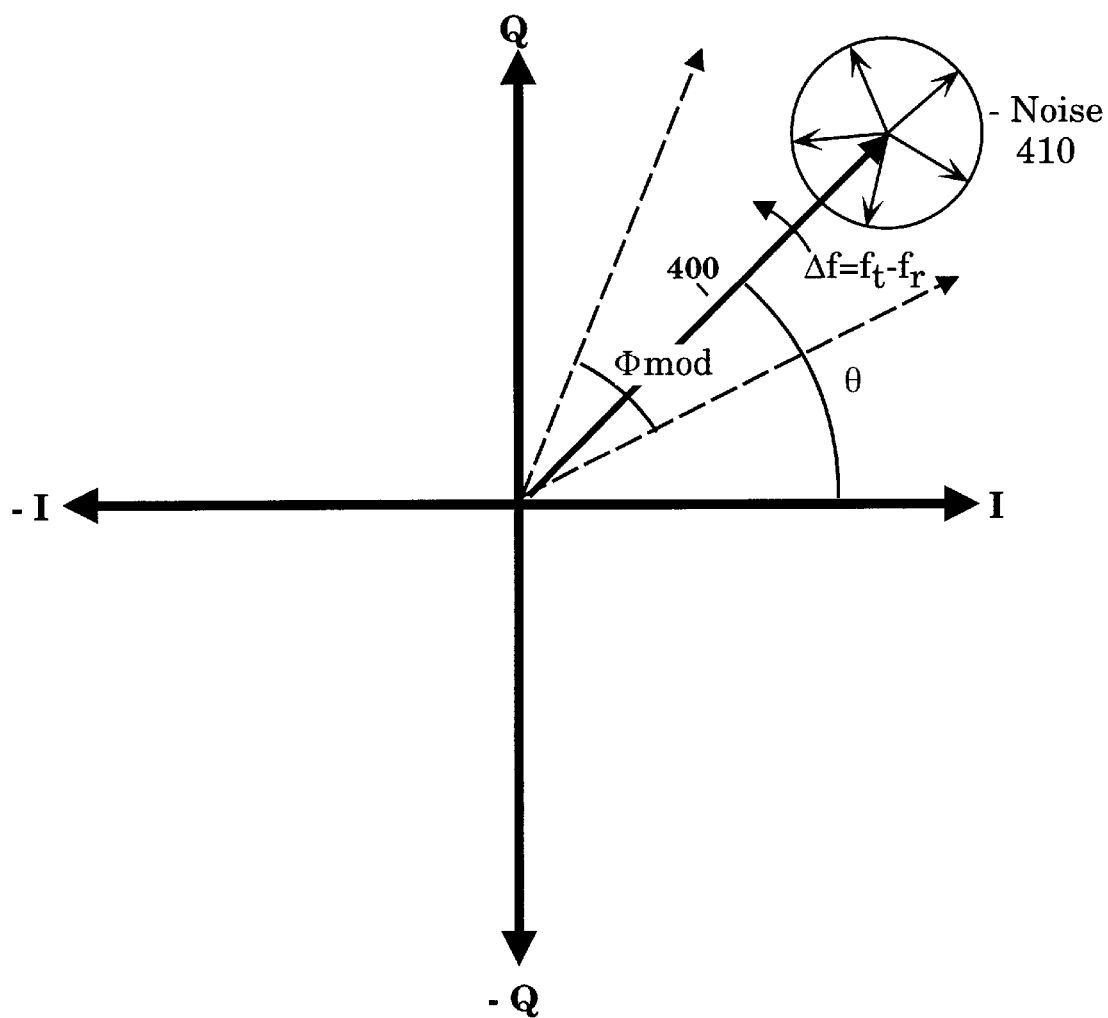
FIG. 4 illustrates how noise and phase modulation affect the I and Q data samples of a received BPSK signal.

FIG. 4 illustrates how noise 410 and phase modulation on a communication channel affect the BPSK data signal. Each data bit from the original BPSK data signal can be plotted as an IQ vector on an IQ diagram. As explained in the previous section, the difference in phase between the received carrier signal and the receiver's I oscillator is represented by the angle θ of the IQ vector.

The frequency of the transmitted carrier and the frequency of the receiver's local oscillator will not be exactly equal due to crystal differences between the transmitter and receiver. The slight difference (Δf) between the frequency of the transmitter carrier ($f_t$) and the frequency of the receiver's oscillator ($f_r$) will cause IQ vectors created by successive data bits to slowly rotate around the IQ diagram.

Noise on the communication channel can change both the angle and the magnitude of the IQ vector for a data bit. It is therefore desirable to implement a robust data recovery scheme and an error correction scheme that will prevent decoding errors and correct the errors that do occur in the received data.

Finally, the phase modulation (φ mod) caused by certain electrical devices on a power distribution line also changes the angle θ of the IQ vector. Certain electrical devices such as television sets can suddenly change the angle θ of the IQ vector by greater than 90° which may result in the recovered data bits being inverted. It is therefore desirable to implement a robust data recovery scheme including an error detection and correction scheme that will detect and correct inverted data.

The preferred embodiment comprises a BPSK transmission system that encodes the data in a manner such that errors caused by noise and errors caused by data inversions can be detected. Furthermore, the two types of errors can be distinguished from each other. A receiver implemented according to the preferred embodiment contains a specialized error correction mechanism that detects errors in the data using the error encoding and corrects the errors by altering the received data using some hints identified from certain characteristics of the received signal. Specifically, a single bit error correction mechanism corrects single bit errors by inverting the bit received with the poorest signal quality, and a phase correction mechanism corrects data inversions by inverting all the bits after the most likely starting point for a data inversion.

Data Packeting

Figure 5:
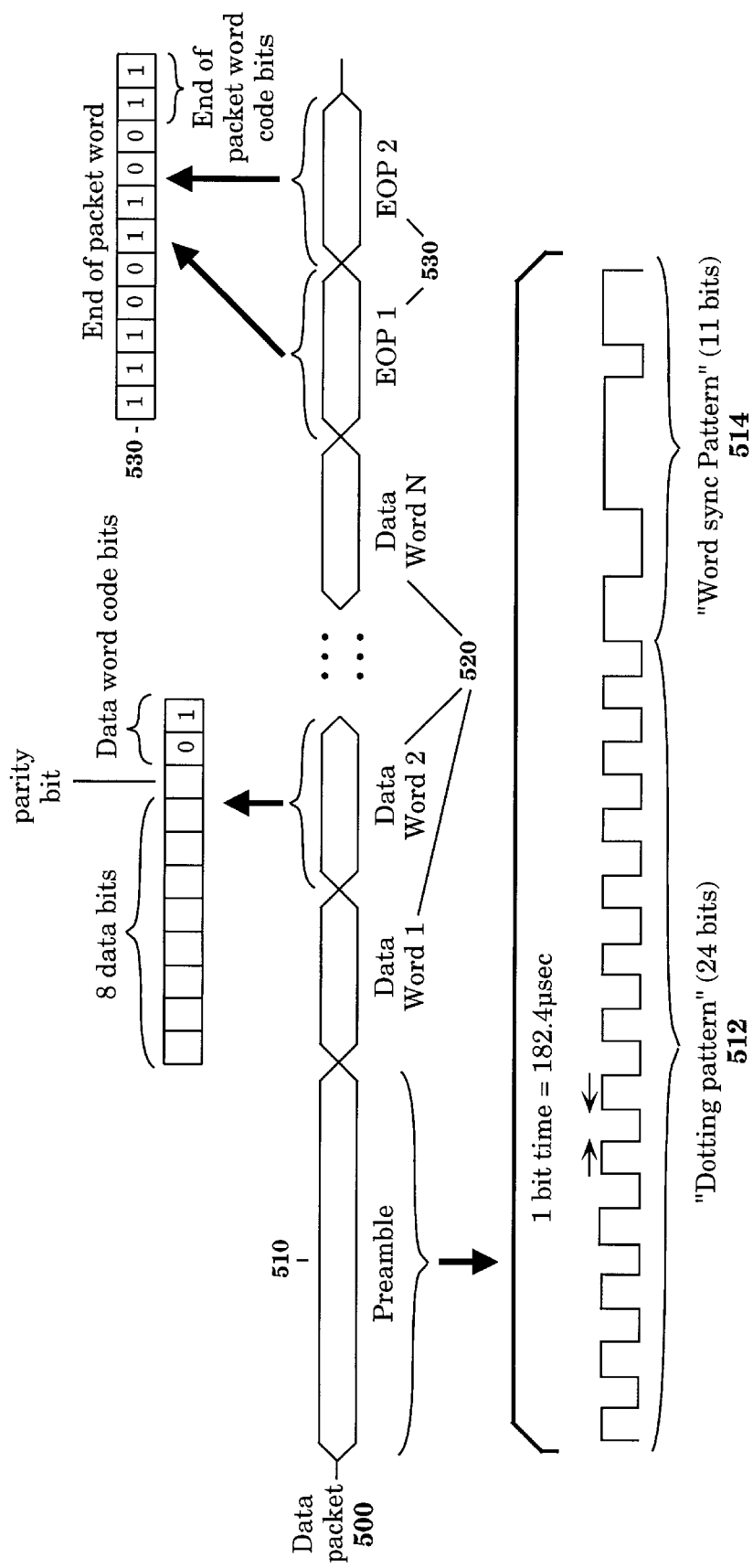
FIG. 5 illustrates a data packet consisting of a preamble, a set of data words, and a pair of End-of-Packet words.

In the digital communication system of the preferred embodiment, the binary information to be transmitted is organized into packets of binary data. FIG. 5 illustrates a data packet 500 as defined by the preferred embodiment of the present invention.

Each data packet 500 of the preferred embodiment consists of a packet preamble 510, a number of data words 520, and a pair of End-Of-Packet words 530. The packet preamble 510 consists of a 24-bit "dotting pattern" 512 and an 11-bit "word sync pattern" 514.

The dotting pattern of the preamble 510 consists of 24 bits of alternating ones and zeroes. The 24-bit dotting pattern 512 is used by the receiver to detect and confirm a data carrier signal. More information about detecting a data carrier signal can be found in the copending patent application "Apparatus and Method for Detecting a Signal in a Communications System", Ser. No. 08/224,903, filed on Apr. 8, 1994. The 24-bit dotting pattern 512 is also used to perform bit synchronization such that the BPSK receiver samples the incoming BPSK data signal at the proper times.

The word sync pattern 514 in the data packet preamble 510 performs two functions. First, the word sync pattern 514 is used to synchronize the receiver as to when the data words 520 begin. Thus, the word sync pattern 514 aligns the receiver along the word boundaries. Second, the word sync pattern 514 is used to determine the polarity of the received data (which end of the data line on an IQ diagram is a binary "1" and which end is a binary "0").

Following the word sync pattern 514 are a plurality of data words 520 that contain the data to be transmitted. As illustrated in FIG. 5, each data word 520 in the preferred embodiment consists of 11 bits. The first 8 bits of the data word 520 are the actual data. The next bit is an odd parity bit that is used to detect a single-bit error in the data word 520. Instead of a single parity bit, more than one error detection bit may be used for improved error detection. The last two bits are two additional coding bits that designate whether the word is a data word ("01"), or an End-of-Packet (EOP) word ("11"), and are used to detect a data inversion in the data word 520.

After all the data words 520 of the data packet 500 have been transmitted, the transmitter sends two End-of-Packet words 530 to indicate that the entire data packet 500 has been sent. The End-of-Packet word 530 consists of the 11-bit pattern "11100110011". Two End-of-Packet words 530 are sent such that the receiver will probably detect at least one of the End-of-Packet words and therefore stop decoding the data packet 500.

Large phase shifts caused by the communication channel can invert the data many times during the transmission of a data packet 500. For example, FIG. 6a illustrates a data packet wherein many data inversions occur.

Figure 6A:
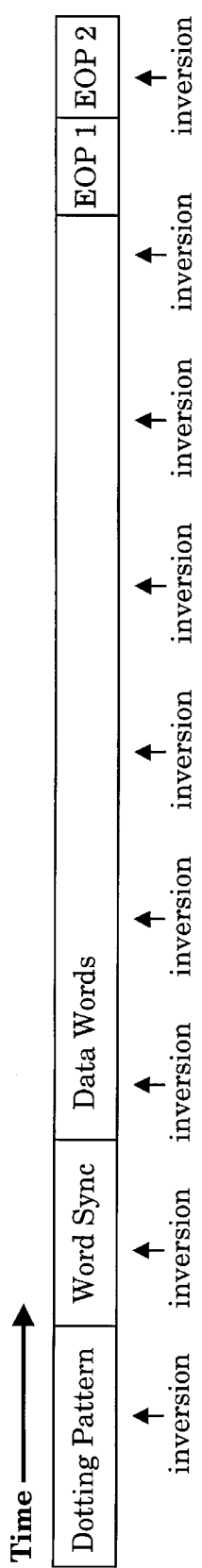
FIG. 6a illustrates a data packet that has been hit by many data inversions.
Figure 6C:
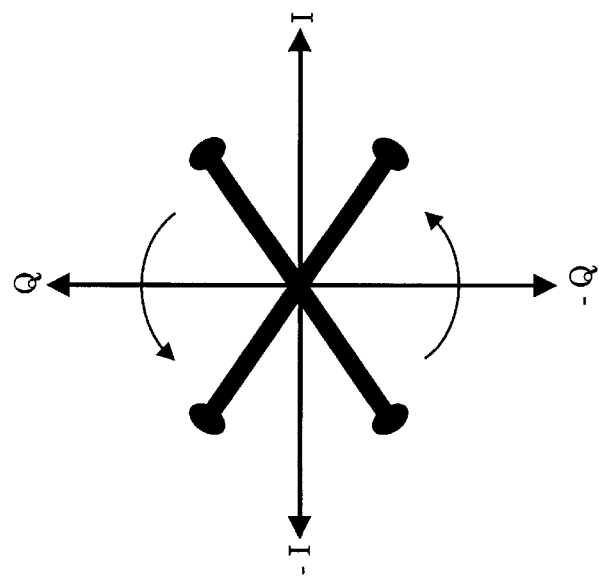
FIG. 6c illustrates how a data inversion affects the data line on an IQ diagram.
Figure 6B:
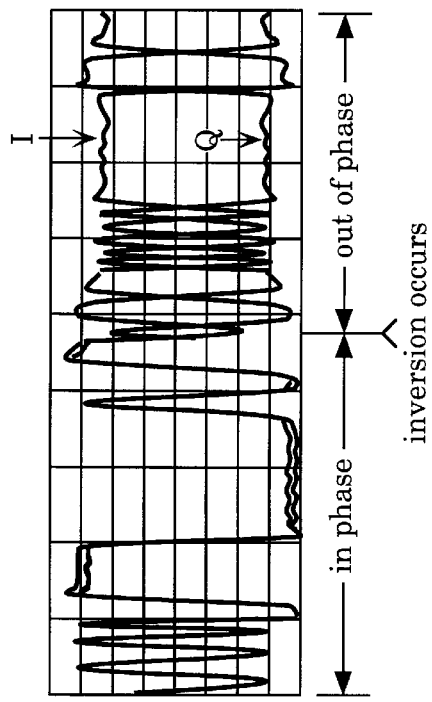
FIG. 6b illustrates how a data inversion appears on the I data signal and the Q data signal.

FIGS. 6b and 6c illustrate how a rapid and large phase shift affects the I data signal and the Q data signal to create a data inversion. As illustrated in FIG. 6b, the phase shift changes the I data signal and the Q data signal such that the two data signals go from in-phase with each other to out-of-phase from each other in the middle of receiving a data word. When plotted onto an IQ diagram, the I and Q data signals create a line that rotates about the origin. As seen in FIG. 6b, the phase shift is rapid in that it occurs in much less than a bit time, and as seen in FIG. 6c, the phase shift is large in that the rotation is approximately 100°.

As illustrated in FIGS. 6a through 6c, it would be desirable to encode the data packet in a manner such that a receiver can detect and correct for many phase changes during a data packet that may or may not invert the received data.

Word Sync Pattern

Since an entire data packet 500 will be lost unless the BPSK receiver properly detects the word sync pattern 514 for the data packet 500, it is very important that the BPSK receiver be able to correctly identify the word sync pattern 514. The receiver should be able to identify a received word sync pattern 514 even if the received word sync pattern 514 contains errors.

Thus the word sync pattern 514 should be chosen such that it is very robust. An optimal word sync pattern has the following characteristics:

1) The word sync pattern unambiguously specifies the word boundary.

2) The word sync pattern unambiguously determines the data polarity (what is a binary "1" and what is a binary "0").

3) The word sync pattern is immune to a single bit error.

4) The word sync pattern is immune to a data inversion.

5) The word sync pattern is immune to any combination of a single bit error and a data inversion.

6) The word sync pattern is immune to false synchronization caused by an impaired dotting pattern.

To simplify the receiver hardware, the word sync pattern 514 was chosen to be 11 bits such that it is the same size as the data words 520 and End-of-Packet words 530. An exhaustive search performing more than 75 million compares was done to find the best 11-bit word sync pattern to meet the desired characteristics listed above. No 11-bit pattern completely fulfilled the desired characteristics. However, the pattern "11001111011" was selected since it was the optimum pattern that best fulfilled the desired characteristics.

The word sync pattern "11001111011" unambiguously specifies the word boundary and the data polarity for the error-free case, for all possible single bit errors, and for all data inversions. The "11001111011" pattern unambiguously specifies the word boundary for most combinations of a single bit error and a data inversion. The "11001111011" pattern also unambiguously specifies the data polarity for all single bit error and data inversion combinations except for a few combinations for which it is theoretically impossible to be unambiguous.

Assigning Data to Sectors in an IQ Diagram

In the BPSK receiver of the preferred embodiment, the I data signal and the Q data signal are digitally sampled at the center of the bit periods. In the preferred embodiment, each digitized sample is an 11-bit value. Each pair of I and Q samples is then assigned to one of 16 angular sectors that specifies the phase of the IQ sample.

Figure 7A:
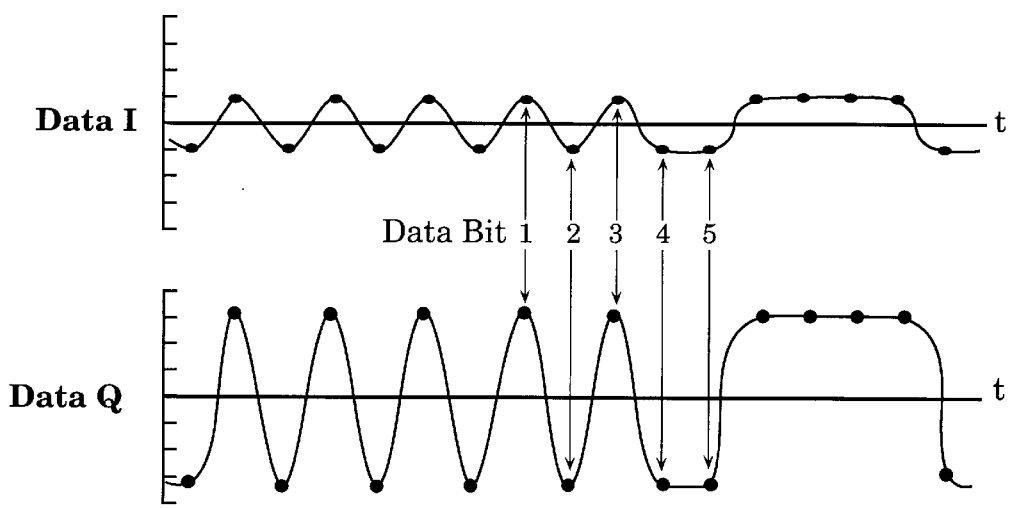
FIG. 7a illustrates the I data signal and the Q data signal for a received BPSK data signal.

For example, FIG. 7a illustrates the data I and data Q signals after the input data signal has been multiplied by the I and Q local oscillator signals and filtered with a low pass filter. The data I and data Q signals are sampled at appropriate times to produce data I and data Q data pairs.

Figure 7B:
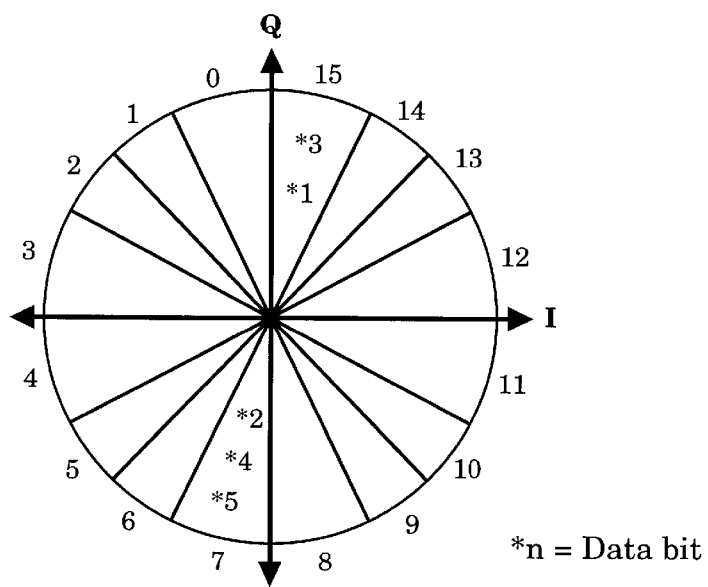
FIG. 7b illustrates 5 data bits from the I and Q data signal of FIG. 7a plotted onto an IQ diagram divided into 16 sectors.

FIG. 7b illustrates a two-dimensional IQ diagram that has been divided into sixteen angular sectors. The sixteen angular sectors are sequentially numbered from 0 to 15 around the IQ diagram. The preferred embodiment labels the sixteen angular sectors sequentially around the IQ diagram such that it is easy to calculate the angular distance between different sectors.

The five data bits from FIG. 7a (data bits *1–*5) have been plotted onto the IQ diagram in FIG. 7b. In FIG. 7b and throughout this specification, all IQ data bits will be referenced with a preceding asterisk "*". Furthermore, in FIG. 7b and throughout this specification, each IQ data bit is positioned in the correct sector but not in any specific location within each sector. Thus, the 16-sector IQ diagrams convey quantized phase information but no amplitude information.

As illustrated in FIG. 7b, all five of the IQ data bits (data bits *1–*5) fall within sector 7 or sector 15, which are 180° apart from each other. The data bits in one of those sectors represent binary "1"s and the data bits in the other sector represent binary "0"s.

Figure 8:
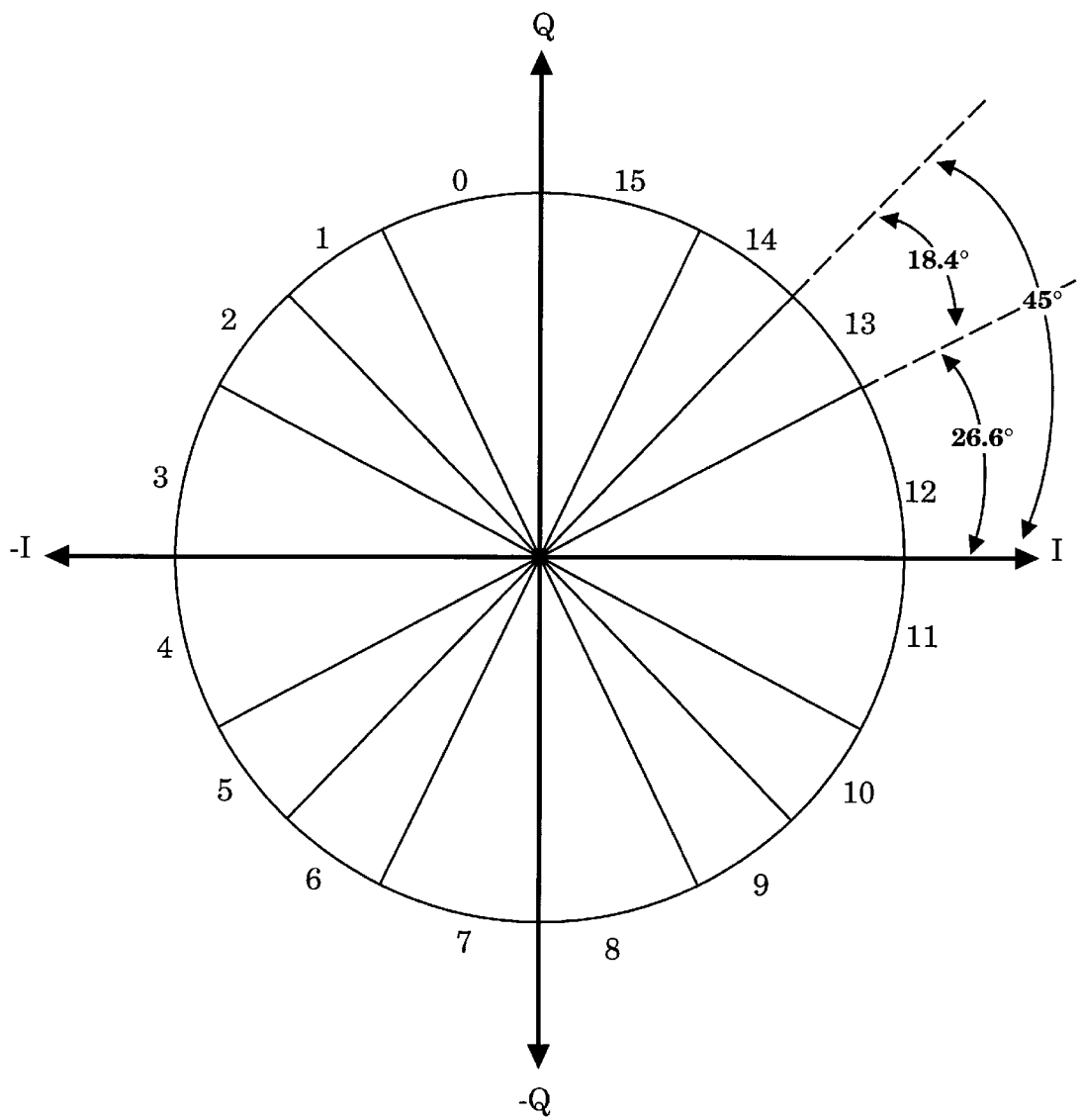
FIG. 8 illustrates how the preferred embodiment divides an IQ diagram into 16 sectors.

To simplify the hardware implementation of a receiver constructed according to the preferred embodiment, the 16 sectors are not of equal size. As illustrated in FIG. 8, each quadrant of the IQ diagram comprises two sectors that are 26.6° and two sectors that are 18.4°. These unequal sector sizes were chosen since the hardware implementation to determine within which of these unequal sectors a data bit is received is less complex than the case of equal sector sizes.

To determine which of the 16 unequal sectors a data bit falls in, the receiver performs four tests on each data bit. FIGS. 9a–9d illustrate the four tests used to determine which sector a data bit falls within.

Figure 9B:
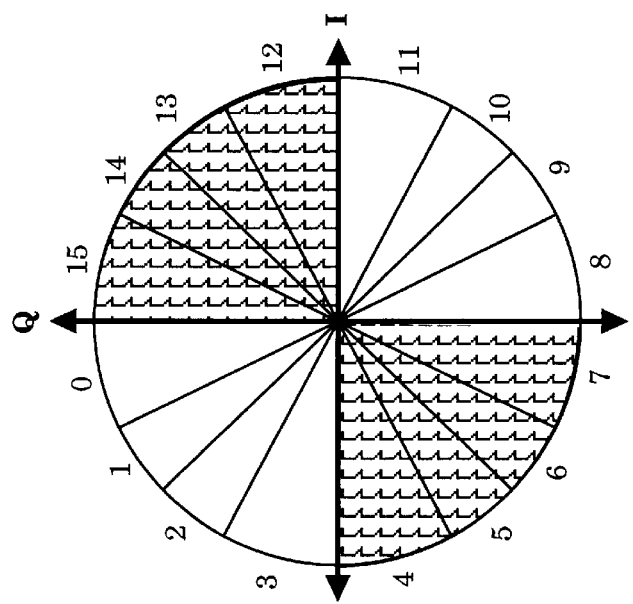
FIG. 9b illustrates a second test performed to determine which sector a data bit falls within.
Figure 9A:
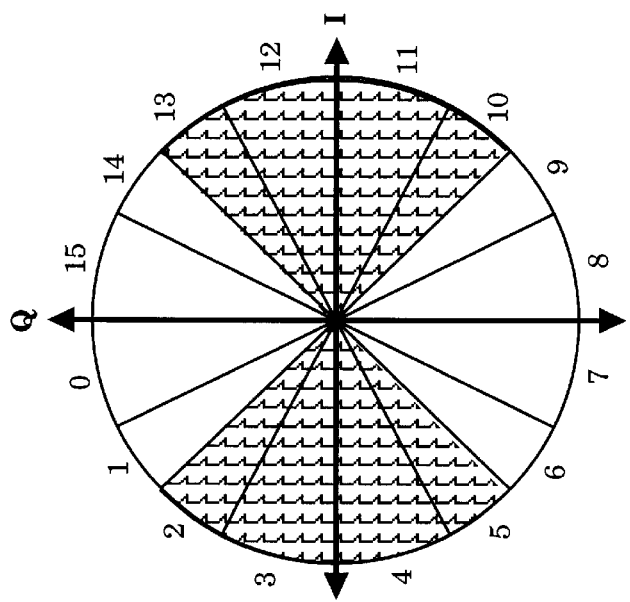
FIG. 9a illustrates a first test performed to determine which sector a data bit falls within.
Figure 9D:
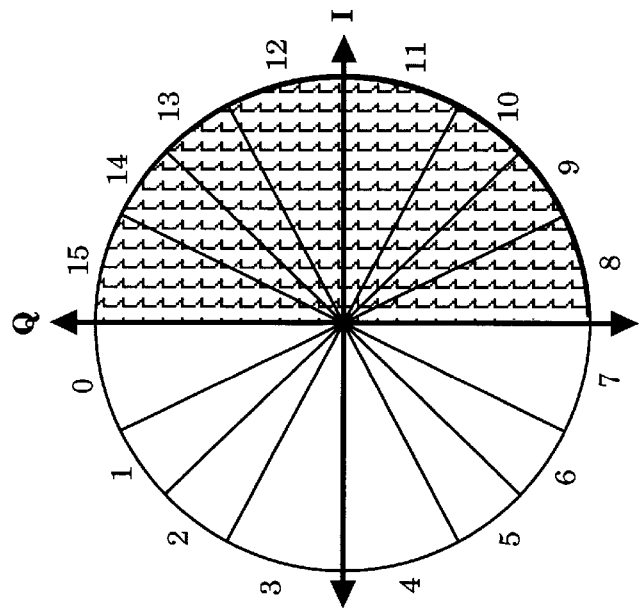
FIG. 9d illustrates a fourth test performed to determine which sector a data bit falls within.

FIG. 9a illustrates a first test which determines whether the magnitude of I is greater than the magnitude of Q for the data bit. If this is true, then the data bit falls within sectors 2–5 or 10–13. The second test, illustrated in FIG. 9b, determines whether I and Q have the same sign. If this is true, then the data bit must fall within sectors 4–7 or 12–15. The third test, illustrated in FIG. 9c, determines whether the magnitude of I or Q is more than twice as large as the other. That is, the third test determines whether the magnitude of I is greater than two times the magnitude of Q, or whether the magnitude of Q is greater than two times the magnitude of I. If so, then the data bit must fall in sector 0, 3, 4, 7, 8, 11, 12, or 15. FIG. 9d illustrates the final sector test. The final sector test simply determines if the sign of I is positive. If the sign of I is positive, the vector must be within sectors 8–15.

Figures 10, 11:
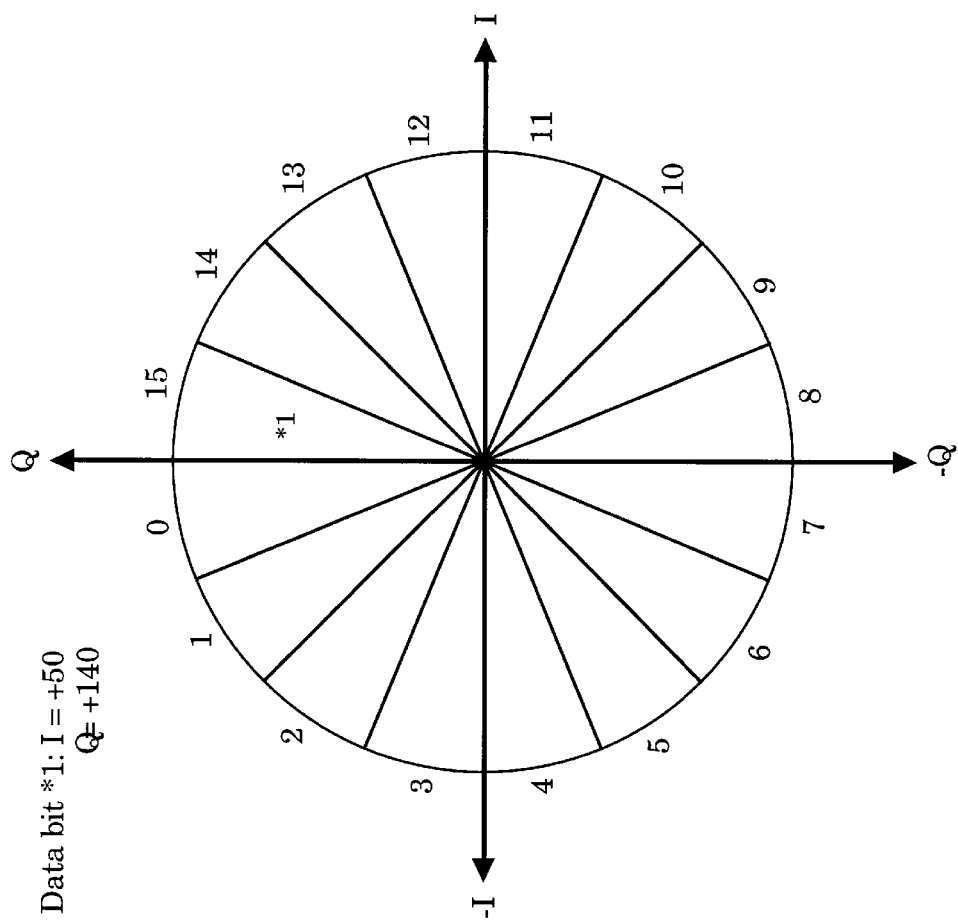
FIG. 10 illustrates a mapping of the results from the tests in FIGS. 9a to 9d into an IQBAND value.
FIG. 11 illustrates an example of determining the sector a data bit falls within.

The outcome of the first three tests are mapped to a three-bit IQBAND value (0–7 decimal) according to the table in FIG. 10. The value of ISIGN, as determined by the fourth test, is then added as a most significant bit to produce a four-bit value (0–15 decimal) that designates the sector containing the data bit. The end result is a 0 to 15 angular sector number as labeled in FIG. 7b.

Figure 9C:
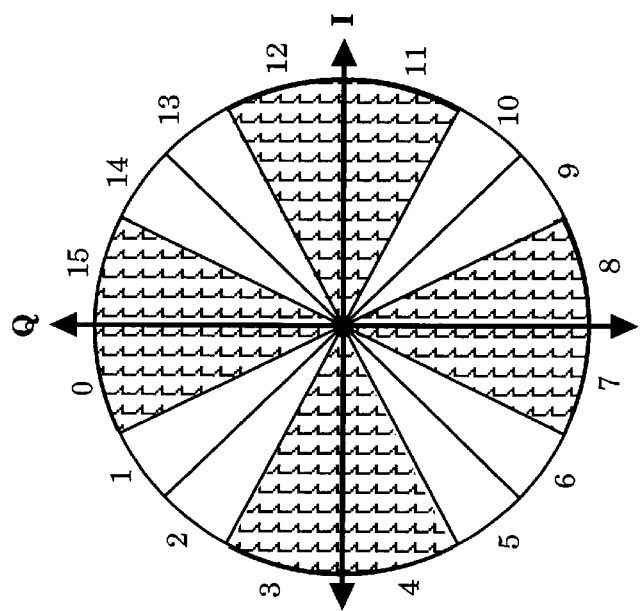
FIG. 9c illustrates a third test performed to determine which sector a data bit falls within.

For example, referring to the data bit *1 in FIG. 11, assume the I data value is +50 and the Q data value is +140. The first test, as illustrated in FIG. 9a, determines if the magnitude of I is greater than the magnitude of Q for data bit *1. For data bit *1 in FIG. 11 this is not true; therefore IGTQ is set to 0. The second test as illustrated in FIG. 9b determines if I and Q have the same sign. In this case, both I and Q are positive so SAMESIGN is set to 1. The third test as illustrated in FIG. 9c determines if the magnitude of I is greater than twice the magnitude of Q, or if the magnitude of Q is greater than twice the magnitude of I. In this case, the magnitude of Q is greater than twice the magnitude of I, such that BIG is set to 1. The fourth test as illustrated in FIG. 9d determines if the I data value is positive. In this case, I is positive so ISIGN is set to 1. Referring to the map of FIG. 10, the "011" IGTQ/SAMESIGN/BIG value is mapped to the IQBAND value of "111". When the value of ISIGN is concatenated as the most significant bit, the sector for data bit *1 is "1111" binary, or 15 decimal.

Data Alignment—The IQ Pointer

The preferred embodiment tracks the changing phase of an incoming carrier signal by maintaining a rotating frame of phase reference. The rotating frame of phase reference is referred to as the IQ pointer.

As previously set forth, the incoming I and Q data signals appear as a data line passing through the origin when plotted on a two-dimensional IQ diagram. The angle of the data line depends upon the relative phases of the received carrier signal and the local oscillator in the receiver. The preferred embodiment marks the relative phase of the received carrier signal by setting the IQ pointer to point to one of the 16 sectors of the IQ diagram. All incoming IQ data bits that are closely aligned with the IQ pointer are decoded as data "1"s and all IQ data bits that are closely aligned with the sector 180° from the IQ pointer are decoded as data "0"s.

When the phase of the incoming data signal changes with respect to the receiver's local oscillator, the data line rotates around the IQ diagram. To adjust for the changing phase of the incoming data signal, the preferred embodiment rotates the position of the IQ pointer to approximately match the angle of the data line created by the I and Q data signals.

One use of the IQ pointer is to determine whether an incoming data bit is a binary "1" or a "0". However, the IQ pointer is also used for several other functions. The IQ pointer is used, along with other information, to calculate a signal amplitude value that indicates the quality of the incoming data signal for each data bit. The IQ pointer is also used as a phase reference to determine when the phase of the incoming data signal changes. Furthermore, the IQ pointer is also used to resolve ties when assigning each IQ data bit to a sector on the IQ diagram.

Initial Alignment of the IQ Pointer With An Incoming Data Packet

In the BPSK transmission system of the preferred embodiment, binary data is transmitted in data packets as defined in FIG. 5. During the packet preamble 510 of each data packet 500, the receiver receives a dotting pattern 512 consisting of alternating binary "1"s and binary "0"s. The receiver initially aligns the IQ pointer to the phase of the incoming BPSK data signal during the dotting pattern 512. The receiver aligns the IQ pointer using a tracking mechanism and a jump mechanism described below.

Following the dotting pattern 512, the receiver attempts to detect the word sync pattern 514 or an inverted or partially inverted version of the word sync pattern 514 (with or without a single bit error) to determine the data polarity of the incoming data signal. If the receiver detects the word sync pattern 514 ("11001111011") (with or without a single bit error) or a partially inverted word sync pattern (with or without a single bit error) where the polarity is correct at the end of the pattern, then the IQ pointer is aligned in the correct sector. If the receiver detects the inverted word sync pattern 514 ("00110000100") (with or without a single bit error) or a partially inverted word sync pattern (with or without a single bit error) where the polarity is incorrect at the end of the pattern, then the IQ pointer is flipped to align the IQ pointer with the sector 180° from the current IQ pointer sector.

Aligning the IQ Pointer With Incoming Data

As a data packet 500 is being received, the receiver continually adjusts the position of the IQ pointer to keep the IQ pointer aligned with the incoming data signal. The IQ pointer must be adjusted in small increments to adjust for small phase changes caused by the communication channel and by the slow phase rotation due to the slight difference between the transmitter's crystal frequency and the receiver's crystal frequency. The IQ pointer must also be adjusted in larger increments to handle larger phase shifts caused by impairments on the communication channel.

Although the IQ pointer must track the phase of the incoming data signal, the IQ pointer must be stable such that the IQ pointer is not adjusted in response to random or impulsive noise on the received signal. When the phase response of the communication channel changes, the IQ pointer must be able to rapidly align itself with the new phase.

The preferred embodiment implements two mechanisms that adjust the position of the IQ pointer to keep the IQ pointer aligned with the incoming data signal. A tracking mechanism is used to move the IQ pointer in small increments in response to small phase changes. A jump mechanism adjusts the IQ pointer in larger increments to handle larger phase changes.

To prevent adjustments to the IQ pointer in response to random noise or impulses, both the tracking mechanism and the jump mechanism in the preferred embodiment require that two consecutive data bits indicate a phase change before the IQ pointer is adjusted. However, once two consecutive data bits indicate a phase change, the tracking mechanism or the jump mechanism will continue to move the IQ pointer each bit time until the IQ pointer is aligned with the incoming data signal. Thus, the tracking and jump mechanisms avoid moving the IQ pointer in response to random noise or impulses; yet the IQ pointer is rapidly adjusted when a step phase change of the data signal occurs.

The IQ Pointer Tracking Mechanism

As set forth earlier, the slight difference between the transmitter's crystal frequency and the receiver's crystal frequency causes the data line created by the I and Q data signals to slowly rotate around the IQ diagram. Furthermore, varying impedances on the communication channel may shift the phase of the incoming data signal. To adjust for small phase shifts of the incoming data signal, the tracking mechanism moves the position of the IQ pointer up to one sector per bit time to track the changing phase of the incoming data signal.

The tracking mechanism may be illustrated by a state machine that increments the IQ pointer by one sector if two successive data bits are within a certain number of sectors counter-clockwise from the current IQ pointer sector, or decrements the IQ pointer by one sector if two successive data bits are within a certain number of sectors clockwise from the current IQ pointer. In this manner the tracking mechanism moves the IQ pointer to align it with the incoming data bits. When the IQ pointer is aligned with the incoming data bits, the tracking mechanism does not move the IQ pointer.

To determine whether the IQ pointer should be incremented or decremented, the tracking mechanism bisects the IQ diagram with a line perpendicular to the line that separates the sector containing the current IQ pointer and the adjacent sector in the direction from which the IQ pointer last moved. For example, referring to FIG. 12a, the IQ pointer (1) is currently in sector 13. In FIG. 12a and throughout this document, the position of the IQ pointer after receiving a particular data bit *n is designated as a matching number with surrounding parentheses, such as (n). For example, the location of the IQ pointer after receiving data bit *1 is designated as (1). The most recent location of the IQ pointer that is different from the location of the IQ pointer (1) is designated by (0). In FIG. 12a, the last different IQ pointer (0) location was sector 12. Thus, the IQ diagram is bisected using a line perpendicular to the division between sectors 12 and 13.

The IQ diagram is then divided into aligned sectors, increment (INC) sectors, and decrement (DEC) sectors, as illustrated in FIG. 12a. The aligned sectors are the sector containing the IQ pointer and the sector 180° from the IQ pointer. The increment (INC) sectors are the sectors in the same half as the IQ pointer that are counter-clockwise from the sector containing the IQ pointer and the sectors in the opposite half from the IQ pointer that are counter-clockwise from the sector 180° from the IQ pointer. Correspondingly, the decrement (DEC) sectors are the sectors in the same half as the IQ pointer that are clockwise from the sector containing the IQ pointer and the sectors in the opposite half from the IQ pointer that are clockwise from the sector 180° from the IQ pointer.

Figure 12B:
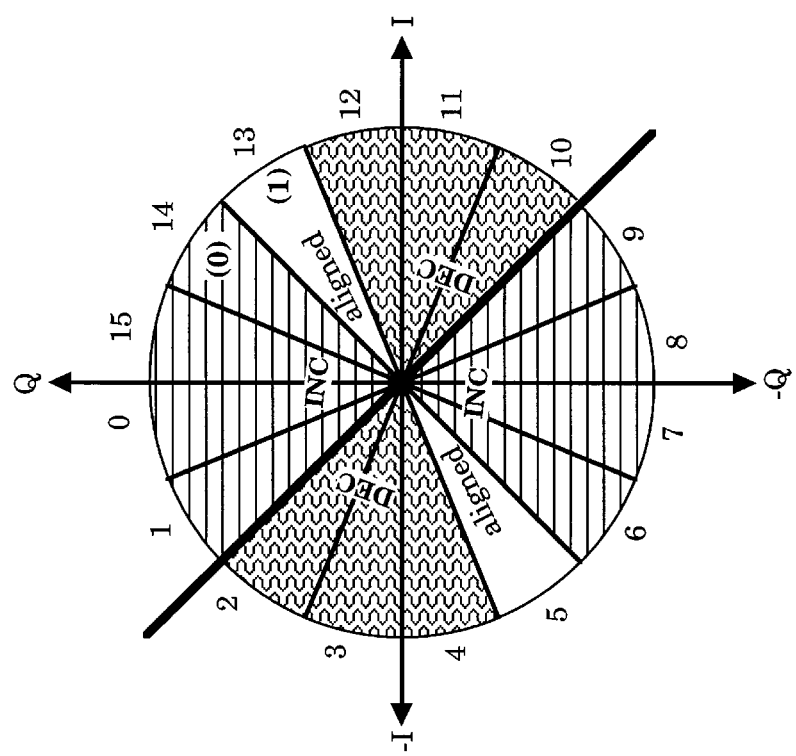
FIG. 12b illustrates a second example of how a data bit affects the tracking mechanism depending on the position of the IQ pointer.
Figure 12A:
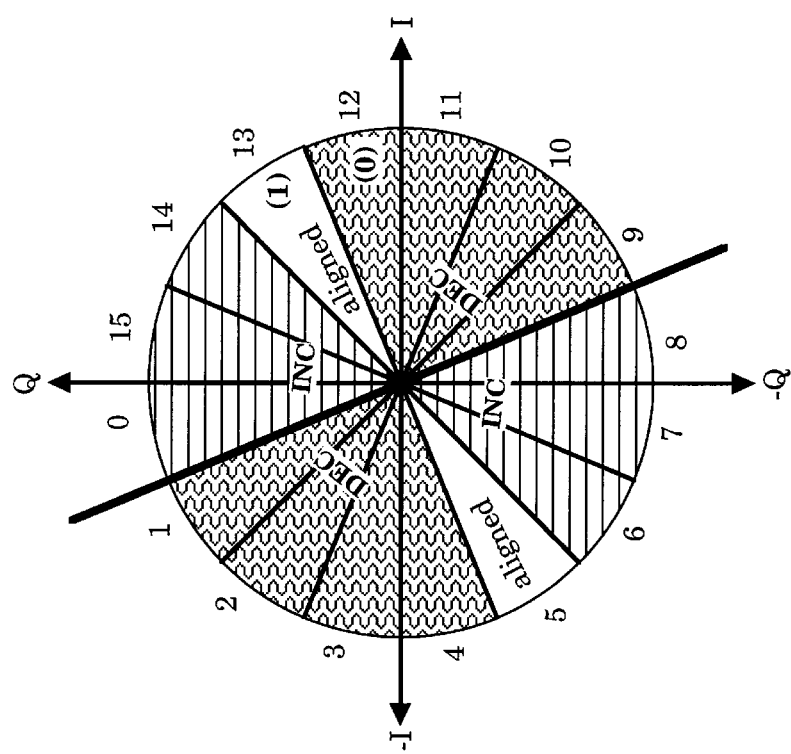
FIG. 12a illustrates a first example of how a data bit affects the tracking mechanism depending on the position of the IQ pointer.

FIG. 12b illustrates a second example of the aligned, increment (INC), and decrement (DEC) sectors. In the example of FIG. 12b, the IQ pointer (1) is in sector 13 and the last different IQ pointer (0) location is sector 14.

Figure 13:
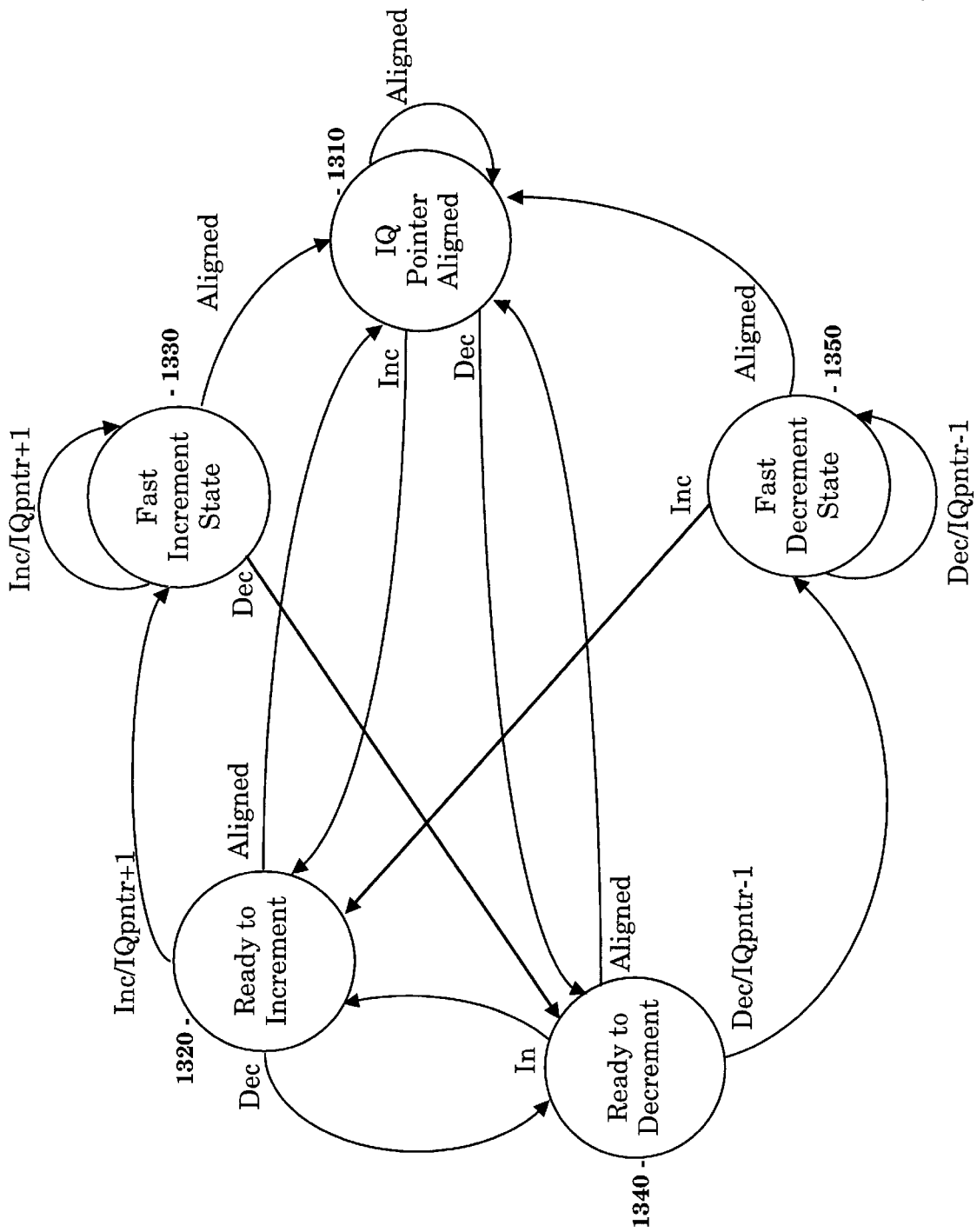
FIG. 13 illustrates a state diagram of the tracking mechanism that adjusts the position of the IQ pointer.

Using the aligned, increment (INC), and decrement (DEC) sector information for each data bit, the tracking mechanism responds to each incoming data bit according to the state diagram of FIG. 13. When the IQ pointer is aligned with the incoming BPSK data signal, the tracking mechanism is in an "aligned" state 1310. When the receiver receives a data bit in an increment (INC) sector, the tracking mechanism moves to a "ready to increment" state 1320. If a second consecutive data bit in an increment (INC) sector is received while the tracking mechanism is in the ready to increment state 1320, the tracking mechanism increments the IQ pointer and moves to a "fast increment" state 1330. In the fast increment state 1330, the tracking mechanism continues to increment the IQ pointer for every consecutive data bit in an increment (INC) sector. The tracking mechanism decrements the IQ pointer when consecutive data bits in decrement (DEC) sectors are received in the same manner. (Note: If the IQ pointer is in sector 15 and is incremented, it moves to sector 0. The converse is true for decrementing from sector 0.)

Figures 14A, 14B:
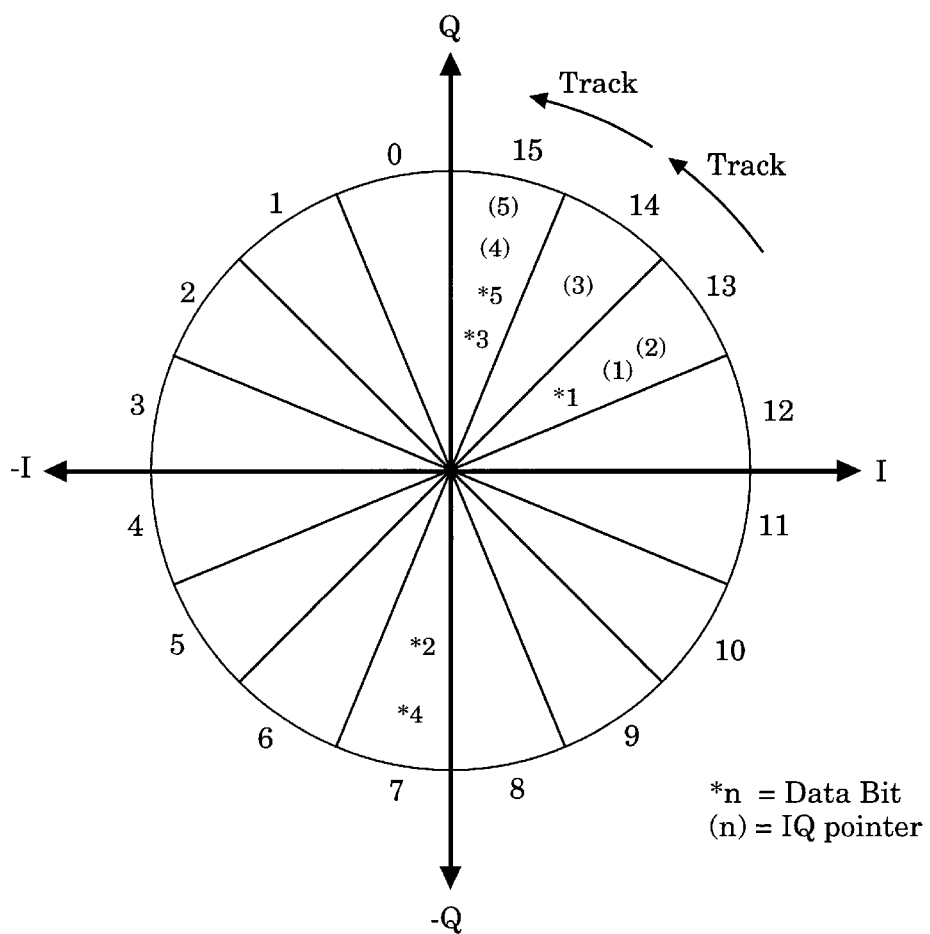
FIG. 14a illustrates an example of how the tracking mechanism adjusts the position of the IQ pointer in response to a data signal with a change in phase.
FIG. 14b lists the how the data bits on the IQ diagram of FIG. 14a affect the tracking mechanism.

An example of IQ pointer tracking is provided with reference to FIGS. 14a and 14b. FIG. 14a illustrates an IQ diagram with five consecutive data bits (*1 through *5) and the position of the IQ pointer ((1) through (5)) after each data bit is received. FIG. 14b lists how each data bit illustrated on the IQ diagram of FIG. 14a affects the tracking mechanism.

Referring to FIG. 14a, the first data bit *1 falls within the sector containing the IQ pointer and thus places the tracking mechanism into the aligned state 1310. Data bit *2 falls two sectors counter-clockwise from the sector 180° from the IQ pointer (an INC sector) and therefore moves the tracking mechanism into the ready to increment state 1320. Data bit *3 falls two sectors counter-clockwise from the sector with the IQ pointer (an INC sector) thereby causing the tracking mechanism to increment the IQ pointer (moving the IQ pointer to sector 14) and to move into the fast increment state 1330. Data bit *4 is one sector counter-clockwise from the sector 180° from the IQ pointer (an INC sector) and therefore the tracking mechanism again increments the IQ pointer, moving the IQ pointer to sector 15. Finally, data bit *5 falls within the sector of the IQ pointer and thus moves the tracking mechanism back into the aligned state 1310.

The IQ Pointer Jumping Mechanism

Varying impedances on a communication channel can also shift the phase of an incoming data signal by large amounts. To accommodate for large phase shifts, the preferred embodiment implements an IQ pointer "jump" mechanism that is similar to the IQ pointer tracking mechanism. The IQ pointer jump mechanism moves the IQ pointer by two sectors when certain conditions indicating a large phase change are detected. The jump mechanism is designed to reduce the occurrence of data inversions caused by large phase changes by keeping the IQ pointer aligned with the data signal during large phase changes.

Figure 15:
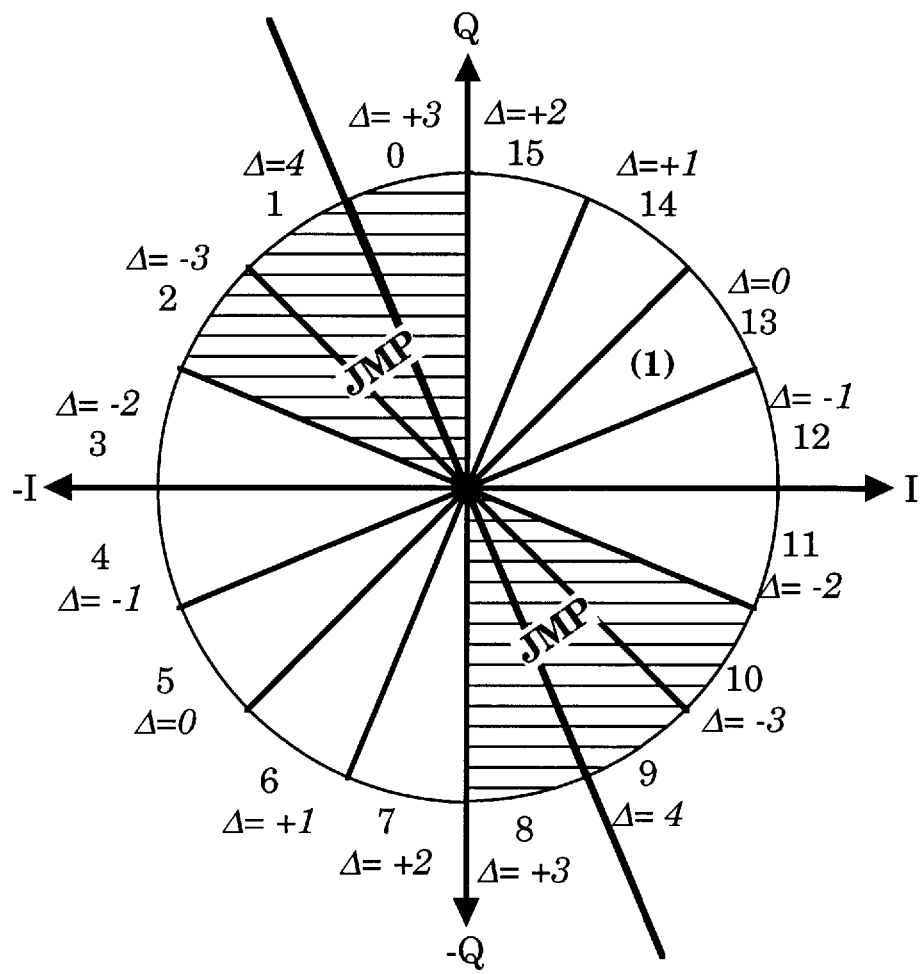
FIG. 15 illustrates the sectors far from the IQ pointer that trigger the jump mechanism.

The operation of the IQ pointer jump mechanism is explained with reference to FIGS. 15 through 16b. The jump mechanism detects if two consecutive data bits are both 3 or 4 sectors away from the location of the IQ pointer after the first data bit of the pair is received, or 180° from that location. FIG. 15 illustrates an IQ diagram with the IQ pointer (1) in sector 13. If two consecutive data bits both fall in the shaded sectors (JMP sectors), the jump mechanism moves the IQ pointer (2) by 2 sectors. For data bits *1 and *2, the shaded sectors are determined relative to the location of the IQ pointer (1).

The direction that the jump mechanism moves the IQ pointer is determined by the first data bit of the two consecutive data bits and is chosen to minimize the occurrence of data inversions caused by phase shifts of up to four sectors. If the first data bit was exactly 3 sectors away from the sector of the IQ pointer or the sector 180° from the IQ pointer, then the jump mechanism moves the IQ pointer by 2 sectors in the direction of the sector of the first data bit of the pair. If the first data bit was four sectors away from the IQ pointer, the jump mechanism moves the IQ pointer by 2 sectors in the direction that the IQ pointer last came from.

When the jump mechanism is activated and moves the IQ pointer, the move performed by the jump mechanism takes priority over the track mechanism such that the IQ pointer moves by two sectors instead of only one sector. When the jump mechanism is activated, the state of the track mechanism changes to the fast increment state 1330 if the IQ pointer was incremented by 2 sectors or the fast decrement state 1350 if the IQ pointer was decremented by 2 sectors.

Figures 16A, 16B:
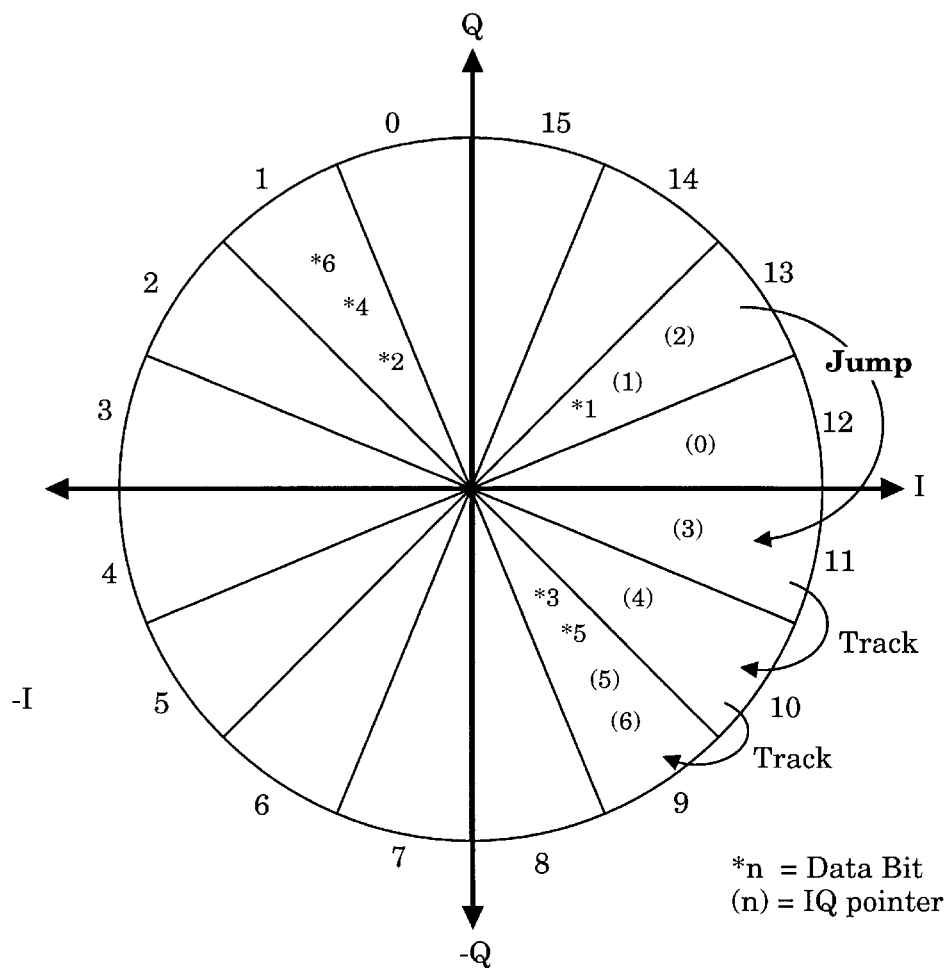
FIG. 16a illustrates an example of the jump mechanism adjusting the IQ pointer in response to a data signal with a large change in phase.
FIG. 16b lists the how the data bits on the IQ diagram of FIG. 16a affect the jump mechanism.

FIGS. 16a and 16b provide an example of the jump mechanism and the track mechanism in operation. FIG. 16a illustrates an IQ diagram with six consecutive data bits (*1 through *6) and the position of the IQ pointer bit ((1) through (6)) after each data bit is received. FIG. 16b lists how each data bit illustrated on the IQ diagram of FIG. 16a affects the IQ pointer. Initially, the IQ pointer (1) is located in sector 13.

A first IQ data bit *1 falls in the sector of the IQ pointer. The second data bit *2 falls in sector 1 which is four sectors away from the IQ pointer. The third data bit *3 is received in sector 9 which is also four sectors from the position of the IQ pointer after the first data bit of the pair (data bit *2) is received, thus the jump mechanism adjusts the IQ pointer.

Since data bit *2 (the first of the 2 consecutive data bits more than 3 sectors away from the IQ pointer) was 4 sectors away from the IQ pointer, the IQ pointer jumps two sectors in the direction of the last different IQ pointer location (before the last adjustment). The last different IQ pointer location (0) is sector 12 and the current IQ pointer location (2) is sector 13. Thus, the jump mechanism moves the IQ pointer two sectors clockwise to sector 11. The jump mechanism also places the tracking mechanism into the fast decrement state 1350 since the IQ pointer was decremented by 2 sectors. The next data bit, data bit *4, falls in sector 1 which is only two sectors from the sector 180° from the IQ pointer. Since the tracking mechanism is in the fast decrement state 1350, data bit *4 causes the IQ pointer to decrement one sector to sector 10. Data bit *5 again causes the IQ pointer to decrement one sector to sector 9. Data bit *6 falls within the sector 180° from the IQ pointer and thus the tracking mechanism returns to the aligned state 1310.

Decoding Data Using The IQ Pointer

To decode each incoming data bit, the preferred embodiment uses the current location of the IQ pointer and the last different location of the IQ pointer to bisect the IQ diagram into a data "1" half and a data "0" half. Specifically, the IQ diagram is bisected along a line perpendicular to the boundary between the sector of the IQ pointer and the adjacent sector in the direction of the last different IQ pointer location. All sectors on the same side of the bisected IQ diagram as the IQ pointer are designated as binary "1" sectors. Correspondingly, all sectors on the opposite side are designated as binary "0" sectors. The method of decoding data illustrated with reference to FIGS. 17a and 17b.

Figure 17B:
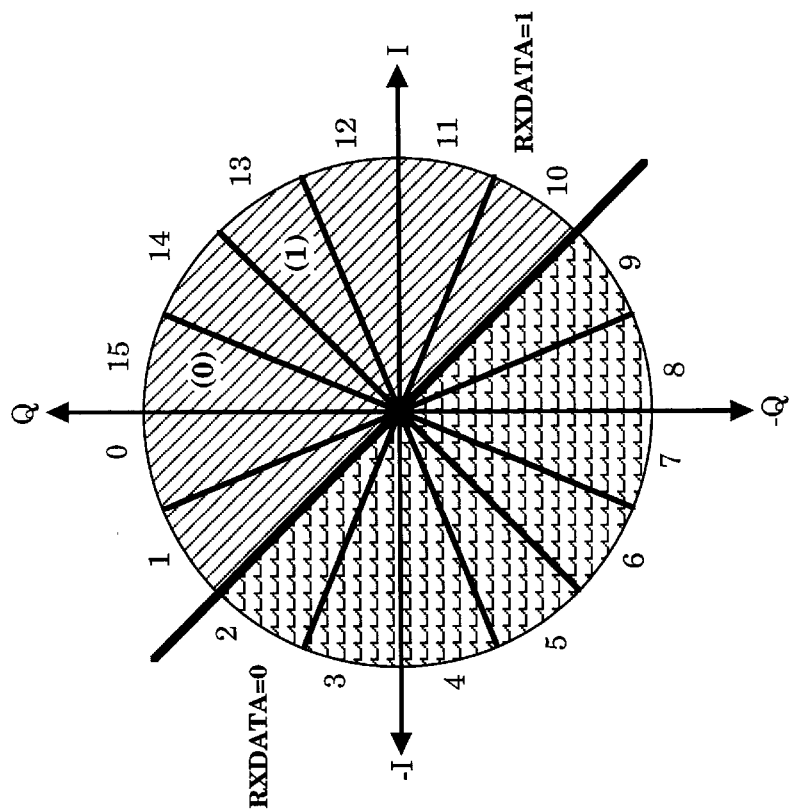
FIG. 17b illustrates a second example of how a data bit is decoded as a binary "0" or a "1" depending on the position of the IQ pointer.
Figure 17A:
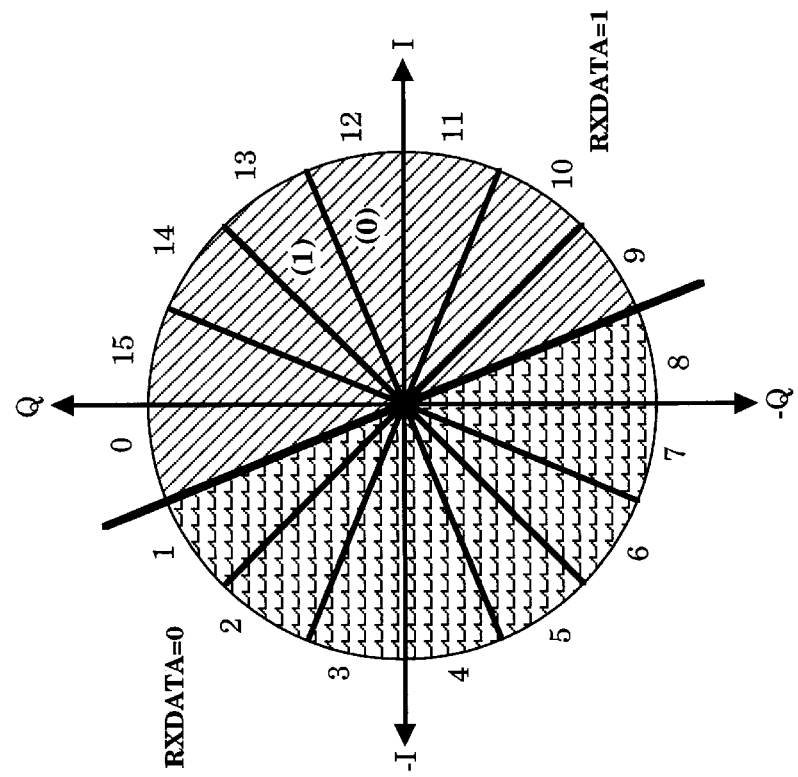
FIG. 17a illustrates a first example of how a data bit is decoded as a binary "0" or a "1" depending on the position of the IQ pointer.

Referring to FIG. 17a, the current IQ pointer (1) is in sector 13. The last different IQ pointer location (0) was sector 12. The IQ diagram is bisected using a line perpendicular to the boundary between sectors 13 and 12. Thus, in FIG. 17a, sectors 1–8 are defined as binary "0" sectors, and sectors 9–15 and sector 0 are defined as binary "1" sectors.

FIG. 17b illustrates a second example of how the IQ pointer is used to divide the IQ diagram to determine whether a data bit is a "1" or a "0". In example of FIG. 17b, the current IQ pointer (1) is in sector 13. The last different IQ pointer (0) location was sector 15. The IQ diagram is bisected using a line perpendicular to the boundary between sectors 13 and 14. In this manner, sectors 2–9 are defined as binary "0" sectors, and sectors 10–15 and 0–1 are defined as binary "1" sectors.

Resolving Boundary Cases Using The IQ Pointer

Figure 18:
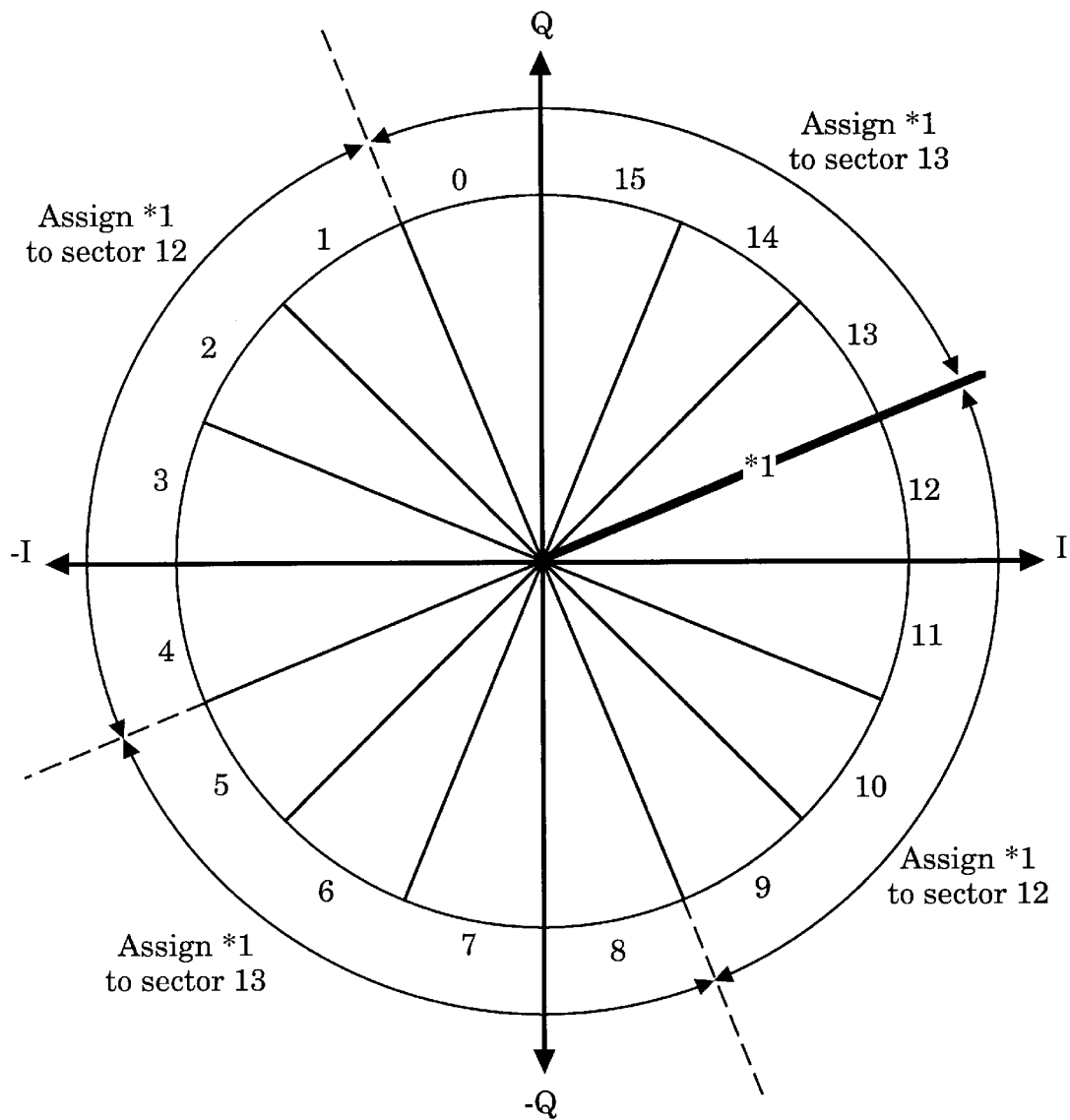
FIG. 18 illustrates how the IQ pointer is used to determine the sector of a data bit that falls on a boundary between sectors.

A data bit may fall exactly on the boundary between two different sectors. In such cases, the IQ pointer is used to determine which sector the data bit should be assigned to. FIG. 18 illustrates how the IQ pointer is used to assign a sector when a data bit falls on a boundary.

FIG. 18 illustrates a data bit *1 on the boundary between sectors 12 and 13. If the IQ pointer is within 4 sectors clockwise from the boundary or within 4 sectors clockwise of the border 180° from the sector boundary, then the data bit should be placed in the sector on the clockwise side. Otherwise, the data bit should be placed in the sector on the counter-clockwise side.

Data Word Error Check and Error Correction Overview

The preferred embodiment implements an error correction mechanism that is used to detect and correct errors in the data received on a noisy communication channel. The error correction mechanism in the receiver detects errors and corrects the errors by recognizing anomalies in the incoming BPSK data signal. In the preferred embodiment, the error correction mechanism corrects each word by using two different error correction subsystems. The first error correction subsystem, the Single Bit Error Correction mechanism, can correct a single bit error in each received word. The second correction subsystem, the Phase Correction mechanism, can correct a data inversion in each word.

The Single Bit Error Correction mechanism detects and corrects errors caused by noise on the transmission medium that inverts single data bits. The Single Bit Error Correction mechanism detects single bit errors using a parity bit on each word and corrects the single bit error by inverting the bit in the word most likely to be in error.

The Phase Correction mechanism detects and corrects data inversions. Data inversions can occur when the phase of a BPSK data signal is quickly shifted by the communication channel. In the preferred embodiment, the IQ pointer Jump and Track mechanisms may not be able to track large and rapid phase shifts. When the BPSK data signal rotates around the IQ diagram faster and further than the Jump and Track mechanisms can move the IQ pointer, then the Jump and Track mechanisms may eventually align the IQ pointer with the data such that the data becomes inverted. A Phase Correction mechanism checks each word to determine if a data inversion has occurred. To correct a data inversion, the Phase Correction mechanism determines the bit in the word most likely to be at the beginning of the data inversion and inverts all the bits from that bit onward (until the next data inversion is detected).

Single Bit Error Correction

Data Word Parity Check

As illustrated in FIG. 5, each word in the data packet of the preferred embodiment consists of 11 bits. The first 8 bits in a data word consist of a data byte to be transmitted. The next bit is an odd parity bit for the 11-bit word. The final two bits of each word are two additional coding bits that specify if the word is a data word or an End-of-Packet (EOP) word and are used to detect a data inversion in the word.

A receiver implemented according to the preferred embodiment checks the parity of every word received. If the parity bit indicates a parity error in the 11-bit word, the Single Bit Error Correction mechanism in the receiver attempts to correct the single bit error.

The Single Bit Error Correction mechanism operates by generating a value for each bit that indicates the quality of the incoming BPSK data signal during that bit. The bit received with the poorest signal quality is marked as the "weak" bit of the data word. When a parity error is detected, the bit having the poorest signal quality (the weak bit) is inverted.

Weak Bit Generation

To determine which bit in each word was received with the poorest signal quality, the preferred embodiment measures the magnitude of the received data signal, in the direction of the IQ pointer, for every bit in each word. Properly received I and Q data bits should be closely aligned with the IQ pointer and thus have a large magnitude in the direction of the IQ pointer.

In order to measure the magnitude of the recovered data signal effectively, the preferred embodiment uses a method that combines the I data sample and Q data sample to generate an approximate magnitude value in the direction of the IQ pointer.

Figure 19:
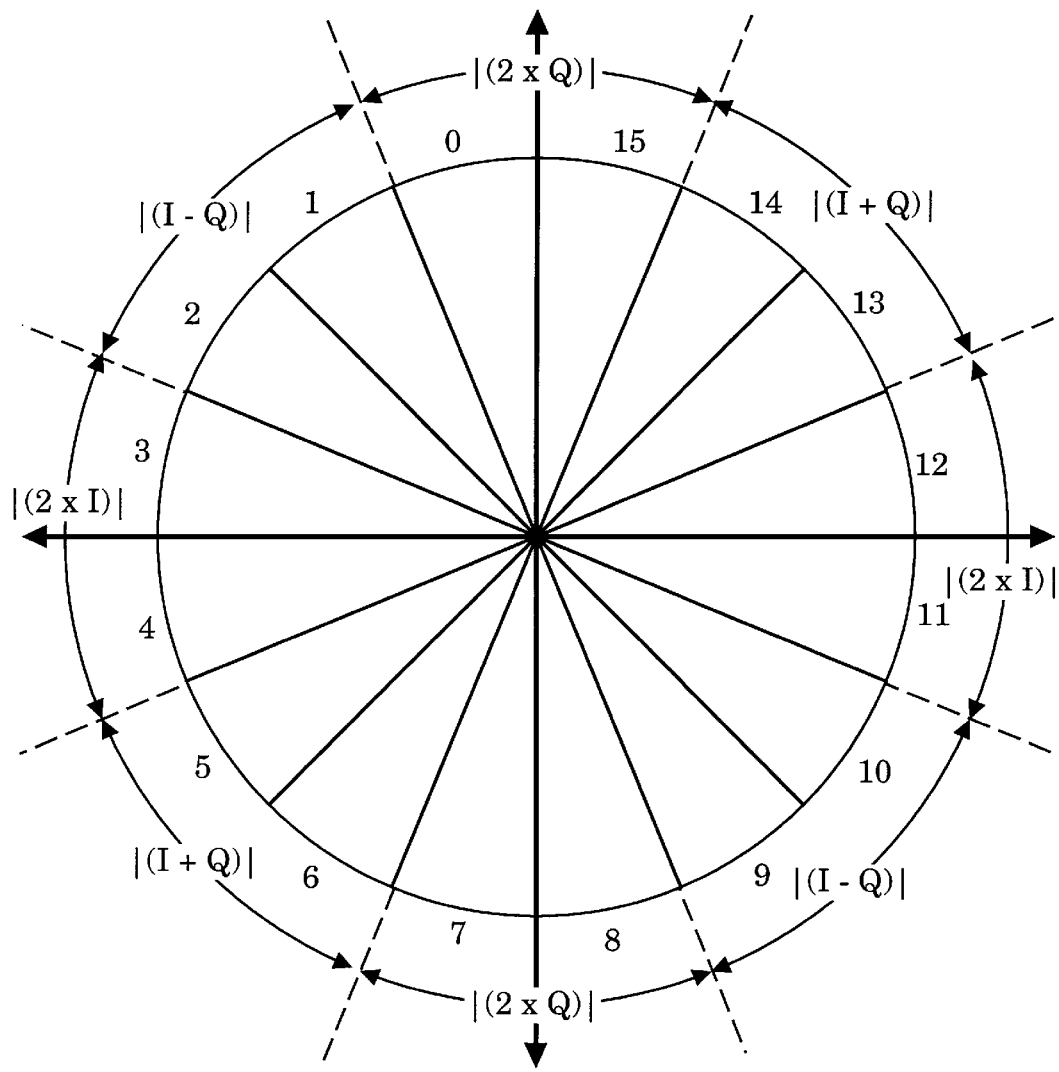
FIG. 19 illustrates how an approximate magnitude of a data bit in the direction of the IQ pointer is generated depending on the current sector location of the IQ pointer.

FIG. 19 illustrates an IQ diagram that describes how the preferred embodiment combines the I and Q data samples to generate an approximate magnitude in the direction of the IQ data pointer (IQMAG). As illustrated in FIG. 19, the I and Q data samples are combined in different ways depending on the sector location of the IQ pointer, as marked on the outside of the IQ diagram.

Figure 20:
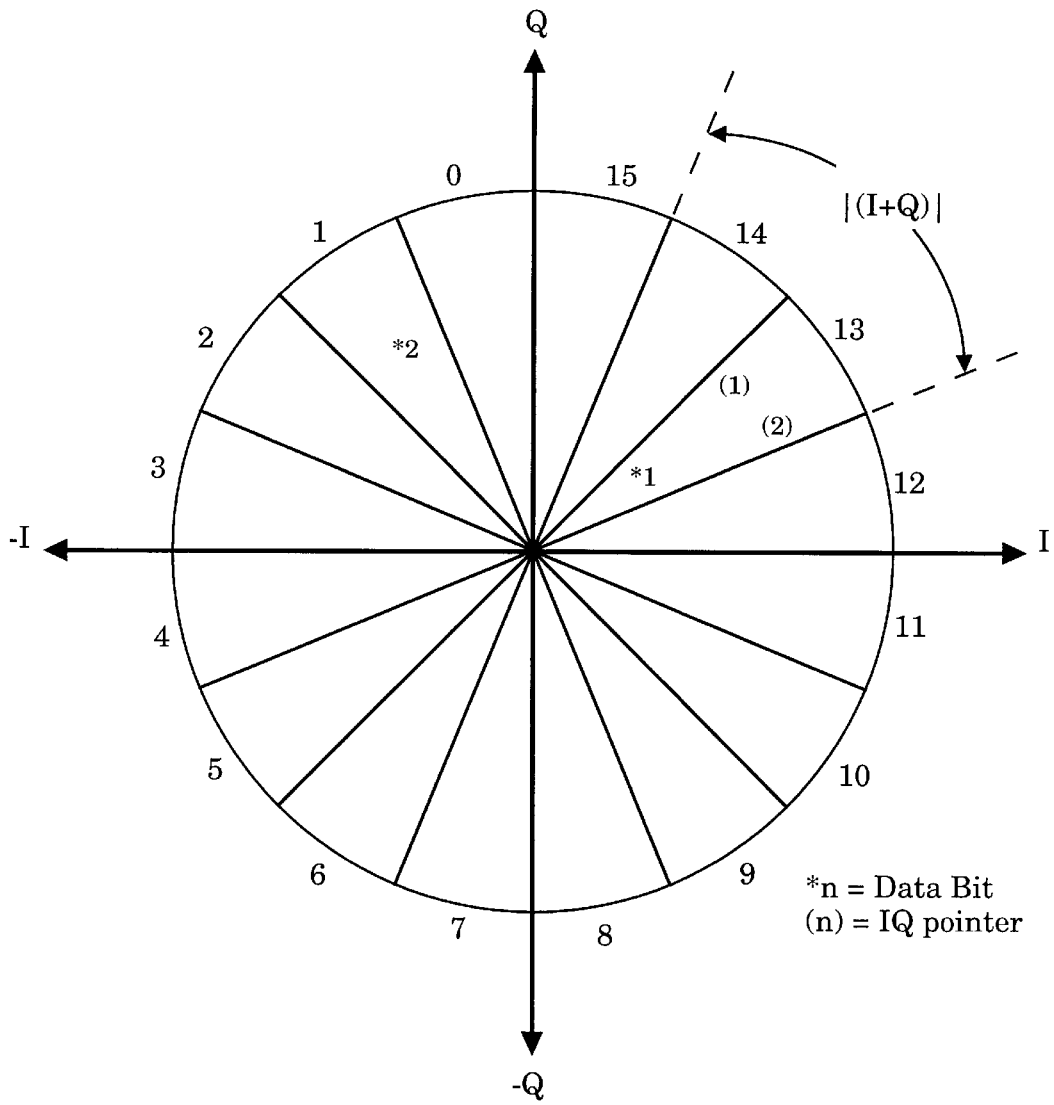
FIG. 20 illustrates two examples of calculating the approximate magnitude of the data bit in the direction of the IQ pointer.

FIG. 20 illustrates two examples of generating the approximate signal magnitude in the direction of the IQ pointer (IQMAG) for two data bits. For data bit *1, I=+30 and Q=+20. Since the IQ pointer for data bit *1 is in sector 13, IQMAG[*1]=I+Q. Therefore, calculating the approximate signal magnitude for data bit *1, IQMAG[*1]=I+Q= 30+20=50. For data bit *2, I=−70 and Q=+80. Since the IQ pointer for data bit *2 is also in sector 13, IQMAG[*2]=I+ Q=−70+80=10. Since data bit *2 has the smaller signal magnitude in the direction of the IQ pointer, data bit *2 is the bit that is more likely to be in error.

For each word, the bit with the smallest magnitude value in the direction of the IQ pointer is normally selected as the "weak" bit of the word. However, there is one case where a different bit will be selected as the weak bit. In the receiver of the preferred embodiment, there is a two-level automatic gain control (AGC) unit. If the AGC unit switches between levels while a word is being received, the process of changing the gain introduces a transient that is likely to cause a data decode error. Therefore, if the AGC unit switches between levels during a word, the bit received when the AGC unit switches is selected as the weak bit, instead of the bit with the smallest signal magnitude in the direction of the IQ pointer.

Single Bit Error Correction

Referring back to FIG. 5, each word in the preferred embodiment includes a parity bit for error correction. Normally, a single parity bit for a word can be used only for error detection and not for error correction. The preferred embodiment uses the quality of the incoming data signal to determine which bit in a word was most likely corrupted and thus implements error correction with a single parity coding bit.

When a parity error in a word occurs, the Single Bit Error Correction mechanism attempts to correct the word by inverting the weak bit of the word (wherein the weak bit is determined as explained above). After inverting the weak bit, the receiver tests the word to determine if the word is a valid data word or an End-of-Packet (EOP) word. If, after single bit error correction, the word does not appear to be a valid data word 520 or an End-of-Packet (EOP) word 530, then the Phase Correction mechanism attempts to correct the word.

Phase Correction Mechanism

Phase Hits

Certain electrical devices on a power distribution line cause large amounts of phase modulation that shift the phase of a BPSK data signal. The IQ pointer tracking mechanism and jump mechanism handle most phase changes. However, some electrical devices, such as television sets, can quickly shift the phase of the data signal more than 90 degrees. A quick phase shift that is greater than 90 degrees often causes the data to be decoded inverted (prior to error correction). To correct for such data inversions, the receiver contains a phase correction mechanism that attempts to correct errors in words that could not be corrected using the Single Bit Error Correction mechanism alone.

In this document, a "phase change" is defined as a data bit that does not fall within the sector containing the IQ pointer or the sector that is 180° from the IQ pointer. The size of each phase change is determined by how many sectors a data bit is away from the proper sector. (A phase change for a data "1" bit is defined as the number of sectors away from the sector containing the IQ pointer and a phase change for a data "0" bit is defined as the number of sectors the data bit is away from the sector 180° from the IQ pointer.)

A "phase hit" is defined in this document as a phase shift of the data signal that causes a phase change for two consecutive data bits. Each phase hit is labeled as a pair of phase changes for the two consecutive data bits. The phase changes for the two data bits in a phase hit are measured relative to the IQ pointer location after receiving the first data bit of the pair. For example, if a first data bit falls in a sector that is two sectors counter-clockwise from the IQ pointer location after receiving that bit and a second data bit falls in a sector that is three sectors counter-clockwise from the IQ pointer's position after receiving the first data bit, then a (+2, +3) phase hit has occurred. FIGS. 21a through 25b illustrate several examples of phase hits.

Figures 21A, 21B:
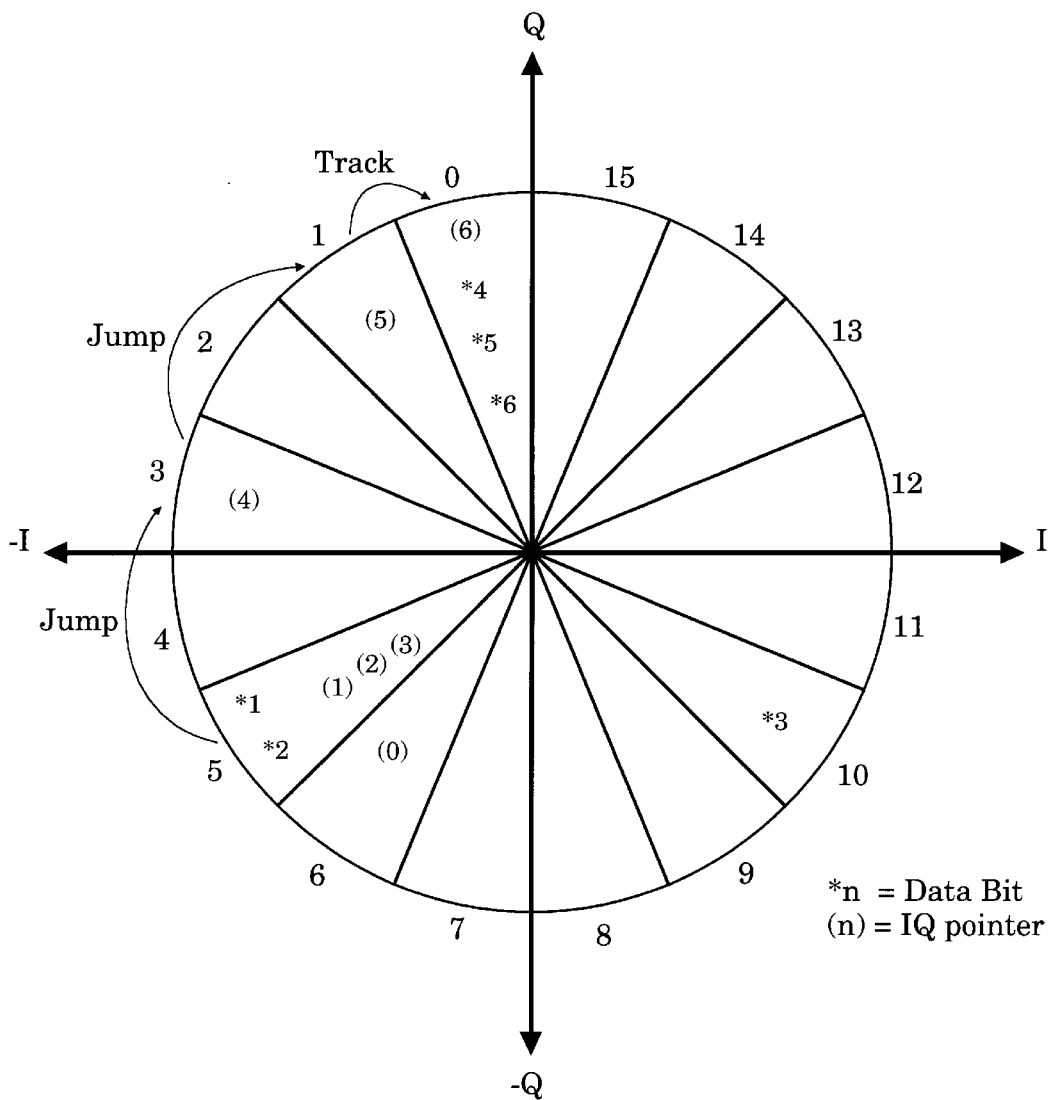

FIG. 21a illustrates a (−3, −5) phase hit on an IQ diagram. FIG. 21b lists how the IQ pointer is adjusted and how the data is decoded (prior to error correction) for the (−3, −5) phase hit of FIG. 21a. The first two data bits (*1 and *2) fall within the sector of the IQ pointer. The next data bit (*3) is a "0" data bit that is 3 sectors clockwise from the sector 180° from the IQ pointer. The fourth data bit (*4) is a "1" data bit that is 5 sectors clockwise from the sector containing the IQ data pointer (3) after receiving the third data bit (the first data bit of the pair). Since the third and fourth data bits (*3 and *4) are two consecutive phase changes, a phase hit has occurred in the data signal. Note that in this example the jump and track mechanisms correctly adjust the IQ pointer such that the IQ pointer is realigned with the incoming "1" data bits thereby causing no data inversion.

The Basic Phase Correction Mechanism

Similar to the Single Bit Error Correction mechanism, the Phase Correction mechanism detects and corrects errors in the received data by performing three steps. The Phase Correction mechanism performs the following three steps to detect and correct data inversions caused by phase shifts:

1) Monitor the phase changes for the incoming data signal and record the location in each 11-bit word where the beginning of a data inversion most likely occurred.

2) Detect if a data inversion actually occurred during the word.

3) Correct for the data inversion by inverting all subsequent decoded bits starting at the location in the word where the data inversion most likely began as determined in step 1.

Recording The Likeliest Location Of A Data Inversion

To determine the likeliest location of a data inversion, a "phase weight" is assigned to each received data bit. The phase weight is a multi-bit value that indicates the relative likelihood that a phase hit caused a data inversion beginning with that data bit.

The tracking and jump mechanisms properly handle most phase hits by eventually aligning the IQ pointer properly with the incoming data bits. Other phase hits occur too quickly and are too large such that the IQ pointer aligns 180° out-of-phase and the incoming data is decoded (prior to error correction) inverted. The character of the phase hit, however, does not indicate whether or not the data will be inverted, as illustrated by the following set of phase hit examples. The two coding bits at the end each word are used to determine if an inversion occurred.

Ambiguous Hint Case

Figures 22A, 22B:
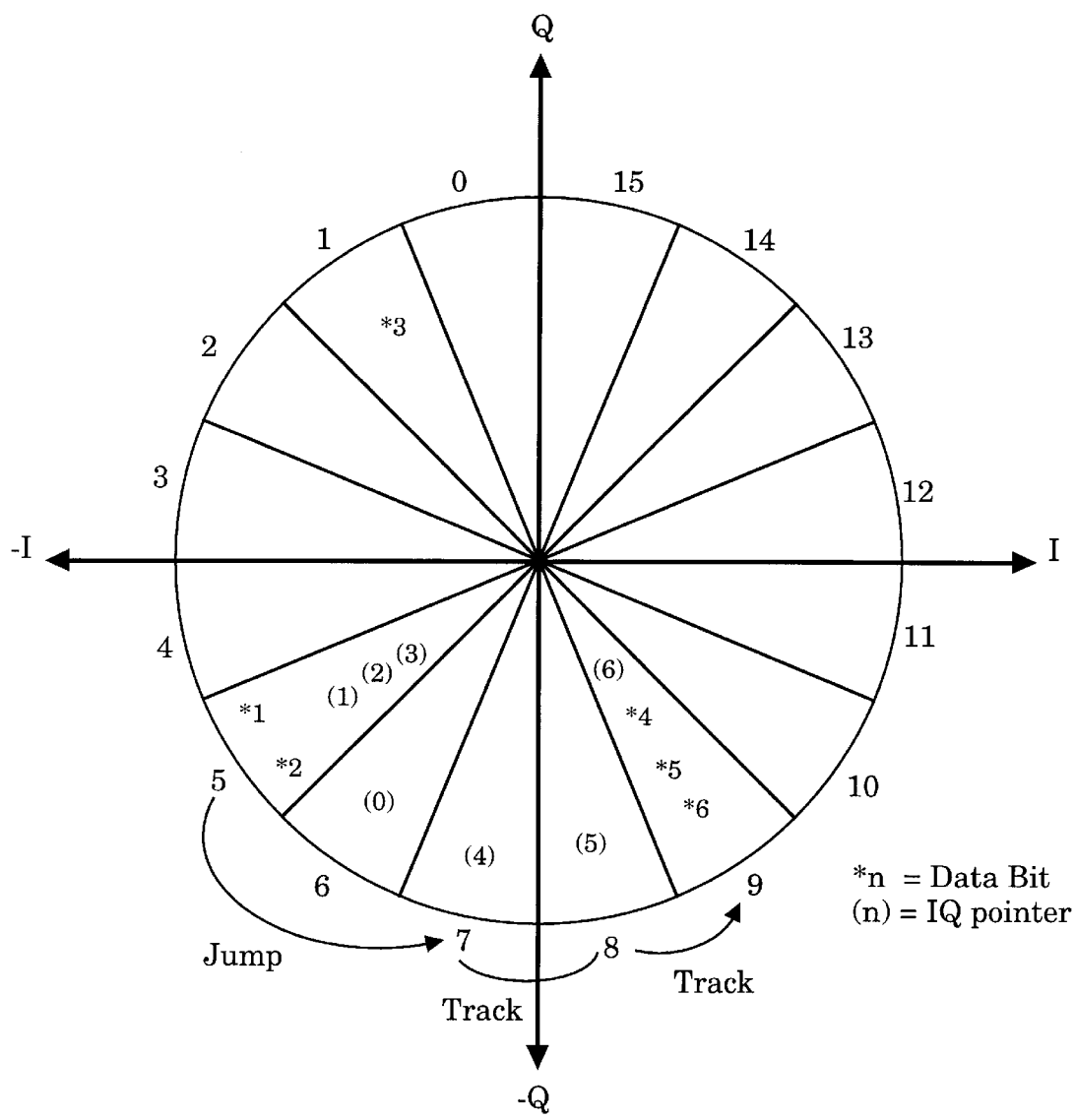

FIG. 22a illustrates a (+4, +4) phase hit on an IQ diagram. FIG. 22b lists how the IQ pointer is adjusted and how the data is decoded for the (+4, +4) phase hit of FIG. 22a. The first two data bits (*1 and *2) fall in the sector containing the IQ pointer. The next data bit (*3) is a "0" data bit that is +4 sectors away from the sector 180° from the IQ pointer (3). The fourth data bit (*4) is a "1" data bit that is +4 sectors away from the sector of the IQ pointer (3). Since the third and fourth data bits (*3 and *4) are two consecutive phase changes, a phase hit has occurred in the data signal. As in the previous example, the jump and track mechanisms correctly adjust the IQ pointer to align it with the incoming "1" data bits such that no data inversion occurs.

Figures 23A, 23B:
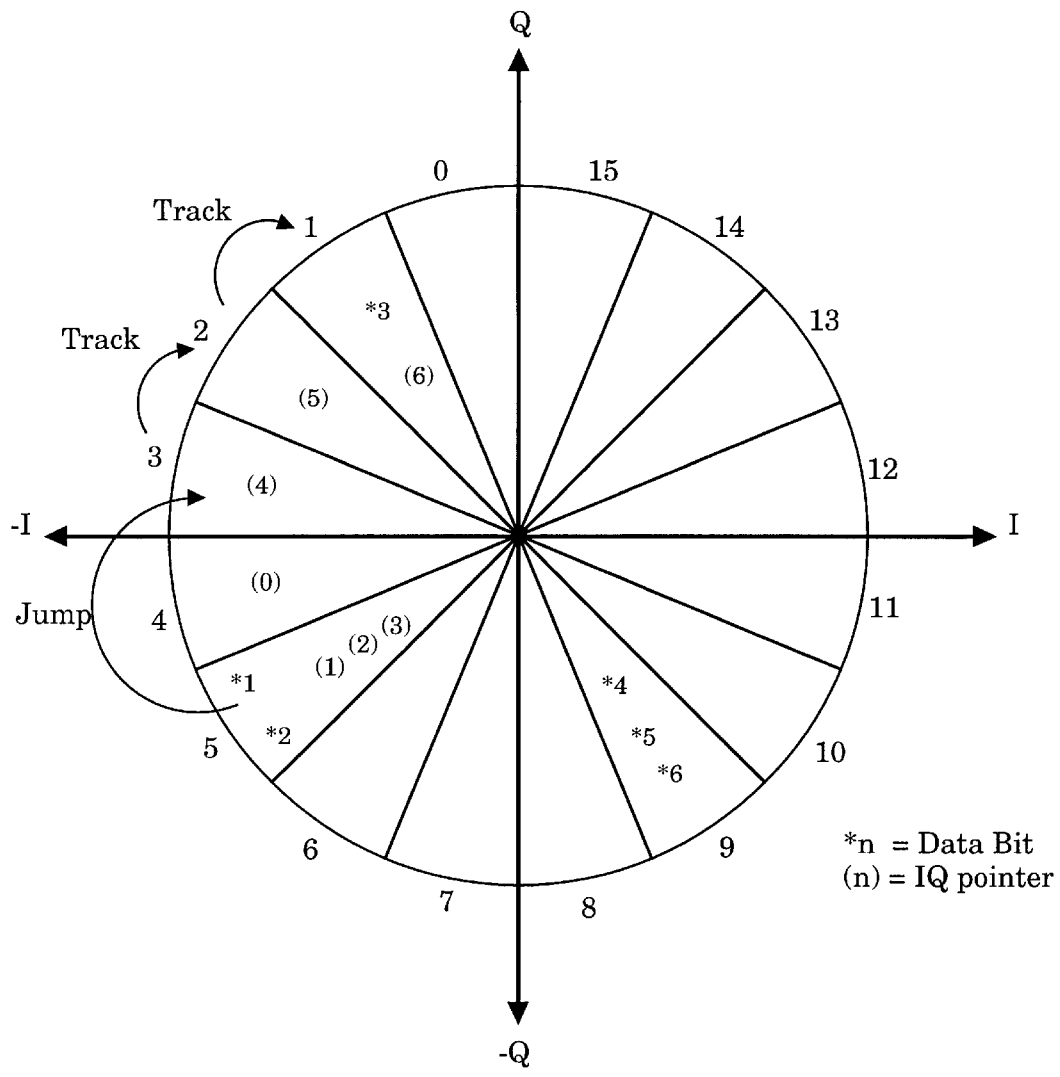

FIG. 23a also illustrates a (+4, +4) phase hit on an IQ diagram using the same data bits as FIG. 22a. However, in the (+4, +4) phase hit of FIG. 23a, the data becomes inverted, since the history of the IQ pointer differs from the example of FIG. 22a. FIG. 23b lists how the IQ pointer is adjusted and how the data is decoded (prior to error correction) for the (+4, +4) phase hit of FIG. 23a. As in the previous example, the first two data bits (*1 and *2) fall in the sector containing the IQ pointer. The next data bit (*3) is a "0" data bit that is +4 sectors away from the sector 180° from the IQ pointer (3). The fourth data bit (*4) is a "1" data bit that is +4 sectors away from the sector of the IQ data pointer (3). Since the third and fourth data bits (*3 and *4) are two consecutive phase changes, a phase hit has occurred in the data signal. These two consecutive phase changes also activate the jump mechanism. Since the third data bit (*3) was four sectors away, the jump mechanism moves the IQ pointer two sectors in the direction of the last different IQ pointer location. In this case, the last different IQ pointer location is in the direction opposite to the (+4, +4) phase hit. Thus, the jump mechanism adjusts the IQ pointer in the direction opposite to the phase hit such that the IQ pointer becomes aligned with the "0" data bits. Since the IQ pointer becomes aligned with the "0" data bits, all the subsequent data bits are decoded (prior to error correction) inverted. Thus, as illustrated in FIGS. 22a through 23b, a (+4, +4) phase hit may or may not cause a data inversion (prior to error correction).

Figures 24A, 24B:
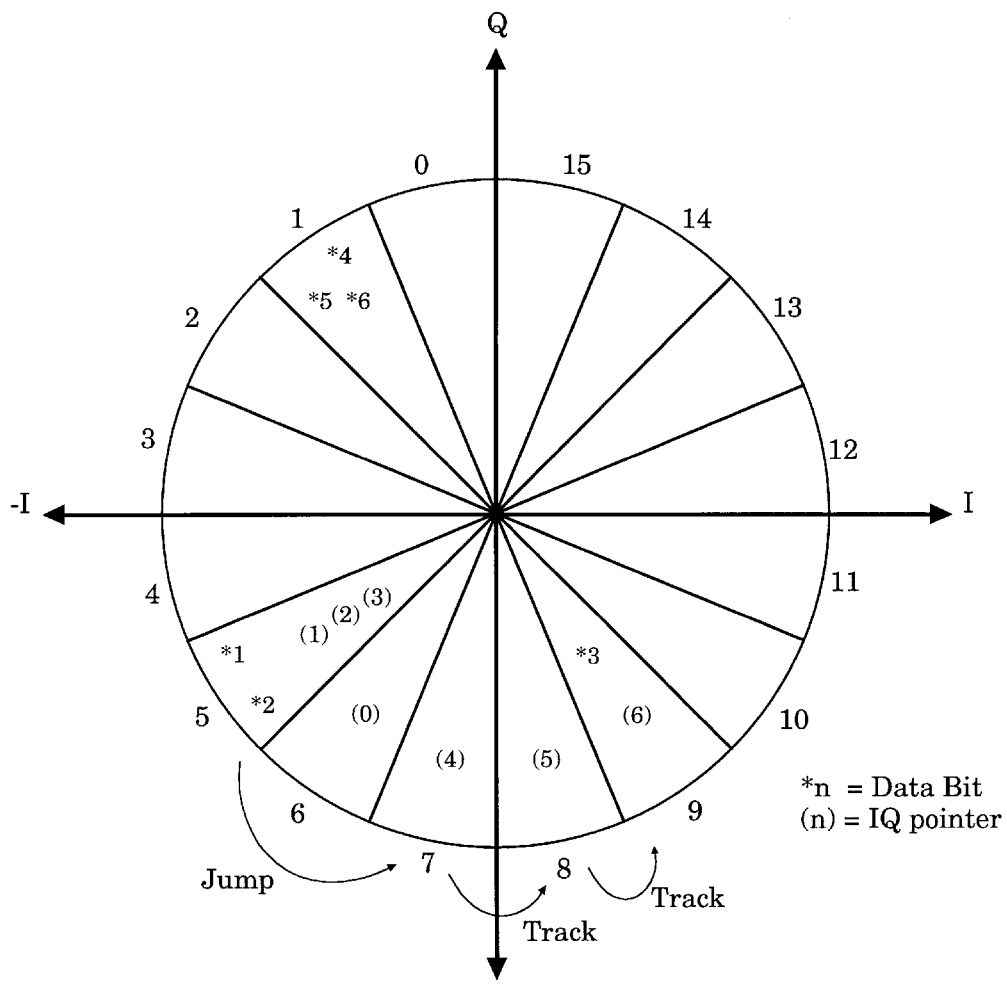

FIG. 24a illustrates a (−4, −4) phase hit on an IQ diagram. FIG. 24b lists how the IQ pointer is adjusted and how the data is decoded (prior to error correction) for the (−4, −4) phase hit of FIG. 24a. The first two data bits (*1 and *2) fall in the sector containing the IQ pointer. The next data bit (*3) is a "0" data bit that is −4 sectors away from the sector 180° from the IQ pointer (3). The fourth data bit (*4) is a "1" data bit that is −4 sectors away from the sector containing the IQ pointer (3). Since the third and fourth data bits (*3 and *4) are two consecutive phase changes, a phase hit has occurred in the data signal. Since the first data bit of the pair was a phase change of 4 sectors, the jump mechanism moves the IQ pointer in the direction of the last different IQ pointer location. Again, in this case, the jump mechanism rotates the IQ pointer in the direction opposite to the direction of the (−4, −4) phase hit such that the data becomes inverted starting at data bit *3. However, if the last different IQ pointer location were in the same direction as the (−4, −4) phase hit, no data inversion would have occurred.

Since the receiver does not know if an incoming data bit is a "1" or "0", it cannot distinguish a +4 phase change from a −4 phase change. Since the receiver does not know the direction of a (4,4) phase change, the jump mechanism does not always move the IQ pointer in the direction which avoids a data inversion. Since a (4, 4) phase hit may or may not cause a data inversion, the phase correction mechanism must use additional information to determine if a data inversion has occurred.

Delayed Inversion Case

Figures 25A, 25B:
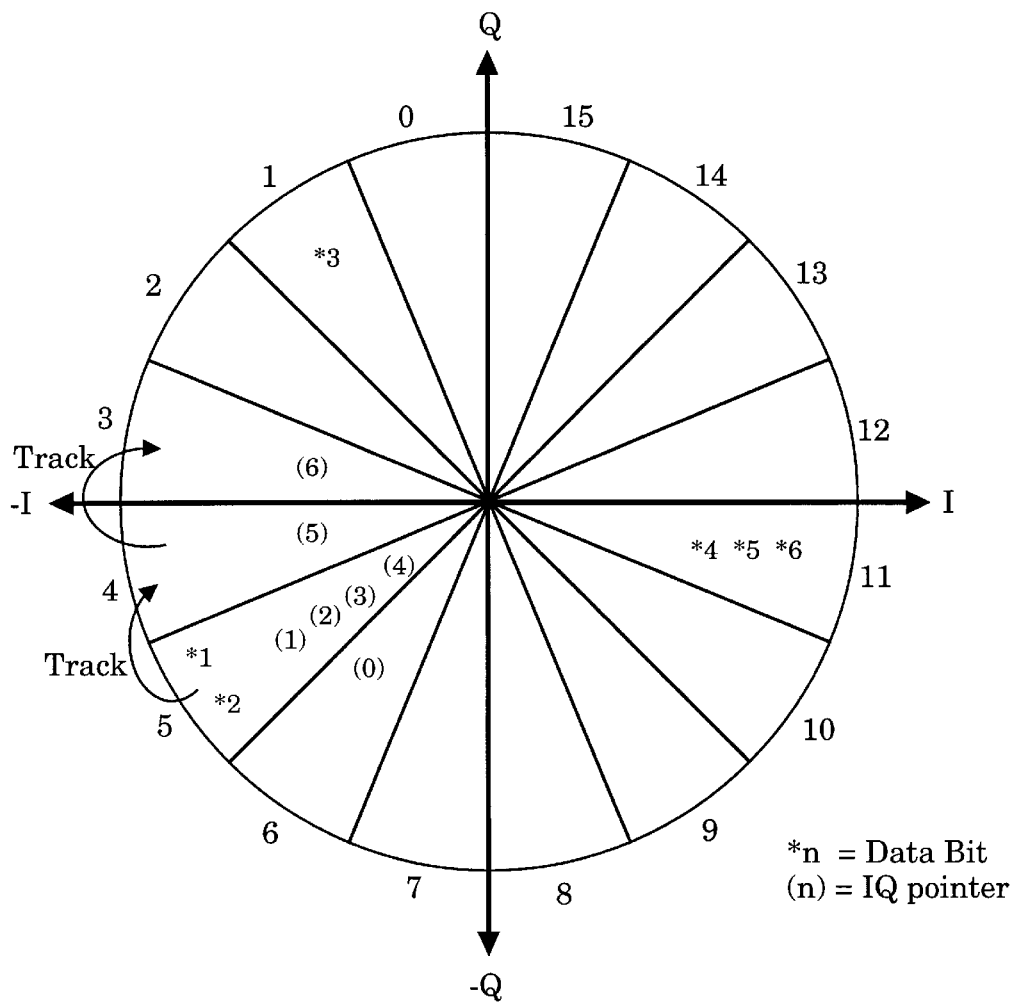

When a phase hit does cause a data inversion, the data inversion does not always start at the first data bit of the pair of data bits that define the phase hit. FIG. 25a illustrates a (+4, +6) phase hit that causes a data inversion starting with the second bit of the phase hit.

FIG. 25a illustrates a (+4, +6) phase hit on an IQ diagram. FIG. 25b lists how the IQ pointer is adjusted and how the data is decoded (prior to error correction) for the (+4, +6) phase hit of FIG. 25a. Referring to FIG. 25a, the first two data bits (*1 and *2) fall in the sector containing the IQ pointer. The next data bit (*3) is a "0" data bit that is +4 sectors away from the sector 180° from the IQ pointer. The fourth data bit (*4) is a "1" data bit that is +6 sectors away from the sector of the IQ data pointer (3). Since the third and fourth data bits (*3 and *4) are two consecutive phase changes, a phase hit has occurred in the data signal. The fifth data bit (*5) is also a "1" data bit that is +6 sectors away from the sector of the IQ pointer (4). The tracking mechanism increments the IQ pointer since both data bit *4 and data bit *5 fall within decrement sectors. In this case the tracking mechanism rotates the IQ pointer in the direction such that the IQ pointer eventually aligns with the "0" data bits. However, when data bit *3 was decoded, it was correctly decoded as a data "0". Therefore the data stream does not become inverted until data bit *4 even though the phase hit started during data bit *3. The method used to apply inversion correction beginning with the proper (in this case second) bit of the phase hit will be described below.

The Phase Weight Table

To best handle the many different phase hits that can cause a data inversion, all permutations of pairs of phase changes were examined and a corresponding phase weight value was assigned to each possible phase hit. Each phase weight value is a multi-bit value that indicates the relative likelihood that a particular phase hit causes a data inversion. The phase weight value is assigned to either the first or second bit of the phase hit, as described later. When the phase correction mechanism determines that a data inversion has occurred in a word, the phase correction mechanism inverts all bits beginning with the bit having the greatest phase weight value.

FIG. 26 illustrates a table that lists the phase weight value that is assigned for each phase hit. The table of FIG. 26 only applies to the situation where the bit prior to the phase hit coincides with the sector of the IQ pointer such that the IQ pointer does not move upon receiving the first bit of the phase hit pair. Cases where the IQ pointer moves in response to the first bit of a phase hit will be discussed below.

The first column of FIG. 26 lists all the possible phase hits that can cause data inversions. All other phase hits that do not cause data inversions have been omitted from the table of FIG. 26.

Since the receiver does not know whether it is receiving a data bit "1" or "0", the receiver cannot distinguish a small phase shift from a large phase shift. For example, the receiver cannot distinguish between a phase shift that moves a binary "1" data bit five sectors from the IQ pointer and a phase shift that moves a binary "0" data bit three sectors from the sector 180° from the IQ pointer. Thus, the second column lists the phase hits that can cause data inversions as they are measured by the receiver.

The third column of FIG. 26 contains the assigned phase weight for each phase hit. The phase weight is a value between 0 and 7. A phase weight of 0 indicates no data inversion could have occurred. Phase weights from 1 to 7 indicate a relative likelihood of a phase hit causing a data inversion, where 1 is the lowest likelihood and 7 is the highest.

The fourth column in FIG. 26 indicates how the phase hit affects the decoded data (prior to error correction). A "−−" indicates that the data inversion begins at the first data bit of the pair. A "+−" indicates that the data inversion begins at the second data bit of the pair. A "++" indicates that no data inversion occurs. (An example of no data inversion was provided in FIGS. 22a and 22b.)

As illustrated in the table of FIG. 26, most phase hits cause a data inversion starting with the first bit. However, there are 2 circled entries in the table of FIG. 26 where the data inversion starts at the second bit of phase hit. Specifically, in some cases a (+4, +6), (−4, −6), (+4, +7), or (−4, −7) phase hit does not cause data inversion until the second bit of the phase hit. For the (+4, +6), (−4, −6), (+4, +7) and (−4, −7) phase hits, whether a data inversion begins on the first bit or the second bit depends on the direction of the phase change relative to the last different IQ pointer. To identify such cases, the preferred embodiment determines the direction of the phase change according to the second data bit. If the second data bit is measured as a phase change in the direction of the last different IQ pointer, the phase change is labeled with an appended "P". Otherwise, if the second data bit is measured as a phase change in the direction opposite from the last different IQ pointer location, the phase change is labeled with an appended "N".

For the (+4, +6), (−4, −6), (+4, +7) and (−4, −7) phase hits, the data inversion starts at the second bit if the second data bit is measured as a phase change in the direction opposite from the last different IQ pointer location. For example, in FIG. 25a, the phase hit comprised of data bits *3 and *4 is measured as a (4, 2N) phase hit. For phase hits measured as (4, 2N) or (4, 1N), the data inversion begins on the second bit; for phase hits measured as (4, 2P) or (4, 1P), the data inversion begins on the first bit.

To correct a data inversion that starts at the second data bit of a pair, a zero phase weight value is assigned to the first bit of the pair to prevent the data from being inverted starting at the first bit. The phase weight for the (4, 2N) or (4, 1N) phase hit is instead assigned to the second data bit of the pair. If the next two consecutive bits generate a greater phase weight then the phase weight of the (4, 2N) or (4, 1N) phase hit, then that greater phase weight replaces the phase weight of the (4, 2N) or (4, 1N) phase hit. In this manner, if a data inversion is detected, the data will be inverted starting at the second data bit of the pair instead of the first data bit.

As previously mentioned, the table listed in FIG. 26 only applies to the case in which the IQ pointer location does not change sector location in response to the first data bit of the pair comprising the phase hit. This occurs if the data bit prior to the first data bit of the phase hit pair coincides with the sector of the IQ pointer or the sector 180° from the pointer.

However, it is possible that when the sector location is assigned for the first data bit of the pair comprising a phase hit, the IQ pointer will move in response to the first data bit according to the Track or Jump mechanism. In this situation, the phase hit will be measured differently.

Figure 27:
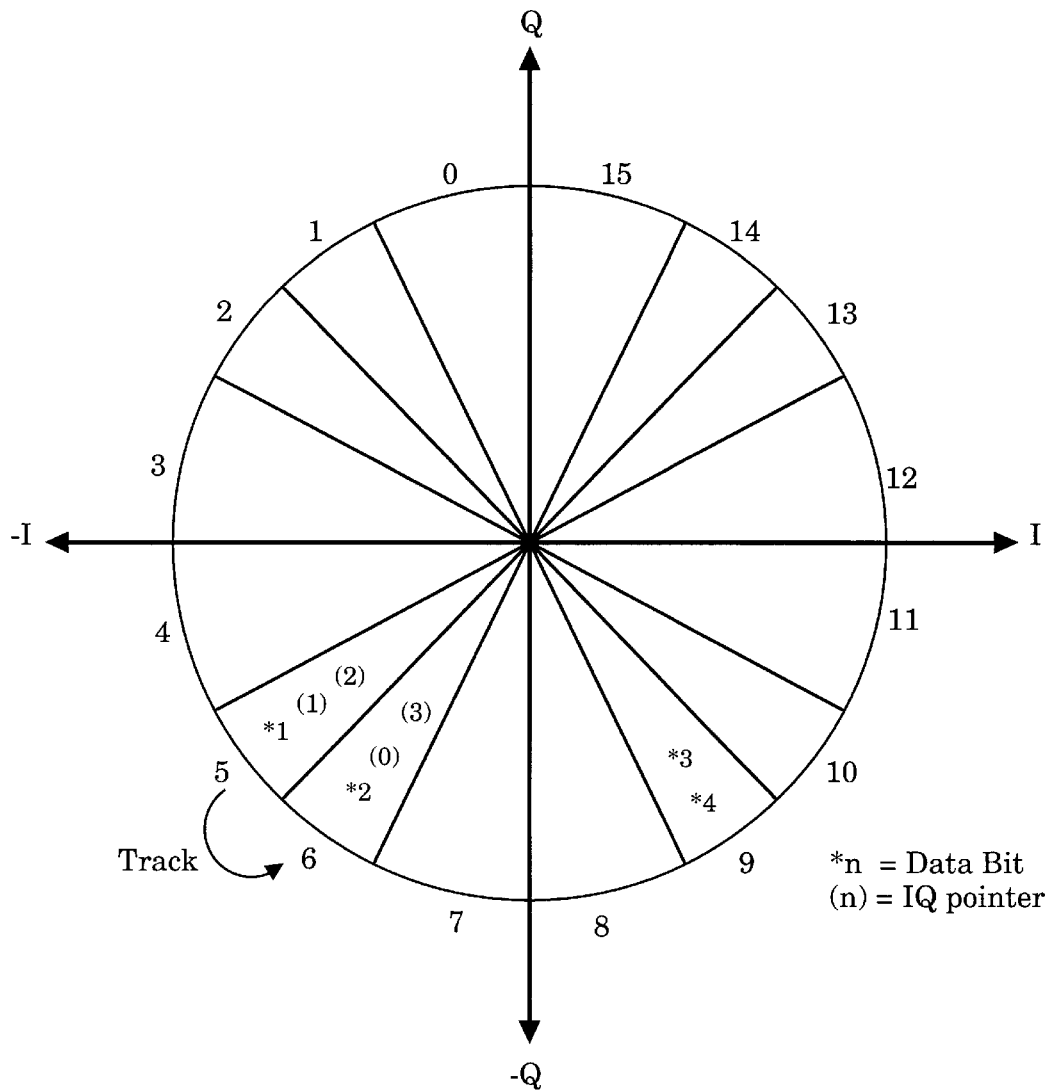
FIG. 27 illustrates an example of a (4, 4) phase hit that is measured as a (+3, +3) phase hit.

FIG. 27 illustrates an example of this effect. Referring to FIG. 27, the IQ pointer is aligned with the first data bit *1 in sector 5 and the last different IQ pointer location was sector 6 (the "INC" side). In FIG. 27 data bit *2 is received in sector 6. Since data bit *2 is in an increment (INC) sector, the tracking mechanism moves to the ready to increment state. The third data bit, data bit *3, is received in sector 9. Since sector 9 is an increment (INC) sector, the tracking mechanism enters the fast increment state and increments the IQ pointer location.

The fourth data bit, data bit *4, is also received in sector 9. Relative to the IQ pointer location before the third data bit, the phase hit comprised of data bits *3 and *4 is defined as a (4, 4) phase hit. However, in this case the phase hit is not measured as a (4, 4) phase hit since the IQ pointer moved in response to data bit *3. The IQ pointer moves to sector 6 when bit 3 is received, such that the phase hit is measured relative to the IQ pointer location of sector 6. Thus, the phase hit is measured as a (+3, +3) phase hit.

FIG. 28 illustrates how phase hits are measured differently for the situation where: a) the last different IQ pointer location is on the INC side and b) the data bit prior to the first data bit of the phase hit pair was on the INC side of the IQ pointer. The phase weights are assigned according to how the phase hit is measured, using the same assignments as in FIG. 26.

In the table of FIG. 28, there are seven cases in which the phase hit is assigned a phase weight of 0 wherein the phase hit is not detected. The (+4, +6) phase hit is measured as a (+3, −3) phase hit and is assigned a phase weight of 0. This is of no consequence since in this case the (+4, +6) phase hit does not cause a data inversion.

The (+4, +7) phase hit, measured as a (+3, −2) phase hit, is assigned a phase weight of 0. The (+4, +7) phase hit causes a data inversion that starts at the second data bit of the phase hit pair, in this case. Upon receiving the data bit following the second data bit, another phase hit will be detected. Thus, the data inversion will be properly corrected in accordance with the next pair of data bits.

The (−4, −7), (−5, −7), (−6, −7), (−7, −6), and (−7, −7) phase hits are measured as (+3, 0), (+2, 0), (+1, 0), (0, +1), and (0, 0), respectively. These cases appear the same as small phase changes in the opposite direction so a phase weight value of 0 is assigned. Thus, in these cases, the phase hit and corresponding data inversion are not detected. These are phase hits that span greater than seven sectors, which is a minimum of 153.4°. The preferred embodiment accurately detects and corrects data inversions caused by phase shifts that shift the phase by up to 153.4°.

Figures 29A, 29B:
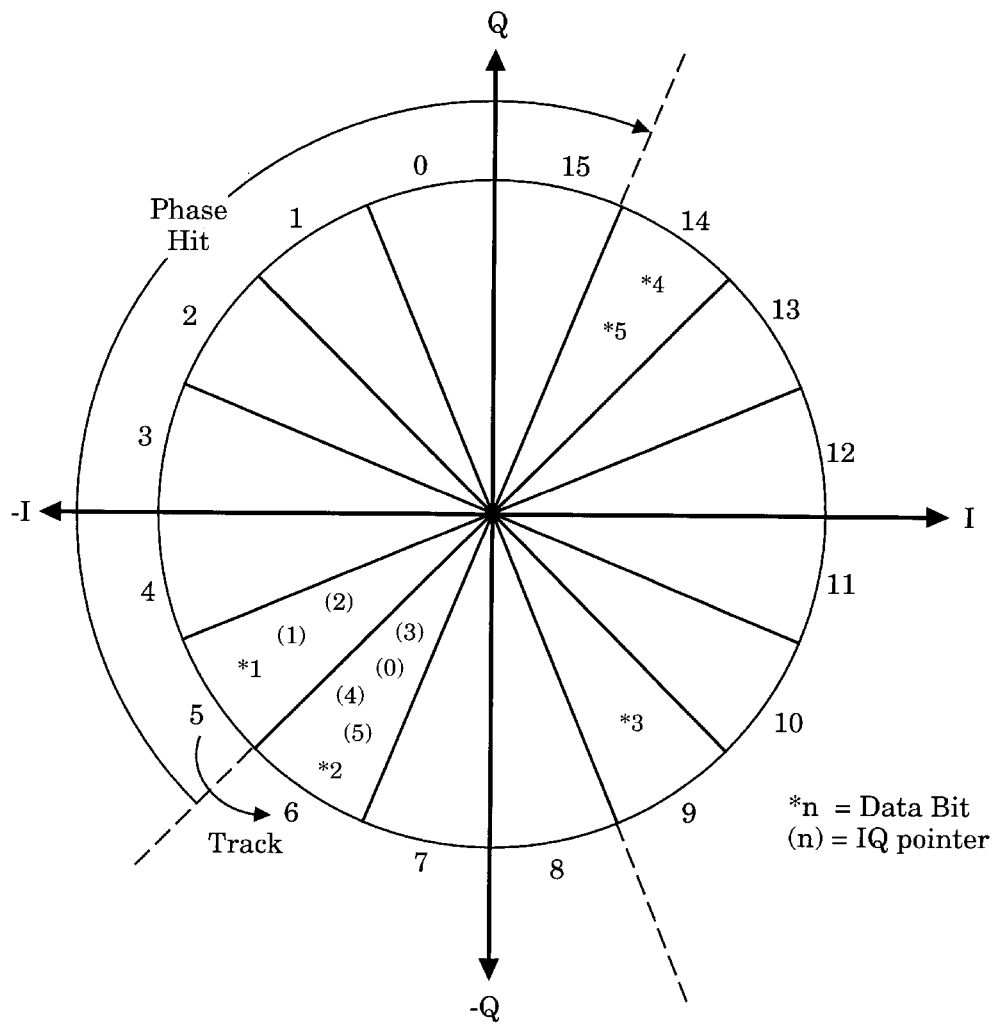

FIGS. 29a and 29b illustrate an example of a phase hit that shifts the phase of the data signal by more than 153.4°. FIG. 29a illustrates a (−4, −7) phase hit on an IQ diagram. FIG. 29b lists how the IQ pointer is adjusted and how the data is decoded for the (−4, −7) phase hit of FIG. 29a.

Referring to FIG. 29a, the first data bit (*1) falls in the sector containing the IQ pointer. The second data bit (*2) falls in an increment (INC) sector, which puts the tracking mechanism into the ready to increment state. The third data bit (*3) is a "0" data bit that is −4 sectors from the current IQ pointer, the beginning of the (−4, −7) phase hit. Data bit *3 falls in an increment (INC) sector and thus the tracking mechanism enters the fast increment state and increments the IQ pointer. Thus, the third data bit (*3) is measured as +3 sectors from the IQ pointer (3). The fourth data bit (*4) is a "1" data bit that is −7 sectors from the sector containing the original IQ pointer. However, since data bit *3 caused the IQ pointer to move, data bit *4 actually appears to be a data bit that falls within an aligned sector. Thus, the (−4, −7) phase hit appears as a (+3, 0) phase hit, which is assigned a phase weight of 0 and is not detected. The (−4, −7) phase hit spans greater than 7 sectors, from the boundary between sectors 5 and 6 to beyond the boundary between sectors 15 and 14, which is at least 153.4°.

Tables similar to FIG. 26 and FIG. 28 may be recorded for the other three possible cases:

1) When the last different IQ pointer location is on the DEC side and the prior data bit is on the DEC side of the IQ pointer;

2) When the last different IQ pointer location is on INC side and the prior data bit is on DEC side of the pointer; and 3) When the last different IQ pointer location is on DEC side and the prior data bit is on INC side of the pointer.

These tables would show cases similar to FIG. 28, in which a phase weight of 0 is assigned, for the same reasons as listed above.

Detecting When A Data Inversion Occurs

The second step in correcting for a data inversion is detecting that a data inversion actually occurred. Data inversions are detected by first using the Single Bit Error Correction mechanism and attempting to find a valid data word or an End-of-Packet word. If no valid data word or End-of-Packet word is detected, then a data inversion probably occurred.

Referring back to FIG. 5, the last two bits of every word are two additional coding bits that indicate if a word is a data word or an End-of-Packet (EOP) word. An "01" pattern in the coding bits at the end of a word designates a data word 520. A "11" pattern in the last two bits in combination with an EOP data pattern ("11100110") in the first 8 bits and an odd parity bit of "0" in the 9th bit designates an End-of-Packet word 530. The other two possible coding bit patterns ("00" and "10") are not transmitted. Since a data inversion during a data word 520 will cause the final two bits to appear as "10" (or "00" in the case that the inversion starts with the last bit of the data word), which are unused coding patterns, a data inversion can be detected. The two additional coding bits are transmitted at the end of the word so that a data inversion during the word will always affect the coding bits.

Figure 30:
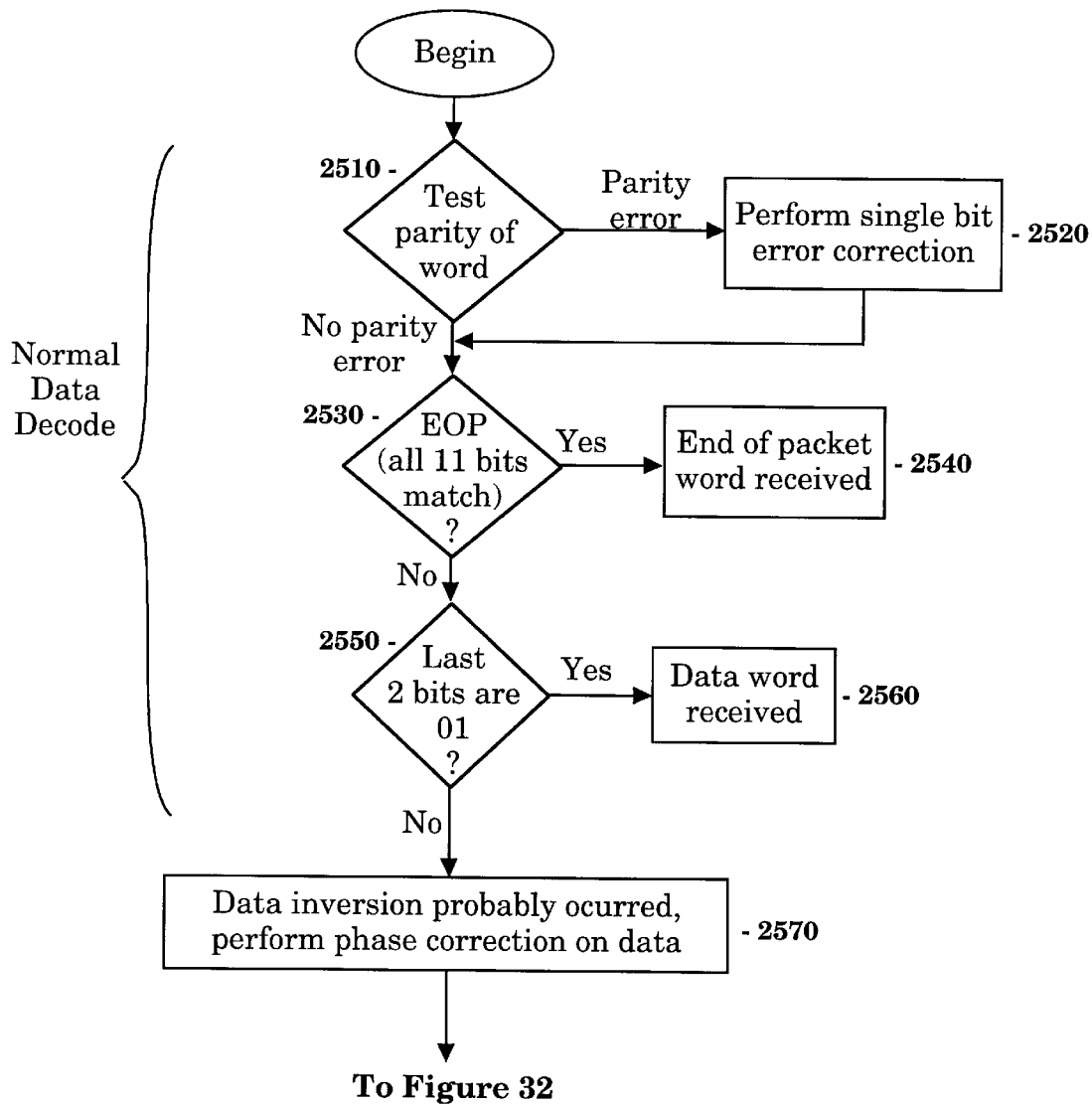
FIG. 30 illustrates a flow diagram that describes how single bit errors are corrected and a valid data word or End-of-Packet word verified.

FIG. 30 illustrates a flow chart that specifies when a data inversion should be corrected. At step 2510, the parity of a word is tested. If a parity error is detected, then the Single Bit Error Correction mechanism corrects the weak bit at step 2520. After correcting any parity error, the receiver tests if the word is an End-of-Packet word at step 2530 by comparing all 11 bits against the 11 bit EOP pattern ("11100110011"). If an End-of-Packet word 530 is detected, then the receiver is done receiving the data packet and completes processing. If an End-of-Packet word 530 is not detected, the receiver then examines the last two bits at step 2550 to determine if the word is a valid data word 520. If the receiver detects an "01" pattern in the last two bits then a valid data word has been received. If the receiver detects any other pattern than "01" then the receiver determines that a data inversion probably occurred during the word. Thus, the receiver proceeds to correct the data inversion.

Correcting A Data Inversion

To correct for a data inversion, the Phase Correction mechanism examines the phase weight values assigned to each bit in a word. The Phase Correction mechanism corrects the data inversion by inverting all the bits in the word starting with the bit that has the greatest phase weight value, which indicates the bit most likely to be at the beginning of the data inversion. The inversion is performed on the original decoded word, prior to single-bit error correction. Furthermore, all the remaining bits in the data packet are inverted unless another data inversion occurs in a later word. If two or more bits in a word are assigned the same phase weight value, the phase correction mechanism inverts beginning at the earliest bit with that phase weight value.

After inverting the bits in the word starting with the bit having the greatest phase weight value, the receiver performs a parity check on the inverted word. If a parity error is detected in the inverted word, the Single Bit Error Correction mechanism is used to correct the weak bit in the inverted word. Thus, the error correction mechanisms in the receiver can correct both a data inversion and a single bit error in each word.

After correcting the data inversion and any single bit error, the receiver again examines the word to determine if the word is a valid data word or an End-of-Packet word. If the receiver detects neither a valid data word 520 nor an End-of-Packet word 530, the receiver increments a code violation counter. If two code violations are detected within a single packet, the receiver aborts processing the packet.

A Special Data Inversion Case

Figure 31A:
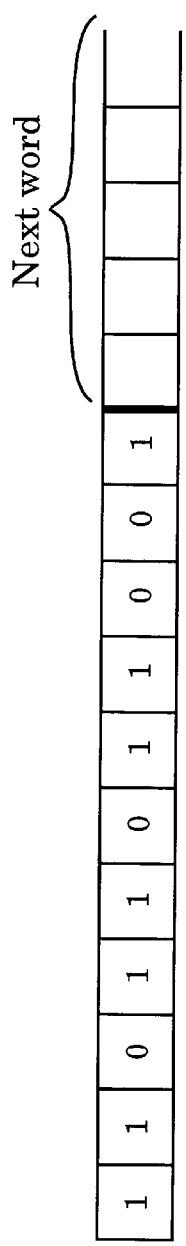
FIG. 31a illustrates a data word.
Figure 31B:
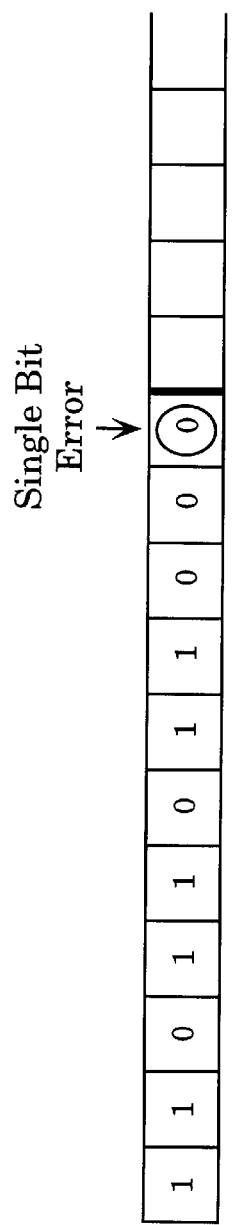
FIG. 31b illustrates the data word of FIG. 31a with a single bit error in the last bit.
Figure 31C:
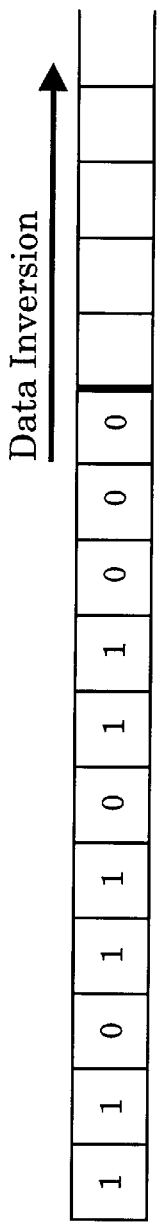
FIG. 31c illustrates the data word of FIG. 31a with a data inversion that starts at the last bit.

There is one special data inversion case that cannot easily be distinguished from a single bit error. FIG. 31a illustrates a data word to be transmitted. If the data word of FIG. 31a is received with a single bit error in the last bit of the word, the data word will appear as illustrated in FIG. 31b. If the data word of FIG. 31a is received with a data inversion starting at the last bit of the word, the data word will appear as illustrated in FIG. 31c. Since the data words of FIG. 31b and FIG. 31c are identical, these two cases are indistinguishable at the time of receiving the data word.

The data inversion starting at the last bit as illustrated in FIG. 31c will likely cause the last bit to be the weak bit of the word. Because the weak bit is determined by an approximate magnitude of the recovered data signal in the direction of the IQ pointer, the first bit of a phase bit is likely to be a weak bit since the IQ pointer has not yet realigned with the phase-shifted data. Since the receiver of the preferred embodiment attempts single bit error correction before data inversion correction, a data inversion starting at the last bit will be corrected by the Single Bit Error Correction mechanism as a single bit error. When the receiver attempts to correct the next data word, the entire next data word will be inverted. The receiver detects and corrects this special inversion case as described below.

The Phase Correction mechanism tests for this special case before performing the normal data inversion correction. Specifically, the Phase Correction mechanism determines if the following four conditions are true:

1) There was no data inversion detected in the previous word.

2) There was a parity error detected in the previous word.

3) The weak bit of the previous word was the last bit of the word.

4) A non-zero phase weight was assigned to the last bit of the previous word.

If all of the four conditions listed above are true, and if a data inversion is detected in a word, it probably occurred starting with the last bit of the previous word. To correct for this case, the Phase Correction mechanism inverts all the bits of the current word and subsequent words.

The Full Phase Correction System

Figure 32:
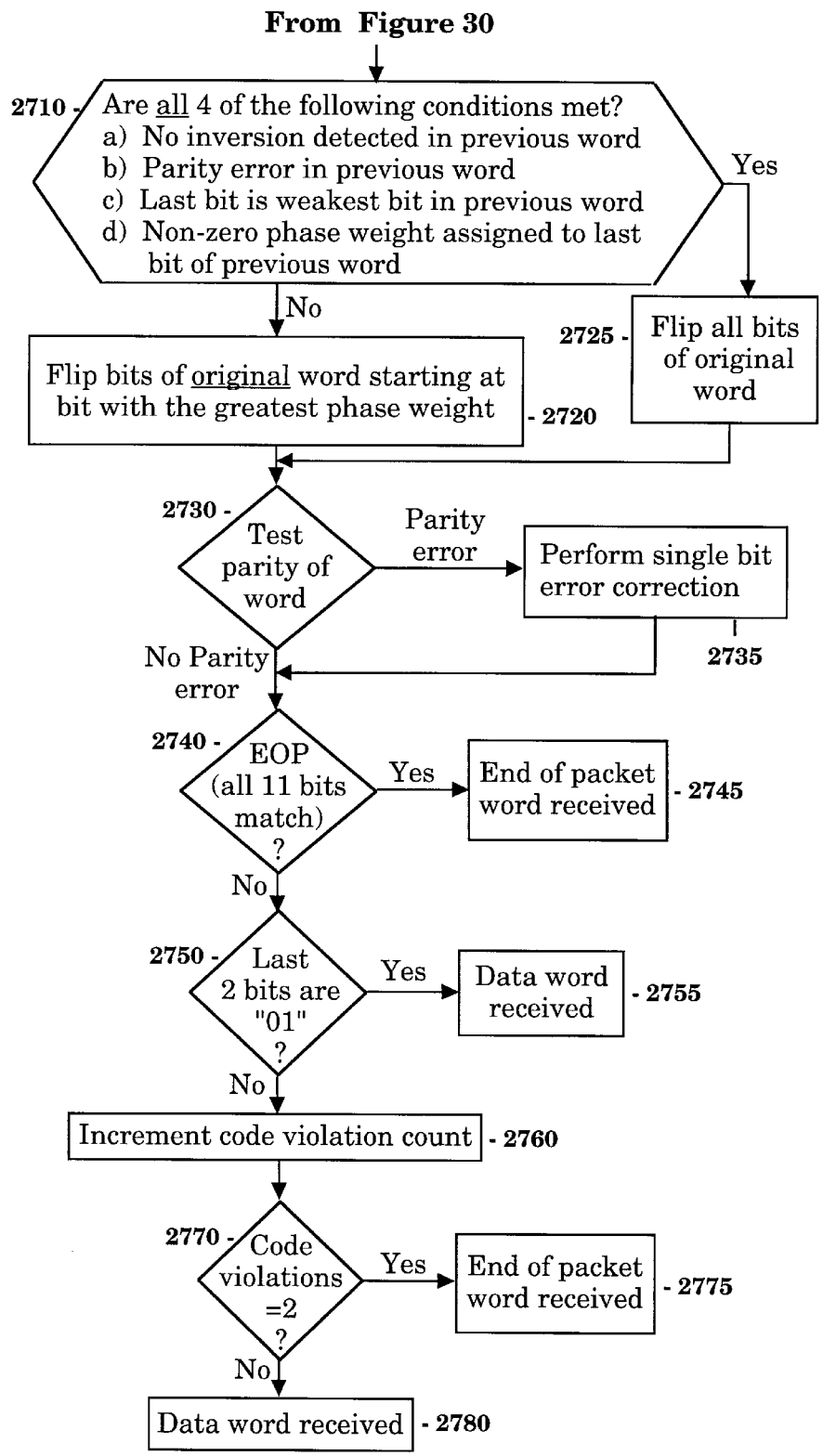
FIG. 32 illustrates a flow diagram that lists the steps performed by the Phase Correction mechanism.

FIG. 32 illustrates a flow chart that explains the entire Phase Correction mechanism. The Single Bit Error Correction mechanism operates in concert with incorporated as a part of the Phase Correction Mechanism such that any combination of a single bit error and a data inversion in each word can be detected and corrected.

The flow chart of FIG. 32 is executed if it is determined that a data inversion occurred, according to the flow chart of FIG. 30. At step 2710 of FIG. 32, the Phase Correction Mechanism first determines if the special data inversion case has occurred. If the four conditions for the special data inversion case are met, the Phase Correction Mechanism inverts every bit of the original word (prior to single bit error correction) at step 2725. Otherwise, the Phase Correction Mechanism inverts the bits of the original word (prior to single bit error correction) starting with the bit having the greatest phase weight at step 2720.

After correcting for the data inversion, the inverted data word is then processed by the Single Bit Error Correction mechanism at steps 2730 and 2735 to correct any single bit errors. The receiver then determines if the word is a valid End-of-Packet (EOP) word 530 at step 2740 or a valid data word 520 at step 2750. If the neither a valid data word nor an End-of-Packet word 530 is detected, the receiver increments a code violation counter at step 2760. If two code violations are detected within a single packet, the receiver aborts processing the packet at step 2775.

Hardware Implementation

The teachings of the present invention are mainly performed within a IQ Pointer/Combiner block 226 and an Error Correction block 228 as shown in FIGS. 2a–2c of the copending patent application "Apparatus and Method for Detecting a Signal in a Communications System", Ser. No. 08/224,903, filed on Apr. 8, 1994. The IQ Pointer/Combiner circuit 226 decodes each data bit and generates a corresponding IQMAG value and a phase weight (PHWT) value for the data bit. The Error Correction block 228 builds an 11-bit word and performs error detection and correction on the word.

The IQ Pointer/Combiner Circuit

Figure 33:
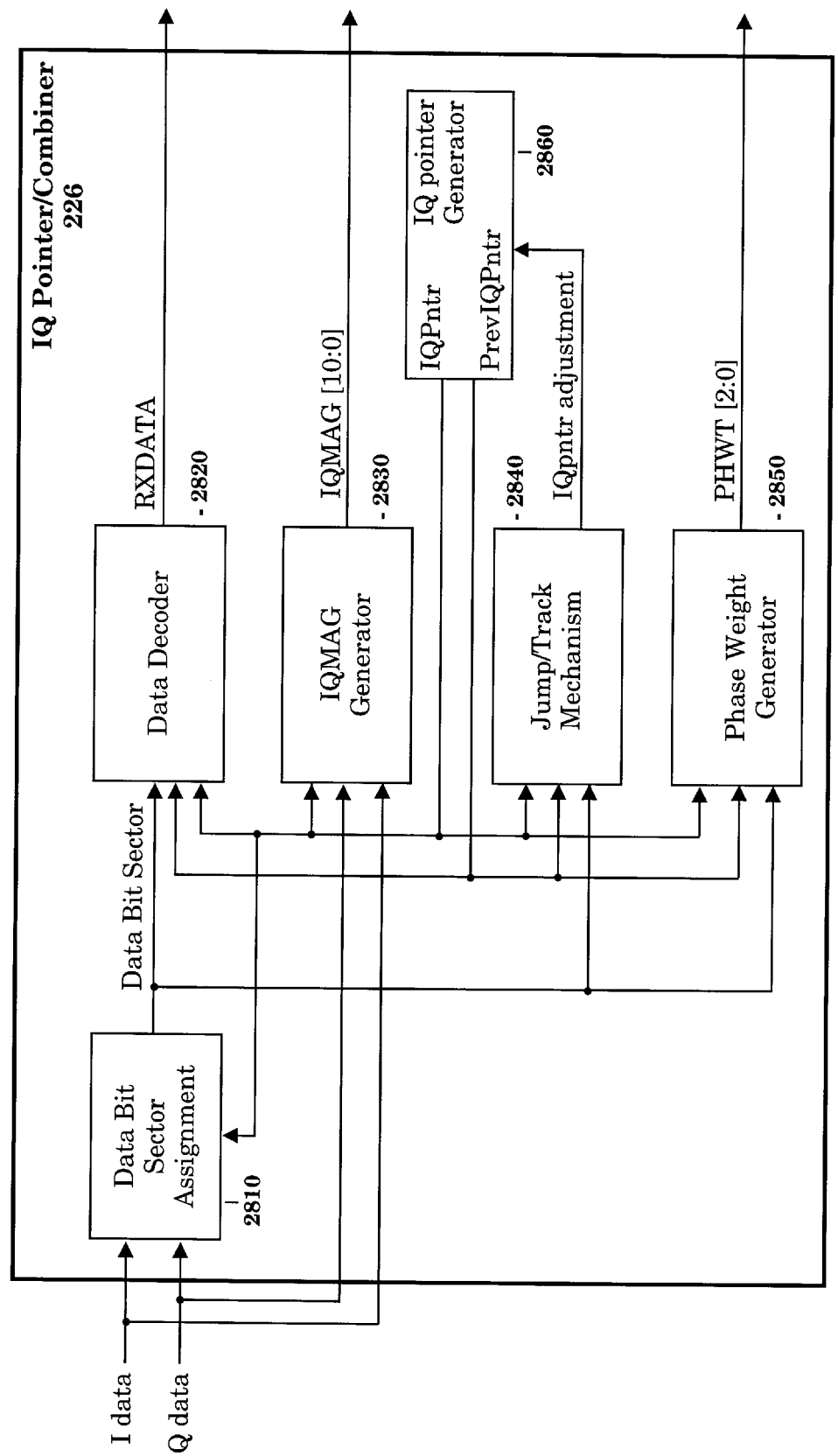
FIG. 33 illustrates a block diagram of the IQ Pointer/Combiner circuit that decodes data bits and generates IQMAG and phase weight values.

FIG. 33 illustrates an internal block diagram of the IQ Pointer/Combiner circuit. The IQ Pointer/Combiner circuit decodes each data bit and generates a corresponding IQMAG value and a phase weight (PHWT) value for the data bit.

Each data bit is defined by an I data sample and a Q data sample. A sector assignment circuit 2810 assigns each data bit to one of 16 angular sectors. The sector assignment circuit uses the current value of the IQ pointer generated by an IQ Pointer generator 2860 to resolve the cases where the I data and Q data sample pair falls on the boundary between two sectors.

A Data Decoder circuit 2820 generates a decoded data stream RXDATA (prior to error correction) based upon whether the sector assigned to each data bit corresponds to a data bit "1" or "0" using both the IQ pointer location and the last different IQ pointer location.

An IQMAG generator circuit 2830 generates an approximate magnitude in the direction of the IQ pointer (IQMAG) for each data bit. The IQMAG generator circuit 2830 combines the I data sample and the Q data sample according to the current IQ pointer location as set forth in FIG. 19. The output of the IQMAG generator circuit 2830 is an 11-bit magnitude value.

A phase weight generator circuit 2850 generates a phase weight (PHWT) value for each data bit. The phase weight generator circuit 2850 assigns a three-bit phase weight value (PHWT) to each bit according to the phase weight tables.

An IQ pointer generator circuit 2860 maintains the location of the current and IQ pointer and the knowledge of the last different IQ pointer location. The location of the IQ pointer is adjusted by a Track and Jump mechanism 2840 that moves the IQ pointer in response to the sector of each data bit.

The Error Correction Circuit

Figure 34:
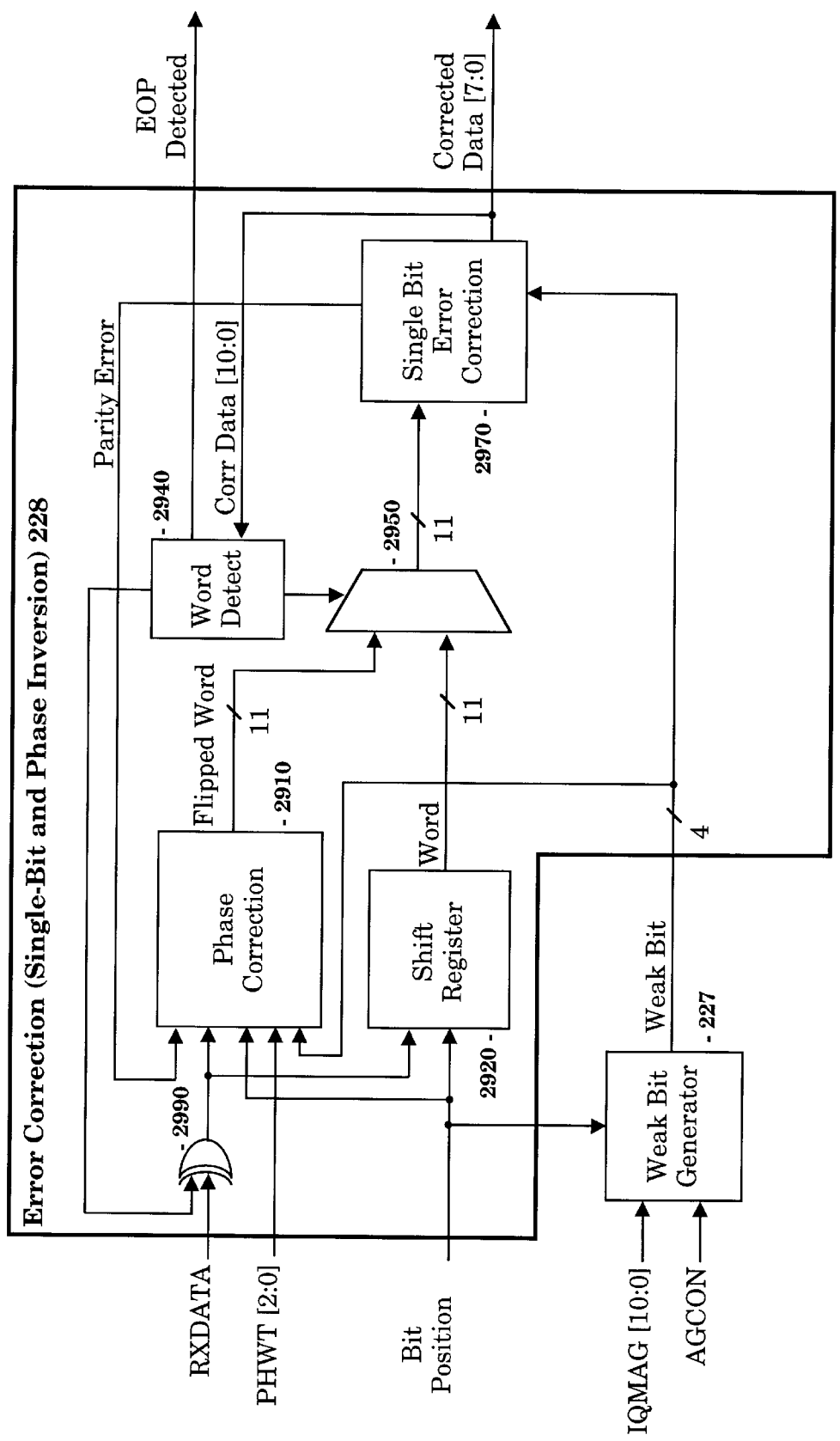
FIG. 34 illustrates a block diagram of an Error Correction circuit in a receiver that is used to detect and correct a single bit error and a data inversion in each word.

FIG. 34 illustrates the weak bit generator circuit 227 and the Error Correction circuit 228 of a receiver implemented according to the preferred embodiment of the present invention. The Error Correction circuit 228 assembles data bits into words and performs error detection and correction on each word.

The weak bit generator circuit 227 determines which bit is the weak bit of the word. The weak bit generator circuit 227 normally selects the bit with the smallest IQMAG value as the weak bit. However, if the Automatic Gain Control (AGC) circuit switches states while a bit is being received, the weak bit generator circuit 227 selects that bit as the weak bit.

An XOR gate 2990 may or may not invert the incoming decoded data bits RXDATA, depending on whether the word detect circuit 2940 has detected an even or an odd number of previous data inversions.

A shift register 2920 builds an 11-bit word from the inverted or non-inverted decoded data bits. The word constructed by the shift register 2920 is passed to a multiplexer 2950.

The phase correction circuit 2910 builds an 11-bit word from the inverted or non-inverted data bits. From the constructed word, the phase correction circuit 2910 generates an inverted word as specified by the flow diagram of FIG. 32.

The word constructed by the shift register 2920 and the inverted word constructed by the phase correction circuit 2910 are provided to a multiplexer 2950. The multiplexer 2950 is controlled by word detect circuit 2940. The word detect circuit 2940 first allows the original data word from the shift register 2920 through the multiplexer 2950 to a single bit error correction circuit 2970. If the original data word from the shift register 2920, after being corrected by the single bit error correction circuit 2970, is determined by the word detect circuit 2940 to be a valid data word 520 or an End-of-Packet word 530, then the valid data word is output or an End-of-Packet word signal is asserted.

However, if the single bit error correction circuit 2970 cannot correct the original data word, then the inverted word constructed by the phase correction circuit 2910 is passed through the multiplexer 2950 to the single bit error correction circuit 2970. The single bit error correction circuit 2970 corrects any single bit error in the inverted word and outputs the data word or the word detect circuit 2940 asserts an End-of-Packet signal.

An Alternate Data Encoding Method

In the preferred embodiment, each data word is encoded with 8 data bits, one parity bit, and 2 additional coding bits transmitted at the end of the word as illustrated in FIG. 5 such that a single bit error and a data inversion can be detected in each word. An alternate encoding system that uses differential encoding is hereby presented. The alternate encoding system has the capability to correct a single bit error or an inversion in each word.

Differential Encoding

Differential encoding is a method of encoding binary data wherein one binary state is encoded by changing the state of the signal and the other binary state is encoded by not changing the state of the signal. For example, a binary "1" can be encoded by changing the state of the signal; a binary "0" can be encoded by allowing the state of the signal to remain the same. FIG. 35a illustrates an example of the 11-bit data word "11100100011" differentially encoded into the symbol stream "010111000010". (The term data bit will be used in reference to differential encoding to indicate the actual data message and the term symbol will be used to indicate a differentially encoded bit.)

When one of the differentially encoded symbols is received in error, the decoded data word will contain two consecutive inverted data bits. An example of this effect is illustrated in FIG. 35b.

When the differentially encoded symbols are received with a symbol inversion, the decoded data word will contain a single inverted data bit. An example of this effect is illustrated in FIG. 35c.

Thus, to detect single symbol errors and symbol inversions for a differentially encoded word, a receiver must be able to identify words with single bit errors and words with double bit errors.

3-Bit Data Integrity Code

To identify data words with single bit errors and data words with double bit errors, the alternate encoding system adds a 3-bit data integrity code to each 8-bit byte. To generate the 3-bit data integrity code, a partial weighted checksum is first generated for the 8 data bits of the word. The partial weighted checksum is calculated by multiplying each "1" bit by an assigned bit weight of 1 or 3 for each bit position as illustrated in FIG. 36a.

Referring to Example 1 of FIG. 36a, the partial weighted checksum for the 8-bit byte "10111000" is calculated by 1*1+0*3+1*1+1*3+1*1+0*3+0*1+0*3=6. The partial weighted checksum for the first 8 bits will always be between 0 and 16 inclusive.

After calculating the partial weighted checksum for the 8 data bits, a 3-bit data integrity code is concatenated onto the 8 data bits such that full weighted checksum equals one of four "special" checksum values (1, 7, 13, or 19) that will indicate a word without errors. FIG. 36b provides a table of all the possible partial weighted checksum values for the 8 data bits, the corresponding 3-bit checksum required so that the total checksum equals one of the special checksum values (1, 7, 13 or 19), and the corresponding 3-bit data integrity code that is concatenated onto the 8 bits.

Referring back to Example 1 of FIG. 36a, the partial weighted sum for the first 8 bits was 6. Using the table of FIG. 36b, the 3-bit data integrity code value "100" is concatenated onto the data byte "10111000" to generate a total special checksum value of 7.

Error Detection and Correction

The first step to detect and correct errors in a received data word is to calculate the full weighted checksum for the received data word. The full weighted checksum will always be between 0 and 21, inclusive. If the full weighted checksum is one of the four special checksum values (1, 7, 13, or 19), then the data word is assumed to be error-free.

If the full weighted checksum is not one of the four special checksum values, then an error occurred in receiving the word. If a single bit is in error (caused by a symbol inversion), the full weighted checksum will be off by ±1 or ±3 since each data bit is assigned a weight of 1 or 3. If two consecutive bits are in error (caused by a single symbol error), then the full weighted checksum will be off by ±2 or ±4.

Since all the special checksum values are odd values, a full weighted checksum that is off by ±1 or ±3 will be an even checksum. Thus, all even checksum values indicate a single bit error caused by a symbol inversion. Similarly, a full weighted checksum that is off by ±2 or ±4 will be an odd checksum. Thus, all odd checksum values (except the special checksum values) indicate a double bit error caused by a single symbol error. All possible checksum values and the corresponding errors are illustrated on the chart of FIG. 37.

FIG. 38a illustrates how the alternate encoding scheme corrects a single symbol error. As illustrated in FIG. 38a, the 8-bit data word has a partial sum of 16 such that the 3-bit data integrity code value of "010" is concatenated bringing the full checksum to the special checksum value 19. During reception of the differentially encoded word, a single symbol error occurs. After decoding, the single symbol error creates a double bit error in the decoded data word. The full checksum of the decoded data word with the double bit error is 15. Referring to the error chart of FIG. 37, a checksum of 15 indicates a double bit error caused by a single symbol error. Thus the data correction circuit should correct the double bit error by inverting two consecutive data bits starting with the weak bit.

FIG. 38b illustrates how the alternate encoding scheme corrects a symbol inversion. As illustrated in FIG. 38b, the 8-bit data word has a partial sum of 16 such that the 3-bit data integrity code value of "010" is concatenated bringing the full checksum to the special checksum value of 19. During reception of the differentially encoded word, a large and rapid phase shift occurs that inverts the symbols. The symbol inversion creates a single bit error in the decoded data word. The full checksum of the decoded data word with the single bit error is 16. Referring to the error chart of FIG. 37, a checksum of 16 indicates a single data bit error caused by a symbol inversion. Thus the data correction circuit corrects the single bit error by inverting the bit with the largest phase weight.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A method of communicating binary information, said method comprising the steps of:
   encoding said binary information into a data packet having a plurality of data bits, at least one error detection bit, and additional coding bits, said additional coding bits indicating an error if at least one of said additional coding bits is inverted;
   transmitting said data packet across a communication channel to a receiver;
   detecting at said receiver when phase anomalies occur on said communication channel during said step of transmitting;

decoding said data packet within said receiver to generate recovered binary information;

detecting if a phase related transmission error occurred during said step of transmitting by testing said at least one error detection bit and testing said additional coding bits;

identifying a set of bits in said recovered binary information that are most likely to be in error by determining which data bits were being transmitted when phase anomalies occurred; and correcting errors detected in recovered binary information by changing the state of said set of bits most likely to be in error.

2. The method of communicating binary information as claimed in claim 1 wherein said step of encoding said binary information into a data packet comprises dividing said plurality of data bits into a set of data words wherein each data word has at least one error detection bit.

3. The method of communicating binary information as claimed in claim 2 wherein said step of detecting if a phase related transmission error occurred comprises detecting errors in each data word using said error detection bit in each data word.

4. The method of communicating binary information as claimed in claim 2 wherein said step of encoding said binary information further comprises adding said additional coding bits to each data word.

5. The method of communicating binary information as claimed in claim 1 wherein said step of encoding said binary information comprises differential encoding of said binary information.

6. The method of communicating binary information as claimed in claim 1 further comprising the steps of:

modulating said data packet with an angular modulation system to generate an angularly modulated data packet; and demodulating said angularly modulated data packet within said receiver to generate recovered binary information.

7. The method of communicating binary information as claimed in claim 4 wherein said step of modulating said data packet with an angular modulation system comprises modulating said data packet with Binary Phase-shift Keying.

8. The method of communicating binary information as claimed in claim 1 wherein said additional coding bits are also used to identify an end-of-packet word.

9. The method of communicating binary information as claimed in claim 1 wherein said step of transmitting said data packet comprises transmitting a series of bits and wherein said step of detecting when phase anomalies occur comprises detecting phase anomalies that last longer than a transmission time of one bit.

10. The method of communicating binary information as claimed in claim 1 wherein said step of detecting phase anomalies comprises detecting a deviation from an ideal recovered phase value.

11. The method of communicating binary information as claimed in claim 10 wherein said step of detecting phase anomalies further comprises assigning a phase weight value to each bit having a phase anomaly, said phase weight value identifying a likelihood of said phase anomaly causing a data error.

12. The method of communicating binary information as claimed in claim 11 wherein said step of identifying a set of bits in said recovered binary information that are most likely to be in error comprises selecting a sequence of bits starting with a bit having the greatest phase weight value.

13. The method of communicating binary information as claimed in claim 1 wherein said communication channel comprises a power distribution line.

14. The method of communicating binary information as claimed in claim 1 wherein said step of identifying a set of bits in said recovered binary information that are most likely to be in error comprises selecting a sequence of bits starting with a first bit of a pair of bits indicating a large phase shift.

15. A method of communicating binary information, said method comprising the steps of:

encoding said binary information into a data packet having a plurality of data bits and at least one error detection bit;

transmitting said data packet across a communication channel to a receiver;

receiving said plurality of data bits and said at least one error detection bit of said data packet within said receiver and generating a recovered data signal;

measuring in-phase amplitude on said communication channel within said receiver while receiving said plurality of data bits and said at least one error detection bit, said in-phase amplitude relative to a rotating phase reference vector;

detecting if a transmission error occurred during said step of transmitting by testing said at least one error detection bit;

identifying a set of bits in said recovered binary information that are most likely to be in error only by correlating when said in-phase amplitude of said recovered data signal is weak with when said plurality of data bits and said at least one error detection bit of said data packet are transmitted; and correcting errors detected in recovered binary information by changing the state of said set of bits most likely to be in error.

16. The method of communicating binary information as claimed in claim 15 further comprising the steps of:

modulating said data packet onto a analog carrier signal; and demodulating said analog carrier signal within said receiver to generate said recovered data signal.

17. The method of communicating binary information as claimed in claim 16 wherein said step of modulating said data packet onto an analog carrier signal comprises modulating said data packet with Binary Phase-shift Keying.

18. The method of communicating binary information as claimed in claim 15 wherein said step of encoding said binary information into a data packet comprises dividing said plurality of data bits into a set of data words wherein each data word has at least one error detection bit.

19. The method of communicating binary information as claimed in claim 18 wherein said step of detecting errors in said recovered binary information comprises detecting errors in each data word using said error detection bit in each data word.

20. The method of communicating binary information as claimed in claim 18 wherein said step of encoding said binary information further comprises adding a multi-bit data integrity value to each data word.

21. The method of communicating binary information as claimed in claim 15 wherein said step of encoding said binary information comprises adding a parity bit.

22. The method of communicating binary information as claimed in claim 21 wherein said step of identifying a set of bits in said recovered binary information that are most likely to be in error comprises selecting a bit received with the smallest in-phase amplitude of said recovered data signal.

23. The method of communicating binary information as claimed in claim 15 wherein said step of identifying a set of bits in said recovered binary information that are most likely to be in error comprises selecting the bit received with the smallest in-phase amplitude of said recovered data signal.

24. The method of communicating binary information as claimed in claim 20 wherein said step of encoding said binary information comprises differential encoding of said binary information.

25. The method of communicating binary information as claimed in claim 24 wherein said step of identifying a set of bits in said recovered binary information that are most likely to be in error comprises selecting the bit received with the smallest in-phase amplitude of said recovered data signal.

26. The method of communicating binary information as claimed in claim 15 wherein said communication channel comprises a power distribution line.

27. A method of communicating binary information, said method comprising the steps of:

encoding said binary information into a data packet having a plurality of data bits and at least one error detection bit;

transmitting a signal containing said plurality of data bits and said at least one error bit of said data packet across a communication channel to a receiver;

detecting when at least two types of anomalies occur in said signal at said receiver, said step of detecting comprising recording an in-phase amplitude of said signal and recording phase changes;

distinguishing between at least two types of errors within said data bits and said at least one error bit, said two types of errors having different error characteristics;

identifying a set of bits in said recovered binary information that are most likely to be in error only by correlating when said two types of anomalies occur in said signal with when said plurality of data bits and said at least one error detection bit of said data packet are transmitted; and correcting errors detected in recovered binary information by changing the state of said set of bits most likely to be in error.

28. The method of communicating binary information as claimed in claim 27 wherein said method further comprises the steps of modulating said data packet onto an analog carrier signal; and demodulating said analog carrier signal to generate a recovered data signal within said receiver.

29. The method of communicating binary information as claimed in claim 28 wherein said step of modulating said analog carrier signal comprises modulating said signal with Binary Phase-Shift Keying.

30. The method of communicating binary information as claimed in claim 27 wherein said step of distinguishing between at least two types of errors further comprises detecting single bit errors in said recovered binary information.

31. The method of communicating binary information as claimed in claim 30 wherein said step of detecting single bit errors in said recovered binary information comprises testing a parity bit in said data packet.

32. The method of communicating binary information as claimed in claim 30 wherein said step of detecting at least two types of anomalies in said signal further comprises measuring an in-phase amplitude of said recovered data signal during each bit.

33. The method of communicating binary information as claimed in claim 27 wherein said step of identifying a set of bits in said recovered binary information that are most likely to be in error comprises selecting a bit received with a smallest in-phase amplitude of said recovered data signal.

34. The method of communicating binary information as claimed in claim 27 wherein said step of distinguishing between at least two types of errors in said recovered binary information further comprises detecting data inversions in said recovered binary information.

35. The method of communicating binary information as claimed in claim 34 wherein said step of detecting data inversions in said recovered binary information comprises testing additional coding bits in said data packet that will indicate an error if at least one of said additional coding bits is inverted.

36. The method of communicating binary information as claimed in claim 35 wherein said additional coding bits are also used to identify an end-of-packet word.

37. The method of communicating binary information as claimed in claim 34 wherein said step of distinguishing between at least two types of errors further comprises detecting single bit errors in said recovered binary information.

38. The method of communicating binary information as claimed in claim 37 wherein said step of detecting single bit errors in said recovered binary information comprises testing a parity bit in said data packet.

39. The method of communicating binary information as claimed in claim 37 wherein said step of identifying a set of bits in said recovered binary information that are most likely to be in error comprises selecting a bit received with the smallest in-phase amplitude of said recovered data signal.

40. The method of communicating binary information as claimed in claim 34 wherein said step of detecting at least two types of anomalies in said signal comprises detecting phase anomalies that differ from an ideal recovered phase value.

41. The method of communicating binary information as claimed in claim 40 wherein said step of detecting phase anomalies further comprises assigning a phase weight value to each bit having a phase anomaly, said phase weight value identifying a likelihood of said phase anomaly causing said data errors.

42. The method of communicating binary information as claimed in claim 41 wherein said step of identifying a set of bits in said recovered binary information that are most likely to be in error comprises selecting a sequence of bits starting with a bit having the greatest phase weight value.

43. The method of communicating binary information as claimed in claim 27 wherein said step of encoding said binary information further comprises adding a multi-bit data integrity value.

44. The method of communicating binary information as claimed in claim 43 wherein said step of encoding said binary information comprises differential encoding of said binary information.

45. The method of communicating binary information as claimed in claim 27 wherein said communication channel comprises a power distribution line.

46. A method of communicating binary information, said method comprising the steps of:

dividing said binary information into a series of data words;

concatenating a word sync pattern at the head of said series of data words to create a data packet, said word sync pattern specifying a word boundary, said word sync pattern uniquely identifiable if a data inversion occurs beginning at any point in said word sync pattern;

transmitting said data packet across a communication channel to a receiver;

detecting said word sync pattern within said receiver; and aligning said receiver to receive said series of data words within said data packet in response to said detected word sync pattern.

47. The method of communicating binary information as claimed in claim 46 wherein said word sync pattern unambiguously identifies a data polarity of said data packet.

48. The method of communicating binary information as claimed in claim 46 wherein said word sync pattern is uniquely identifiable if any single bit error occurs in said word sync pattern.

49. The method of communicating binary information as claimed in claim 46 wherein said word sync pattern is preceded by a carrier detect pattern and said word sync pattern is uniquely identifiable from said carrier detect pattern if any single bit error occurs in said carrier detect pattern.

50. A method of communicating binary information, said method comprising the steps of:

transmitting an analog carrier signal containing binary information across a communication channel to a receiver;

measuring a phase relationship between said analog carrier signal and a local reference signal over a period of time to determine a set of phase characteristics of said analog carrier signal;

comparing the set of phase characteristics of said analog carrier signal with a set of phase signatures, said set of phase signatures representing a set of anomalous phase characteristics that occur in response to various impairments on said communication channel; and adjusting for said phase relationship between said analog carrier signal and said local reference signal.

51. The method of communicating binary information as claimed in claim 50 wherein said step of measuring the phase relationship between said analog carrier signal and a local reference signal over a period of time further comprises generating a phase reference.

52. The method of communicating binary information as claimed in claim 51 further comprising the steps of:

demodulating said analog carrier signal to generate a recovered data signal; and decoding said recovered data signal using said phase reference to recover said binary information.

53. The method of communicating binary information as claimed in claim 51 further comprising the steps of:

demodulating said analog carrier signal to generate a recovered data signal; and measuring an amplitude of said recovered data signal in a direction of said phase reference to determine a quality value of said recovered data signal.

54. The method of communicating binary information as claimed in claim 50 wherein said step of adjusting for the phase relationship between said transmitted analog carrier signal and said local reference signal selects a magnitude of an adjustment based upon said phase characteristics of said analog carrier signal.

55. The method of communicating binary information as claimed in claim 50 wherein said step of adjusting for the phase relationship between said transmitted analog carrier signal and said local reference signal further comprises masking phase characteristics that indicate an impulse on said analog carrier signal.

56. The method of communicating binary information as claimed in claim 50 wherein said step of adjusting for the phase relationship between said transmitted analog carrier signal and said local reference signal further comprises masking phase characteristics that indicate noise on said analog carrier signal.

57. The method of communicating binary information as claimed in claim 50 wherein said step of adjusting for the phase relationship between said transmitted analog carrier signal and said local reference signal comprises tracking a phase change caused by a frequency difference between said analog carrier signal and said local reference signal.

58. The method of communicating binary information as claimed in claim 50 wherein said step of adjusting for the phase relationship between said transmitted analog carrier signal and said local reference signal comprises tracking a step phase change caused by said communication channel.

59. The method of communicating binary information as claimed in claim 50 wherein said analog carrier signal comprises a signal modulated with Binary Phase-Shift Keying.

60. The method of communicating binary information as claimed in claim 50 further comprising the steps of:

modulating said analog carrier signal using an angular modulation system;

demodulating said analog carrier signal to generate a recovered data signal, said recovered data signal having an angular phase; and assigning said angular phase of said recovered data signal to one of a plurality of angular sectors.

61. The method of communicating binary information as claimed in claim 60 wherein said the step of adjusting for said phase relationship between said analog carrier signal and said local reference signal comprises tracking said angular phase of said recovered data signal with a phase reference.

62. The method of communicating binary information as claimed in claim 50 wherein said step of adjusting for the phase relationship between said transmitted analog carrier signal and said local reference signal selects a rate of an adjustment based upon said phase characteristics of said analog carrier signal.

63. A method of communicating binary information, said method comprising the steps of:

encoding said binary information into a data word having a plurality of data bits and additional coding bits such that data inversions can be detected;

transmitting an angularly modulated signal containing said data word across a communication medium to a receiver;

recording when phase changes of said angularly modulated signal occur as each data bit is received in said receiver;

testing said additional coding bits in each data word to determine if a data inversion occurred during transmission of said data word; and inverting said data bits in said data word starting with a bit transmitted when a phase change most likely to cause a data inversion occurred if a data inversion is detected in said data word.

64. The method of communicating binary information as claimed in claim 63 wherein said step of inverting said data bits in said data word starting with a bit associated with a phase change most likely to cause a data inversion comprises selecting a bit with a phase change followed by a consecutive bit that also has a phase change.

65. The method of communicating binary information as claimed in claim 63 wherein said step of transmitting an angularly modulated signal comprises transmitting a series of bits and wherein said step of recording phase changes comprises recording a phase weight based upon the phase change of two consecutive bits.

66. The method of communicating binary information as claimed in claim 63 wherein said angularly modulated signal is modulated using Binary Phase-shift Keying.

67. The method of communicating binary information as claimed in claim 63 further comprising the steps of:
   recording a signal quality value for each received data bit in said receiver;
   testing an error detection bit in each data word to determine if an error occurred during transmission of said data word; and
   altering a first received data bit having the lowest signal quality value of said plurality of data bits if said error is detected in said data word.

68. A method of communicating binary information, said method comprising the steps of:
   encoding said binary information into a data word having a plurality of data bits and a parity bit;
   transmitting an angularly modulated signal containing said plurality of data bits and said parity bit of said data word across a communication medium to a receiver;
   receiving said plurality of data bits and said parity bit of said data word within said receiver;
   recording an in-phase amplitude of said angularly modulated signal while each of said plurality of data bits and said parity bit are received in said receiver, said in-phase amplitude relative to a rotating phase reference vector;
   testing said parity bit in each data word to determine if an error occurred during transmission of said data word; and
   altering a data bit in said data word transmitted during a smallest recovered in-phase amplitude if an error was detected in said data word.

69. The method of communicating binary information as claimed in claim 68 wherein said angularly modulated signal is modulated using Binary Phase-shift Keying.

70. The method of communicating binary information as claimed in claim 68 further comprising the steps of:
   encoding additional coding bits onto each data word such that data inversions of said data word can be detected;
   recording phase changes of said angularly modulated signal as each data bit is received in said receiver;
   testing said additional coding bits in each data word to determine if a data inversion occurred during transmission of said data word; and
   inverting said data bits in said data word starting with a bit transmitted during a phase change most likely to cause a data inversion if a data inversion is detected in said data word.

71. An apparatus for communicating binary information, said apparatus comprising:
   a transmitter, said transmitter comprising;
      an encoder for encoding said binary information into a data packet having a plurality of data words, said data words comprising a set of bits having a plurality of data bits, at least one error detection bit, and additional coding bits, said additional coding bits indicating an error if at least one of said additional coding bits is inverted;
      a modulator for angularly modulating said data packet into an angularly modulated data packet sent across a communication channel; and
   a receiver for receiving said angularly modulated data packet, said receiver comprising:
      a phase detector for detecting when phase anomalies occur on said communication channel at said receiver;
      a demodulator for demodulating said angularly modulated data packet to generate recovered binary information within said receiver;
      an error detection unit for detecting errors in said recovered binary information using said at least one error detection bit and said additional coding bits;
      an error correction unit for identifying a set of bits most likely to be in error only by correlating when each bit of said data packet was transmitted with when said phase anomalies occur and correcting said errors by changing the state of a set of bits.

72. The apparatus for communicating binary information as claimed in claim 71 wherein said modulator modulates said data packet with Binary Phase-shift Keying.

73. The apparatus for communicating binary information as claimed in claim 71 wherein said additional coding bits are also used to identify an end-of-packet word.

74. The apparatus for communicating binary information as claimed in claim 71 wherein said encoder differentially encodes said binary information.

75. The apparatus for communicating binary information as claimed in claim 71 wherein said phase detector detects a deviation from an ideal recovered phase value in said angularly modulated data packet.

76. The apparatus for communicating binary information as claimed in claim 75 wherein said detector assigns a phase weight value to each bit having a phase anomaly, said phase weight value identifying the likelihood of said phase anomaly causing a data error.

77. The apparatus for communicating binary information as claimed in claim 76 wherein said error correction unit identifies said set of bits that are most likely to be in error by selecting a sequence of bits starting with a bit having a greatest phase weight value.

78. The apparatus for communicating binary information as claimed in claim 71 wherein said communication channel comprises a power distribution line.

79. An apparatus for communicating binary information, said apparatus comprising:
   a transmitter, said transmitter comprising;
      an encoder for encoding said binary information into a data packet having a plurality of data words, said data words having at least one error detection bit;
      a modulator for modulating said data packet onto an analog carrier signal sent across a communication channel; and
   a receiver for receiving said analog carrier signal, said receiver comprising:
      a demodulator for demodulating said analog carrier signal into a recovered data signal;
      a detector for measuring an in-phase amplitude of said recovered data signal to generate a recorded data signal amplitude, said in-phase amplitude relative to a rotating phase reference vector;
      an error detection unit for detecting errors in said recovered binary information using said at least one error detection bit;

an error correction unit for identifying a set of bits most likely to be in error only by correlating when said bits in said data packet are transmitted with when a smallest in-phase amplitude occurred and changing a state of said set of bits most likely to be in error.

80. The apparatus for communicating binary information as claimed in claim 79 wherein said modulator modulates said data packet with Binary Phase-shift Keying.

81. The apparatus for communicating binary information as claimed in claim 79 wherein said encoder adds a multi-bit data integrity code to each data word.

82. The apparatus for communicating binary information as claimed in claim 81 wherein said encoder differentially encodes said binary information.

83. The apparatus for communicating binary information as claimed in claim 79 wherein said communication channel comprises a power distribution line.

84. An apparatus for decoding an angularly modulated signal, said apparatus comprising:

a data bit decode unit, said data bit decode unit decoding individual data bits from said angularly modulated signal, said data bit decode unit recording phase changes occurring during the transmission of said angularly modulated signal for each data bit;

an error identification unit, said error identification unit receiving said data bits from said data bit decode unit, said error identification unit organizing said data bits into data words, said error identification unit testing each data word for an error; and an error correction unit, said error correction unit receiving said data bits from said error identification unit, said error correction unit organizing said data bits into data words, said error correction unit testing each data word for a data inversion, said error correction unit correcting said data inversion by inverting said data bits in said data word starting with a data bit received during a largest phase change.

85. A method of encoding binary information, said method comprising the steps of:

organizing said binary information into a data word, said data word having a plurality of data bits;

generating a partial checksum for said data word, said step of generating a partial checksum comprising the sub-steps of;

assigning a bit-weight to each said data bit in said data word;

summing said bit-weights multiplied by said data bits; and concatenating a multi-bit data integrity code to said data word, said multi-bit data integrity code comprising a value such that said partial checksum for said data word plus a partial checksum for said multi-bit data integrity code equals a special checksum value that indicates a valid data word.

86. The method of encoding binary information as claimed in claim 85 wherein said bit-weights are assigned such that a first checksum generated by a first word with a single bit error is distinct from a second checksum generated by a second word with a double bit error.

87. The method of encoding binary information as claimed in claim 86 wherein odd bits in said data word are assigned a first bit-weight and even bits in said data word are assigned a second bit-weight.

88. The method of encoding binary information as claimed in claim 87 wherein said first bit-weight is one and said second bit-weight is three.

89. The method of encoding binary information as claimed in claim 85 comprising the step of:

differentially encoding said data word and multi-bit data integrity code into a series of bits.

\* \* \* \* \*